(12) United States Patent
Liu

(10) Patent No.: US 12,380,866 B2
(45) Date of Patent: Aug. 5, 2025

(54) SHIFT REGISTER UNIT, GATE DRIVE CIRCUIT, DISPLAY APPARATUS AND DRIVING METHOD

(71) Applicant: BOE Technology Group Co., Ltd., Beijing (CN)

(72) Inventor: Weixing Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/028,318

(22) PCT Filed: Jun. 24, 2022

(86) PCT No.: PCT/CN2022/101292
§ 371 (c)(1),
(2) Date: Mar. 24, 2023

(87) PCT Pub. No.: WO2023/245667
PCT Pub. Date: Dec. 28, 2023

(65) Prior Publication Data
US 2024/0321229 A1    Sep. 26, 2024

(51) Int. Cl.
*G09G 3/36*  (2006.01)
*G09G 3/20*  (2006.01)
(Continued)

(52) U.S. Cl.
CPC ............ *G09G 3/3677* (2013.01); *G09G 3/20* (2013.01); *G09G 3/3266* (2013.01); *G09G 3/36* (2013.01);
(Continued)

(58) Field of Classification Search
CPC .......... G09G 3/20; G09G 3/3266; G09G 3/36; G09G 3/3677; G09G 2300/0408;
(Continued)

(56) References Cited

U.S. PATENT DOCUMENTS

2013/0257703 A1    10/2013   Huang
2017/0162156 A1    6/2017    Zuo et al.
(Continued)

FOREIGN PATENT DOCUMENTS

CN     105096866 A    11/2015
CN     106710544 A    5/2017
(Continued)

*Primary Examiner* — Cory A Almeida
(74) *Attorney, Agent, or Firm* — IPro, PLLC

(57) ABSTRACT

A shift register unit, a gate drive circuit, a display apparatus and a driving method. The shift register unit includes: a first control circuit, configured to control a signal of a first node and a signal of a second node according to a signal of an input signal end and a signal of a first clock signal end; second control circuits, configured to control signals of at least two drive nodes according to the signal of the first node, the signal of the second node and signals of second clock signal ends; cascade output circuits, configured to provide the signal of one of the at least two drive nodes to a cascade output end according to cascade selection signal ends; and drive output circuits, configured to provide the signal of at least one of the at least two drive nodes to drive output ends corresponding to the drive nodes.

19 Claims, 25 Drawing Sheets

(51) Int. Cl.
*G09G 3/3266* (2016.01)
*G11C 19/28* (2006.01)

(52) U.S. Cl.
CPC ..... *G11C 19/28* (2013.01); *G09G 2300/0408* (2013.01); *G09G 2310/0286* (2013.01); *G09G 2310/08* (2013.01); *G11C 19/287* (2013.01)

(58) Field of Classification Search
CPC ....... G09G 2310/0286; G09G 2310/08; G11C 19/28; G11C 19/287
See application file for complete search history.

(56) References Cited

U.S. PATENT DOCUMENTS

| | | | |
|---|---|---|---|
| 2019/0130856 A1 | 5/2019 | Chen et al. | |
| 2021/0065600 A1 | 3/2021 | Tian et al. | |
| 2021/0082368 A1 | 3/2021 | Li | |
| 2021/0225253 A1* | 7/2021 | Li | G11C 19/28 |
| 2022/0301474 A1 | 9/2022 | Zhang et al. | |
| 2022/0327987 A1 | 10/2022 | Sun et al. | |

FOREIGN PATENT DOCUMENTS

| | | |
|---|---|---|
| CN | 107564459 A | 1/2018 |
| CN | 107945759 A | 4/2018 |
| CN | 108346405 A | 7/2018 |
| CN | 108648685 A | 10/2018 |
| CN | 110517621 A | 11/2019 |
| CN | 110634528 A | 12/2019 |
| CN | 111477159 A | 7/2020 |
| CN | 111754951 A | 10/2020 |
| CN | 112017583 A | 12/2020 |
| CN | 112530501 A | 3/2021 |
| CN | 113744679 A | 12/2021 |
| CN | 216719465 U | 6/2022 |

* cited by examiner

S110 — At a first input phase, control, by a first control circuit, signals of a first node and a second node according to signals of an input signal end and a first clock signal end; control, by second control circuits, signals of at least two drive nodes according to the signals of the first node, the second node and second clock signal ends; provide, by cascade output circuits, a signal of an $M^{th}$ drive node of the at least two drive nodes to a cascade output end according to cascade selection signal ends; and provide, by drive output circuits, the signal of each of the at least two drive nodes to a drive output end corresponding to each drive node according to drive selection signal ends S120 — At a first output phase, control, by the second control circuits, the signals of the at least two drive nodes according to the signals of the first node and the second clock signal ends; provide, by the cascade output circuits, the signal of the $M^{th}$ drive node of the at least two drive nodes to the cascade output end according to the cascade selection signal ends; and provide, by the drive output circuits, the signal of each of the at least two drive nodes to the drive output end corresponding to each drive node according to the drive selection signal ends S130 — At a first reset phase, control, by the first control circuit, the signals of the first node and the second node according to the signal of the first clock signal end; control, by the second control circuits, the signals of the at least two drive nodes according to the signal of the second node; provide, by the cascade output circuits, the signal of the $M^{th}$ drive node of the at least two drive nodes to the cascade output end according to the cascade selection signal ends; and provide, by the drive output circuits, the signal of each of the at least two drive nodes to the drive output end corresponding to each drive node according to the drive selection signal ends

Fig. 4

At a second input phase, control, by a first control circuit, signals of a first node and a second node according to signals of an input signal end and a first clock signal end; control, by second control circuits, signals of at least two drive nodes according to the signals of the first node, the second node and second clock signal ends; provide, by cascade output circuits, a signal of an $m^{th}$ drive node of the at least two drive nodes to a cascade output end according to cascade selection signal ends; and provide, by drive output circuits, the signal of the $m^{th}$ drive node of the at least two drive nodes to a corresponding drive output end according to drive selection signal ends ⎯S210

At a second output phase, control, by the second control circuits, the signals of the at least two drive nodes according to the signals of the first node and the second clock signal ends; provide, by the cascade output circuits, the signal of the $m^{th}$ drive node of the at least two drive nodes to the cascade output end according to the cascade selection signal ends; and provide, by the drive output circuits, the signal of the $m^{th}$ drive node of the at least two drive nodes to the corresponding drive output end according to the drive selection signal ends ⎯S220

At a second reset phase, control, by the first control circuit, the signals of the first node and the second node according to the signal of the first clock signal end; control, by the second control circuits, the signals of the at least two drive nodes according to the signal of the second node; provide, by the cascade output circuits, the signal of the $m^{th}$ drive node of the at least two drive nodes to the cascade output end according to the cascade selection signal ends; and provide, by the drive output circuits, the signal of the $m^{th}$ drive node of the at least two drive nodes to the corresponding drive output end according to the drive selection signal ends ⎯S230

Fig. 6

At a first drive mode, in one display frame, load different first clock signals for all clock signal lines, load a gate turn-on signal for each drive selection signal line, load a gate turn-on signal for a cascade selection signal line coupled with an $M^{th}$ drive output circuit, load a gate turn-off signal for remaining cascade selection signal lines, control all shift register units to work sequentially, provide a signal of an $M^{th}$ drive node of at least two drive nodes to a cascade output end, provide a signal of each of the at least two drive nodes to a drive output end corresponding to each drive node, and scan a plurality of gate lines row by row ⸺ S10

At a second drive mode, in one display frame, load a second clock signal for each clock signal line, load a gate turn-on signal for a drive selection signal line coupled with an $m^{th}$ cascade output circuit, load a gate turn-off signal for remaining drive selection signal lines, load a gate turn-on signal for a cascade selection signal line coupled with an $m^{th}$ drive output circuit, loading the gate turn-off signal for the remaining cascade selection signal lines, control all the shift register units to work sequentially, provide a signal of an $m^{th}$ drive node of the at least two drive nodes to the cascade output end, provide the signal of the $m^{th}$ drive node to the corresponding drive output end, and scan the plurality of gate lines in an interlaced mode ⸺ S20

Fig. 14

SHIFT REGISTER UNIT, GATE DRIVE CIRCUIT, DISPLAY APPARATUS AND DRIVING METHOD

The present application is a National Stage of International Application No. PCT/CN2022/101292, filed on Jun. 24, 2022, which is hereby incorporated by reference in its entirety.

FIELD

The present disclosure relates to the technical field of display, in particular to a shift register unit, a gate drive circuit, a display apparatus and a driving method.

BACKGROUND

With rapid development of a display technology, a display apparatus is increasingly developing in a direction of high integration and low cost. In a gate driver on array (GOA) technology, a thin film transistor (TFT) gate drive circuit is integrated on an array substrate of a display apparatus to form drive for the display apparatus. A drive control circuit is usually composed of a plurality of cascaded shift register units.

SUMMARY

A shift register unit provided by an embodiment of the present disclosure includes: a first control circuit, configured to control a signal of a first node and a signal of a second node according to a signal of an input signal end and a signal of a first clock signal end; second control circuits, configured to control signals of at least two drive nodes according to the signal of the first node, the signal of the second node and signals of second clock signal ends; cascade output circuits, configured to provide the signal of one of the at least two drive nodes to a cascade output end according to cascade selection signal ends; and drive output circuits, configured to provide the signal of at least one of the at least two drive nodes to drive output ends corresponding to the drive nodes according to drive selection signal ends.

In some possible implementations of the present disclosure, the drive nodes include M drive nodes, the second clock signal ends include M second clock signal ends, the drive output ends include M drive output ends, and M is an integer greater than 1; the second control circuits include M second control circuits, wherein, an $m^{th}$ second control circuit among the M second control circuits corresponds to an $m^{th}$ drive node among the M drive nodes, and the $m^{th}$ second control circuit corresponds to an $m^{th}$ second clock signal end among the M second clock signal ends; the $m^{th}$ second control circuit is configured to provide a signal of the $m^{th}$ second clock signal end to the $m^{th}$ drive node in response to the signal of the first node, and provide a signal of a first reference signal end to the $m^{th}$ drive node in response to the signal of the second node; and $1 \leq m \leq M$, and m is an integer; the cascade output circuits include M cascade output circuits, and the cascade selection signal ends include M cascade selection signal ends; an $m^{th}$ cascade output circuit among the M cascade output circuits corresponds to the $m^{th}$ drive node, and the $m^{th}$ cascade output circuit corresponds to an $m^{th}$ cascade selection signal end among the M cascade selection signal ends; and the $m^{th}$ cascade output circuit is configured to provide a signal of the $m^{th}$ drive node to the cascade output end in response to a signal of the $m^{th}$ cascade selection signal end; and the drive output circuits include M drive output circuits, and the drive selection signal ends include M drive selection signal ends; an $m^{th}$ drive output circuit among the M drive output circuits corresponds to the $m^{th}$ drive node, and the $m^{th}$ drive output circuit corresponds to an $m^{th}$ drive selection signal end among the M drive selection signal ends; and the $m^{th}$ drive output circuit is configured to provide the signal of the $m^{th}$ drive node to an $m^{th}$ drive output end in response to a signal of the $m^{th}$ drive selection signal end.

In some possible implementations of the present disclosure, the $m^{th}$ cascade output circuit includes: an $m^{th}$ first transistor; and a control electrode of the $m^{th}$ first transistor is coupled with the $m^{th}$ cascade selection signal end, a first electrode of the $m^{th}$ first transistor is coupled with the $m^{th}$ drive node, and a second electrode of the $m^{th}$ first transistor is coupled with the cascade output end.

In some possible implementations of the present disclosure, the $m^{th}$ drive output circuit includes: an $m^{th}$ second transistor; and a control electrode of the $m^{th}$ second transistor is coupled with the $m^{th}$ drive selection signal end, a first electrode of the $m^{th}$ second transistor is coupled with the $m^{th}$ drive node, and a second electrode of the $m^{th}$ second transistor is coupled with the drive output end.

In some possible implementations of the present disclosure, the $m^{th}$ second control circuit includes: an $m^{th}$ third transistor, an $m^{th}$ fourth transistor and an $m^{th}$ first capacitor; a control electrode of the $m^{th}$ third transistor is coupled with the first node, a first electrode of the $m^{th}$ third transistor is coupled with the $m^{th}$ second clock signal end, and a second electrode of the $m^{th}$ third transistor is coupled with the $m^{th}$ drive node; a control electrode of the $m^{th}$ fourth transistor is coupled with the second node, a first electrode of the $m^{th}$ fourth transistor is coupled with the first reference signal end, and a second electrode of the $m^{th}$ fourth transistor is coupled with the $m^{th}$ drive node; and a first electrode plate of the $m^{th}$ first capacitor is coupled with the first node, and a second electrode plate of the $m^{th}$ first capacitor is coupled with the $m^{th}$ drive node.

In some possible implementations of the present disclosure, the $m^{th}$ second control circuit further includes: an $m^{th}$ fifth transistor; the control electrode of the $m^{th}$ third transistor is coupled with the first node through the $m^{th}$ fifth transistor; a first electrode of the $m^{th}$ fifth transistor is coupled with the first node, and a second electrode of the $m^{th}$ fifth transistor is coupled with the control electrode of the $m^{th}$ third transistor; when m=1, a control electrode of the $m^{th}$ fifth transistor is coupled with a second reference signal end; and when $1 \leq m \leq M$, the control electrode of the $m^{th}$ fifth transistor is coupled with the first clock signal end.

In some possible implementations of the present disclosure, the first control circuit includes: an input circuit and a node control circuit; the input circuit is configured to provide the signal of the input signal end to the first node in response to the signal of the first clock signal end; and the node control circuit is configured to provide a signal of the second reference signal end to the second node in response to the signal of the first clock signal end, provide the signal of the first clock signal end to the second node in response to the signal of the first node, and provide the signal of the first reference signal end to the first node in response to the signal of the second node and a signal of a $1^{st}$ second clock signal end.

In some possible implementations of the present disclosure, the input circuit includes: a sixth transistor; a control electrode of the sixth transistor is coupled with the first clock signal end, a first electrode of the sixth transistor is coupled with the input signal end, and a second electrode of the sixth transistor is coupled with the first node; and the node control circuit includes: a seventh transistor, an eighth transistor, a ninth transistor, a tenth transistor and a second capacitor, wherein a control electrode of the seventh transistor is coupled with the first clock signal end, a first electrode of the seventh transistor is coupled with the second reference signal end, and a second electrode of the seventh transistor is coupled with the second node; a control electrode of the eighth transistor is coupled with the first node, a first electrode of the eighth transistor is coupled with the first clock signal end, and a second electrode of the eighth transistor is coupled with the second node; a control electrode of the ninth transistor is coupled with the second node, a first electrode of the ninth transistor is coupled with the first reference signal end, and a second electrode of the ninth transistor is coupled with a first electrode of the tenth transistor; a control electrode of the tenth transistor is coupled with the $1^{st}$ second clock signal end, and a second electrode of the tenth transistor is coupled with the first node; and a first electrode plate of the second capacitor is coupled with the second node, and a second electrode plate of the second capacitor is coupled with the first reference signal end.

An embodiment of the present disclosure further provides a gate drive circuit, including a plurality of above cascaded shift register units, an input signal end of a first-stage shift register unit is coupled with a frame start signal line; and in every two adjacent stages of shift register units, an input signal end of a next-stage shift register unit is coupled with a cascade output end of a previous-stage shift register unit.

An embodiment of the present disclosure further provides a display apparatus, including a display panel. The display panel includes: a plurality of gate lines, a plurality of clock signal lines, a plurality of cascade selection signal lines, a plurality of drive selection signal lines and the above gate drive circuit. drive output ends of shift register units in the gate drive circuits are coupled with the plurality of gate lines in a one-to-one correspondence mode, and one shift register unit in the gate drive circuit is coupled with the plurality of clock signal lines; cascade selection signal ends of the shift register units in the gate drive circuit are coupled with the cascade selection signal lines; and drive selection signal ends of the shift register units in the gate drive circuit are coupled with the drive selection signal lines.

In some possible implementations of the present disclosure, the display panel further includes a plurality of pixel units arranged in an array, and one row of pixel units corresponds to one shift register unit in the gate drive circuit; each of pixel units includes a plurality of sub-pixels of different colors arranged in a column direction, and one row of sub-pixels is coupled with one gate line; and an $m^{th}$ drive output end of each of the shift register units is coupled with a gate line corresponding to sub-pixels of the same color.

In some possible implementations of the present disclosure, M=3, and each pixel unit includes a first-color sub-pixel, a second-color sub-pixel and a third-color sub-pixel arranged in sequence in the column direction; the plurality of clock signal lines include a first clock signal line, a second clock signal line, a third clock signal line and a fourth clock signal line; a first clock signal end of a $(4k\_3)^{th}$-stage shift register unit, a $1^{st}$ second clock signal end of a $(4k\_2)^{th}$-stage shift register unit, a $2^{nd}$ second clock signal end of a $(4k\_1)^{th}$-stage shift register unit and a $3^{rd}$ second clock signal end of a $(4k)^{th}$-stage shift register unit are all coupled with the first clock signal line; a $1^{st}$ second clock signal end of the $(4k\_3)^{th}$-stage shift register unit, a $2^{nd}$ second clock signal end of the $(4k\_2)^{th}$-stage shift register unit, a $3^{rd}$ second clock signal end of the $(4k\_1)^{th}$-stage shift register unit and a first clock signal end of the $(4k)^{th}$-stage shift register unit are all coupled with the second clock signal line; a $2^{nd}$ second clock signal end of the $(4k\_3)^{th}$-stage shift register unit, a $3^{rd}$ second clock signal end of the $(4k\_2)^{th}$-stage shift register unit, a first clock signal end of the $(4k\_1)^{th}$-stage shift register unit and a $1^{st}$ second clock signal end of the $(4k)^{th}$-stage shift register unit are all coupled with the third clock signal line; a $3^{rd}$ second clock signal end of the $(4k\_3)^{th}$-stage shift register unit, a first clock signal end of the $(4k\_2)^{th}$-stage shift register unit, a $1^{st}$ second clock signal end of the $(4k\_1)^{th}$-stage shift register unit and a $2^{nd}$ second clock signal end of the $(4k)^{th}$-stage shift register unit are all coupled with the fourth clock signal line; and k is an integer greater than 0; the plurality of cascade selection signal lines include a first cascade selection signal line, a second cascade selection signal line and a third cascade selection signal line; and a $1^{st}$ cascade selection signal end of each-stage shift register unit is coupled with the first cascade selection signal line, a $2^{nd}$ cascade selection signal end of each-stage shift register unit is coupled with the second cascade selection signal line, and a $3^{rd}$ cascade selection signal end of each-stage shift register unit is coupled with the third cascade selection signal line; and the plurality of drive selection signal lines include a first drive selection signal line, a second drive selection signal line and a third drive selection signal line; and a $1^{st}$ drive selection signal end of each-stage shift register unit is coupled with the first drive selection signal line, a $2^{nd}$ drive selection signal end of each-stage shift register unit is coupled with the second drive selection signal line, and a $3^{rd}$ drive selection signal end of each-stage shift register unit is coupled with the third drive selection signal line.

An embodiment of the present disclosure further provides a driving method for the above shift register unit, including: at a first drive mode, one display frame including a first input phase, a first output phase and a first reset phase; at the first input phase, controlling, by the first control circuit, the signal of the first node and the signal of the second node according to the signal of the input signal end and the signal of the first clock signal end; controlling, by second control circuits, signals of at least two drive nodes according to the signal of the first node, the signal of the second node and the signals of second clock signal ends; providing, by cascade output circuits, a signal of an $M^{th}$ drive node of the at least two drive nodes to a cascade output end according to cascade selection signal ends; and providing, by drive output circuits, the signal of each of the at least two drive nodes to a drive output end corresponding to each drive node according to drive selection signal ends; at the first output phase, controlling, by the second control circuits, the signals of the at least two drive nodes according to the signal of the first node and the signals of the second clock signal ends; providing, by the cascade output circuits, the signal of the $M^{th}$ drive node of the at least two drive nodes to the cascade output end according to the cascade selection signal ends; and providing, by the drive output circuits, the signal of each of the at least two drive nodes to the drive output end corresponding to each drive node according to the drive selection signal ends; and at the first reset phase, controlling, by the first control circuit, the signal of the first node and the signal of the second node according to the signal of the first clock signal end; controlling, by the second control circuits, the signals of the at least two drive nodes according to the signal of the second node; providing, by the cascade output circuits, the signal of the $M^{th}$ drive node of the at least two drive nodes to the cascade output end according to the cascade selection signal ends; and providing, by the drive output circuits, the signal of each of the at least two drive nodes to the drive output end corresponding to each drive node according to the drive selection signal ends; at a second drive mode, one display frame including a second input phase, a second output phase and a second reset phase; at the second input phase, controlling, by the first control circuit, the signal of the first node and the signal of the second node according to the signal of the input signal end and the signal of the first clock signal end; controlling, by the second control circuits, the signals of the at least two drive nodes according to the signal of the first node, the signal of the second node and the signals of the second clock signal ends; providing, by the cascade output circuits, a signal of an $m^{th}$ drive node of the at least two drive nodes to the cascade output end according to the cascade selection signal ends; and providing, by the drive output circuits, the signal of the $m^{th}$ drive node of the at least two drive nodes to the corresponding drive output end according to the drive selection signal ends; at the second output phase, controlling, by the second control circuits, the signals of the at least two drive nodes according to the signal of the first node and the signal of the second clock signal end; providing, by the cascade output circuits, the signal of the $m^{th}$ drive node of the at least two drive nodes to the cascade output end according to the cascade selection signal ends; and providing, by the drive output circuits, the signal of the $m^{th}$ drive node of the at least two drive nodes to the corresponding drive output end according to the drive selection signal ends; and at the second reset phase, controlling, by the first control circuit, the signal of the first node and the signal of the second node according to the signal of the first clock signal end; controlling, by the second control circuits, the signals of the at least two drive nodes according to the signal of the second node; providing, by the cascade output circuits, the signal of the $m^{th}$ drive node of the at least two drive nodes to the cascade output end according to the cascade selection signal ends; and providing, by the drive output circuits, the signal of the $m^{th}$ drive node of the at least two drive nodes to the corresponding drive output end according to the drive selection signal ends.

An embodiment of the present disclosure further provides a driving method for the above display apparatus, including: at a first drive mode, in one display frame, loading different first clock signals for the clock signal lines, loading a gate turn-on signal for each of the drive selection signal lines, loading a gate turn-on signal for a cascade selection signal line coupled with an $M^{th}$ drive output circuit, loading a gate turn-off signal for remaining cascade selection signal lines, controlling the shift register units to work sequentially, providing a signal of an $M^{th}$ drive node of at least two drive nodes to the cascade output end, providing a signal of each of the at least two drive nodes to a drive output end corresponding to each drive node, and scanning a plurality of gate lines row by row; and at a second drive mode, in one display frame, loading a second clock signal for each of the clock signal lines, loading a gate turn-on signal for a drive selection signal line coupled with an $m^{th}$ cascade output circuit, loading a gate turn-off signal for remaining drive selection signal lines, loading a gate turn-on signal for a cascade selection signal line coupled with an $m^{th}$ drive output circuit, loading a gate turn-off signal for remaining cascade selection signal lines, controlling the shift register units to work sequentially, providing a signal of an $m^{th}$ drive node of the at least two drive nodes to the cascade output end, providing the signal of the $m^{th}$ drive node to the corresponding drive output end, and scanning the plurality of gate lines in an interlaced mode, wherein a clock cycle of the second clock signal is different from a clock cycle of the first clock signal.

In some possible implementations of the present disclosure, at the second drive mode, the same second clock signal is loaded for a first clock signal line and a third clock signal line, the same second clock signal is loaded for a second clock signal line and a fourth clock signal line, a gate turn-on signal is loaded for a first cascade selection signal line, a gate turn-off signal is loaded for both a second cascade selection signal line and a third cascade selection signal line, a gate turn-on signal is loaded for a first drive selection signal line, a gate turn-off signal is loaded for both a second drive selection signal line and a third drive selection signal line, all the shift register units are controlled to work sequentially, a signal of a $1^{st}$ drive node is provided to the cascade output end, the signal of the $1^{st}$ drive node is provided to a $1^{st}$ drive output end, and a gate line coupled with each first-color sub-pixel row is scanned, wherein the second clock signal loaded for the first clock signal line is different from the second clock signal loaded for the second clock signal end.

In some possible implementations of the present disclosure, the clock cycle of the second clock signal is not greater than 3/2 of the clock cycle of the first clock signal.

In some possible implementations of the present disclosure, at the second drive mode, the different second clock signals are loaded for the first clock signal line to a fourth clock signal line respectively, a gate turn-on signal is loaded for a second cascade selection signal line, a gate turn-off signal is loaded for both a first cascade selection signal line and the third cascade selection signal line, a gate turn-on signal is loaded for a second drive selection signal line, a gate turn-off signal is loaded for both a first drive selection signal line and a third drive selection signal line, all the shift register units are controlled to work sequentially, a signal of a $2^{nd}$ drive node is provided to the cascade output end, the signal of the $2^{nd}$ drive node is provided to a $2^{nd}$ drive output end, and a gate line coupled with each second-color sub-pixel row is scanned, wherein the second clock signal has two different clock cycles.

In some possible implementations of the present disclosure, the two different clock cycles include a first clock cycle and a second clock cycle, the first clock cycle is not greater than 3/4 of the clock cycle of the first clock signal, and the second clock cycle is not greater than 9/4 of the clock cycle of the first clock signal.

In some possible implementations of the present disclosure, at the second drive mode, the different second clock signals are loaded for the first clock signal line to the fourth clock signal line respectively, a gate turn-on signal is loaded for a third cascade selection signal line, a gate turn-off signal is loaded for both a first cascade selection signal line and a second cascade selection signal line, a gate turn-on signal is loaded for a third drive selection signal line, a gate turn-off signal is loaded for both a first drive selection signal line and a second drive selection signal line, the shift register units are controlled to work sequentially, a signal of a $3^{rd}$ drive node is provided to the cascade output end, the signal of the $3^{rd}$ drive node is provided to a $3^{rd}$ drive output end, and a gate line coupled with each third-color sub-pixel row is scanned.

In some possible implementations of the present disclosure, the second clock cycle is not greater than three times the clock cycle of the first clock signal.

In some possible implementations of the present disclosure, a duration of an active level of the second clock signal in one clock cycle is not less than a duration of an active level of the first clock signal in one clock cycle.

In some possible implementations of the present disclosure, corresponding to a situation when the gate line coupled with the first-color sub-pixel row is scanned, the duration of the active level of the second clock signal in one clock cycle is greater than the duration of the active level of the first clock signal in one clock cycle; corresponding to a situation when the gate line coupled with the second-color sub-pixel row is scanned, the duration of the active level of the second clock signal in one clock cycle is equal to the duration of the active level of the first clock signal in one clock cycle; and corresponding to a situation when the gate line coupled with the third-color sub-pixel row is scanned, the duration of the active level of the second clock signal in one clock cycle is equal to the duration of the active level of the first clock signal in one clock cycle.

BRIEF DESCRIPTION OF THE DRAWINGS

FIG. 4 is a schematic flow diagram of a shift register unit at a first drive mode provided by an embodiment of the present disclosure.

FIG. 6 is a schematic flow diagram of a shift register unit at a second drive mode provided by an embodiment of the present disclosure.

FIG. 14 is a schematic diagram of some flows of a display apparatus provided by an embodiment of the present disclosure.

DETAILED DESCRIPTION OF THE EMBODIMENTS

In order to make the objective, technical solutions and advantages of the embodiments of the present disclosure more clear, the technical solutions of the embodiments of the present disclosure will be described clearly and completely with reference to accompanying drawings of the embodiments of the present disclosure. Apparently, the described embodiments are part of the embodiments of the present disclosure, but not all the embodiments. The embodiments in the present disclosure and features in the embodiments may be mutually combined in the case of no conflict. On the basis of the described embodiments of the present disclosure, all other embodiments obtained by those ordinarily skilled in the art without inventive efforts fall within the scope of protection of the present disclosure.

Unless otherwise defined, the technical or scientific terms used in the present disclosure shall have the usual meanings understood by a person of ordinary skill in the art to which the present disclosure belongs. "First", "second" and similar words used in the present disclosure do not indicate any order, quantity or importance, but are only used to distinguish different components. "May include" or "containing" and similar words mean that an element or item preceding the word covers an element or item listed after the word and the equivalent thereof, without excluding other elements or items. "Connection" or "coupling" and similar words are not restricted to physical or mechanical connection, but may include electrical connection, whether direct or indirect.

It should be noted that sizes and shapes of all graphs in the accompanying drawings do not reflect the true scale, and only intend to illustrate the content of the present disclosure. The same or similar reference numbers represent the same or similar elements or elements with the same or similar functions from beginning to end.

Figure 1:
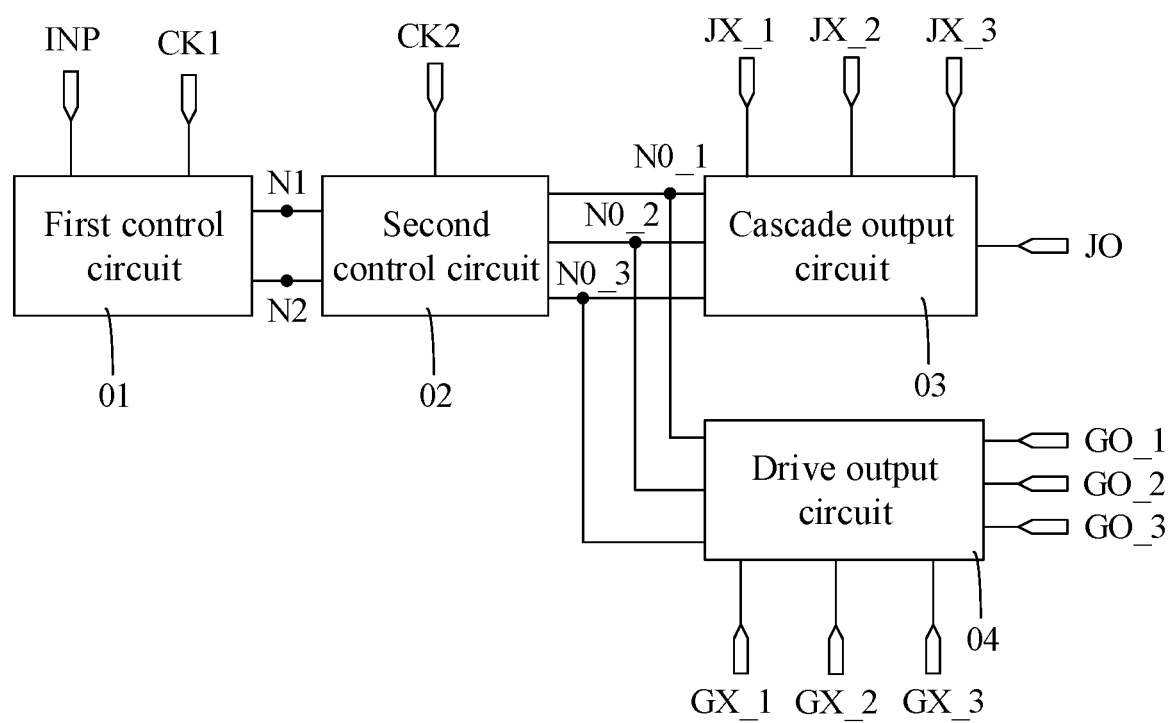
FIG. 1 is a schematic diagram of some structures of a shift register unit provided by an embodiment of the present disclosure.

A shift register unit provided by an embodiment of the present disclosure, as shown in FIG. 1, may include: a first control circuit 01, configured to control a signal of a first node N1 and a signal of a second node N2 according to a signal of an input signal end INP and a signal of a first clock signal end CK1; second control circuits 02, configured to control signals of at least two drive nodes N0_1-N0_3 (three drive nodes are taken as an example in FIG. 1) according to the signals of the first node N1, the signal of the second node N2 and signals of second clock signal ends; cascade output circuits 03, configured to provide the signal of one of the at least two drive nodes N0_1-N0_3 to a cascade output end JO according to cascade selection signal ends JX_1-JX_3 (three cascade selection signal ends are taken as an example in FIG. 1); and drive output circuits 04, configured to provide the signal of at least one of the at least two drive nodes N0_1-N0_3 (three drive nodes are taken as an example in FIG. 1) to drive output ends GO_1-GO_3 (three drive output ends are taken as an example in FIG. 1) corresponding to the drive nodes according to drive selection signal ends GX_1-GX_3 (three drive selection signal ends are taken as an example in FIG. 1).

According to the shift register unit provided by the embodiment of the present disclosure, through mutual cooperation of the first control circuit, the second control circuit, the cascade output circuit and the drive output circuit, the signal of one drive node may be selected from the signals of the plurality of drive nodes and provided to the cascade output end JO as a cascade signal to be output, so as to input the corresponding signal for the input signal end of a next-stage shift register unit. Because one drive output end is coupled with one gate line, the shift register unit in the embodiment of the present disclosure may be coupled with the plurality of gate lines, so that the signal of at least one drive node is selected from the signals of the plurality of drive nodes and provided to the drive output end as a gate scanning signal to be output, so as to input the corresponding gate scanning signal for the at least one of the plurality of coupled gate lines, thereby realizing that one shift register unit drives the plurality of coupled gate lines or drives one of the plurality of coupled gate lines. Moreover, because the shift register unit in the embodiment of the present disclosure may be coupled with the plurality of gate lines, compared with one gate line connected with one shift register unit, the quantity of the shift register units arranged in a display panel may be reduced, thereby realizing narrow bezel design of the display panel.

In some embodiments of the present disclosure, the drive nodes may include M drive nodes, the second clock signal ends may include M second clock signal ends, the drive output ends may include M drive output ends, the cascade selection signal ends may include M cascade selection signal ends, and the drive selection signal ends may include M drive selection signal ends. The second control circuits may include M second control circuits, the cascade output circuits may include M cascade output circuits, and the drive output circuits may include M drive output circuits. An $m^{th}$ second control circuit among the M second control circuits corresponds to an $m^{th}$ drive node among the M drive nodes, and the $m^{th}$ second control circuit corresponds to an $m^{th}$ second clock signal end among the M second clock signal ends; the $m^{th}$ second control circuit is configured to provide a signal of the $m^{th}$ second clock signal end to the $m^{th}$ drive node in response to the signal of the first node, and provide a signal of a first reference signal end VREF1 to the $m^{th}$ drive node in response to the signal of the second node. An $m^{th}$ cascade output circuit among the M cascade output circuits corresponds to the $m^{th}$ drive node, and the $m^{th}$ cascade output circuit corresponds to an $m^{th}$ cascade selection signal end among the M cascade selection signal ends; and the $m^{th}$ cascade output circuit is configured to provide a signal of the $m^{th}$ drive node to the cascade output end JO in response to the signal of the $m^{th}$ cascade selection signal end. An $m^{th}$ drive output circuit among the M drive output circuits corresponds to the $m^{th}$ drive node, and the $m^{th}$ drive output circuit corresponds to an $m^{th}$ drive selection signal end among the M drive selection signal ends; and the $m^{th}$ drive output circuit is configured to provide the signal of the $m^{th}$ drive node to an $m^{th}$ drive output end in response to the signal of the $m^{th}$ drive selection signal end. M is an integer greater than 1, $1 \leq m \leq M$, and m is an integer.

Illustration is made below by taking M=3 as an example. Certainly, in practical applications, M may further be set as other values, such as 2, 4, 5, 6 or more, which will not be limited here.

Figure 2:
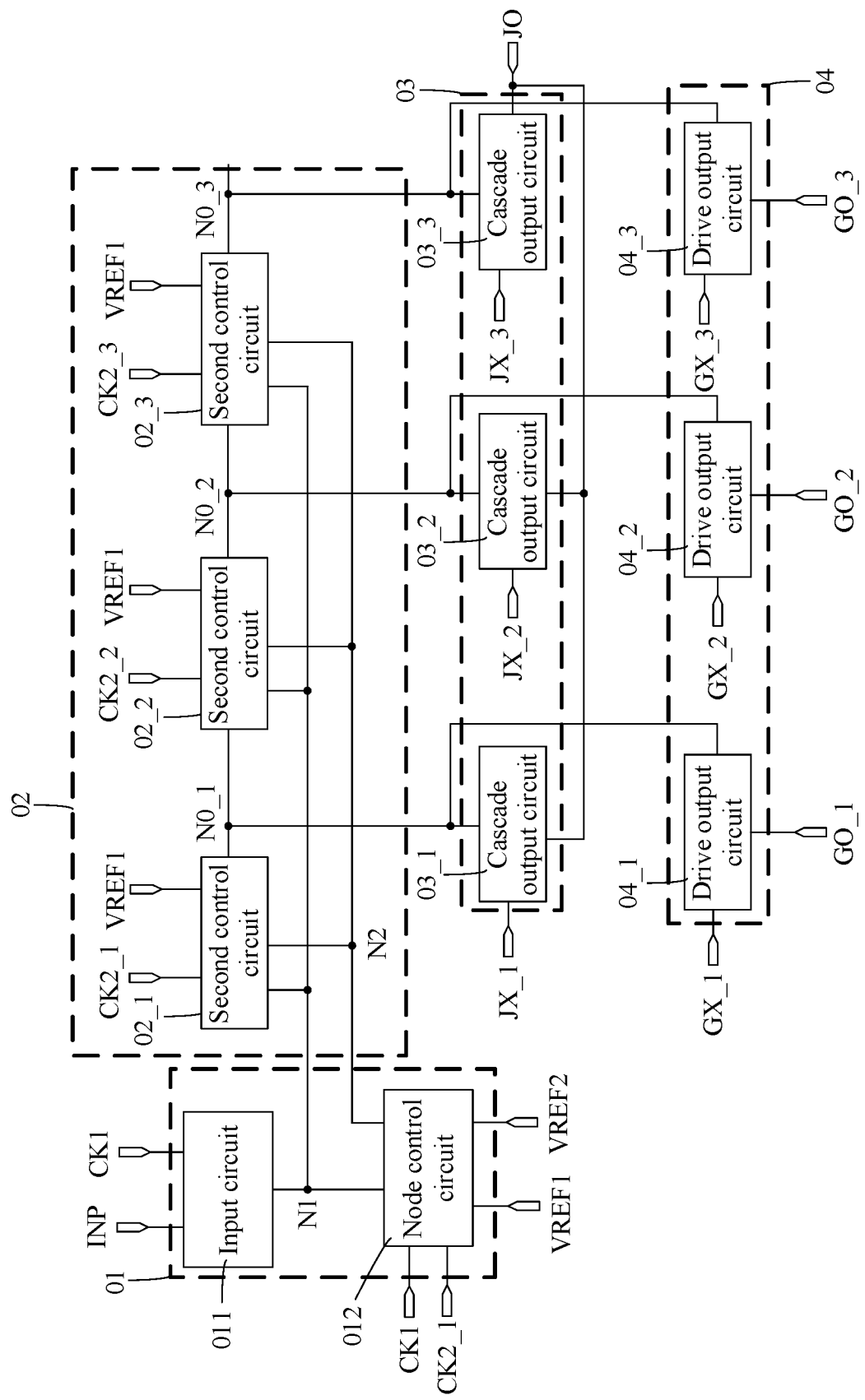
FIG. 2 is a schematic diagram of some structures of a shift register unit provided by an embodiment of the present disclosure.

In some embodiments of the present disclosure, as shown in FIG. 2, the drive node may include three drive nodes: a $1^{st}$ drive node N0_1, a $2^{nd}$ drive node N0_2, and a $3^{rd}$ drive node N0_3. The second clock signal end may include three second clock signal ends: a $1^{st}$ second clock signal end CK2_1, a $2^{nd}$ second clock signal end CK2_2, and a $3^{rd}$ second clock signal end CK2_3. The drive output end may include three drive output ends: a $1^{st}$ drive output end GO_1, a $2^{nd}$ drive output end GO_2, and a $3^{rd}$ drive output end GO_3. The cascade selection signal end may include three cascade selection signal ends: a $1^{st}$ cascade selection signal end JX_1, a $2^{nd}$ cascade selection signal end JX_2, and a $3^{rd}$ cascade selection signal end JX_3. The drive selection signal end may include three drive selection signal ends: a $1^{st}$ drive selection signal end GX_1, a $2^{nd}$ drive selection signal end GX_2, and a $3^{rd}$ drive selection signal end GX_3. The second control circuit may include three second control circuits: a $1^{st}$ second control circuit 02_1, a $2^{nd}$ second control circuit 02_2, and a $3^{rd}$ second control circuit 02_3. The cascade output circuit may include three cascade output circuits: a $1^{st}$ cascade output circuit 03_1, a $2^{nd}$ cascade output circuit 03_2 and a $3^{rd}$ cascade output circuit 03_3. The drive output circuit may include three drive output circuits: a $1^{st}$ drive output circuit 04_1, a $2^{nd}$ drive output circuit 042, and a $3^{rd}$ drive output circuit 04_3.

In some embodiments of the present disclosure, as shown in FIG. 2, the $1^{st}$ second control circuit 02_1 is arranged corresponding to the $1^{st}$ drive node N0_1 and the $1^{st}$ second clock signal end CK2_1, and the $1^{st}$ second control circuit 02_1 is configured to provide a signal of the $1^{st}$ second clock signal end CK2_1 to the $1^{st}$ drive node N0_1 in response to the signal of the first node N1, and provide the signal of the first reference signal end VREF1 to the $1^{st}$ drive node N0_1 in response to the signal of the second node N2. The $1^{st}$ cascade output circuit 03_1 corresponds to the $1^{st}$ drive node N0_1 and the $1^{st}$ cascade selection signal end JX_1, and the $1^{st}$ cascade output circuit 03_1 is configured to provide a signal of the $1^{st}$ drive node N0_1 to the cascade output end JO in response to a signal of the $1^{st}$ cascade selection signal end JX_1. The $1^{st}$ drive output circuit 04_1 corresponds to the $1^{st}$ drive node N0_1 and the $1^{st}$ drive selection signal end GX_1, and the $1^{st}$ drive output circuit 04_1 is configured to provide the signal of the $1^{st}$ drive node N0_1 to the $1^{st}$ drive output end GO_1 in response to a signal of the $1^{st}$ drive selection signal end GX_1.

In some embodiments of the present disclosure, as shown in FIG. 2, the $2^{nd}$ second control circuit 02_2 is arranged corresponding to the $2^{nd}$ drive node N0_2 and the $2^{nd}$ second clock signal end CK2_2, and the $2^{nd}$ second control circuit 02_2 is configured to provide a signal of the $2^{nd}$ second clock signal end CK2_2 to the $2^{nd}$ drive node N0_2 in response to the signal of the first node N1, and provide the signal of the first reference signal end VREF1 to the $2^{nd}$ drive node N0_2 in response to the signal of the second node N2. The $2^{nd}$ cascade output circuit 03_2 corresponds to the $2^{nd}$ drive node N0_2 and the $2^{nd}$ cascade selection signal end JX_2, and the $2^{nd}$ cascade output circuit 03_2 is configured to provide a signal of the $2^{nd}$ drive node N0_2 to the cascade output end JO in response to a signal of the $2^{nd}$ cascade selection signal end JX_2. The $2^{nd}$ drive output circuit 04_2 corresponds to the $2^{nd}$ drive node N0_2 and the $2^{nd}$ drive selection signal end GX_2, and the $2^{nd}$ drive output circuit 04_2 is configured to provide the signal of the $2^{nd}$ drive node N0_2 to the $2^{nd}$ drive output end GO_2 in response to a signal of the $2^{nd}$ drive selection signal end GX_2.

In some embodiments of the present disclosure, as shown in FIG. 2, the $3^{rd}$ second control circuit 02_3 is arranged corresponding to the $3^{rd}$ drive node N0_3 and the $3^{rd}$ second clock signal end CK2_3, and the $3^{rd}$ second control circuit 02_3 is configured to provide a signal of the $3^{rd}$ second clock signal end CK2_3 to the $3^{rd}$ drive node N0_3 in response to the signal of the first node N1, and provide the signal of the first reference signal end VREF1 to the $3^{rd}$ drive node N0_3 in response to the signal of the second node N2. The $3^{rd}$ cascade output circuit 03_3 corresponds to the $3^{rd}$ drive node N0_3 and the $3^{rd}$ cascade selection signal end JX_3, and the $3^{rd}$ cascade output circuit 03_3 is configured to provide a signal of the $3^{rd}$ drive node N0_3 to the cascade output end JO in response to a signal of the $3^{rd}$ cascade selection signal end JX_3. The $3^{rd}$ drive output circuit 04_3 corresponds to the $3^{rd}$ drive node N0_3 and the $3^{rd}$ drive selection signal end GX_3, and the $3^{rd}$ drive output circuit 043 is configured to provide the signal of the $3^{rd}$ drive node N0_3 to the $3^{rd}$ drive output end GO_3 in response to a signal of the $3^{rd}$ drive selection signal end GX_3.

In some embodiments of the present disclosure, as shown in FIG. 2, the first control circuit 01 may include an input circuit 011 and a node control circuit 012. The input circuit 011 is configured to provide the signal of the input signal end INP to the first node N1 in response to the signal of the first clock signal end CK1. The node control circuit 012 is configured to provide a signal of the second reference signal end VREF2 to the second node N2 in response to the signal of the first clock signal end CK1, provide the signal of the first clock signal end CK1 to the second node N2 in response to the signal of the first node N1, and provide the signal of the first reference signal end VREF1 to the first node N1 in response to the signals of the second node N2 and a $1^{st}$ second clock signal end CK2_1.

Figure 3:
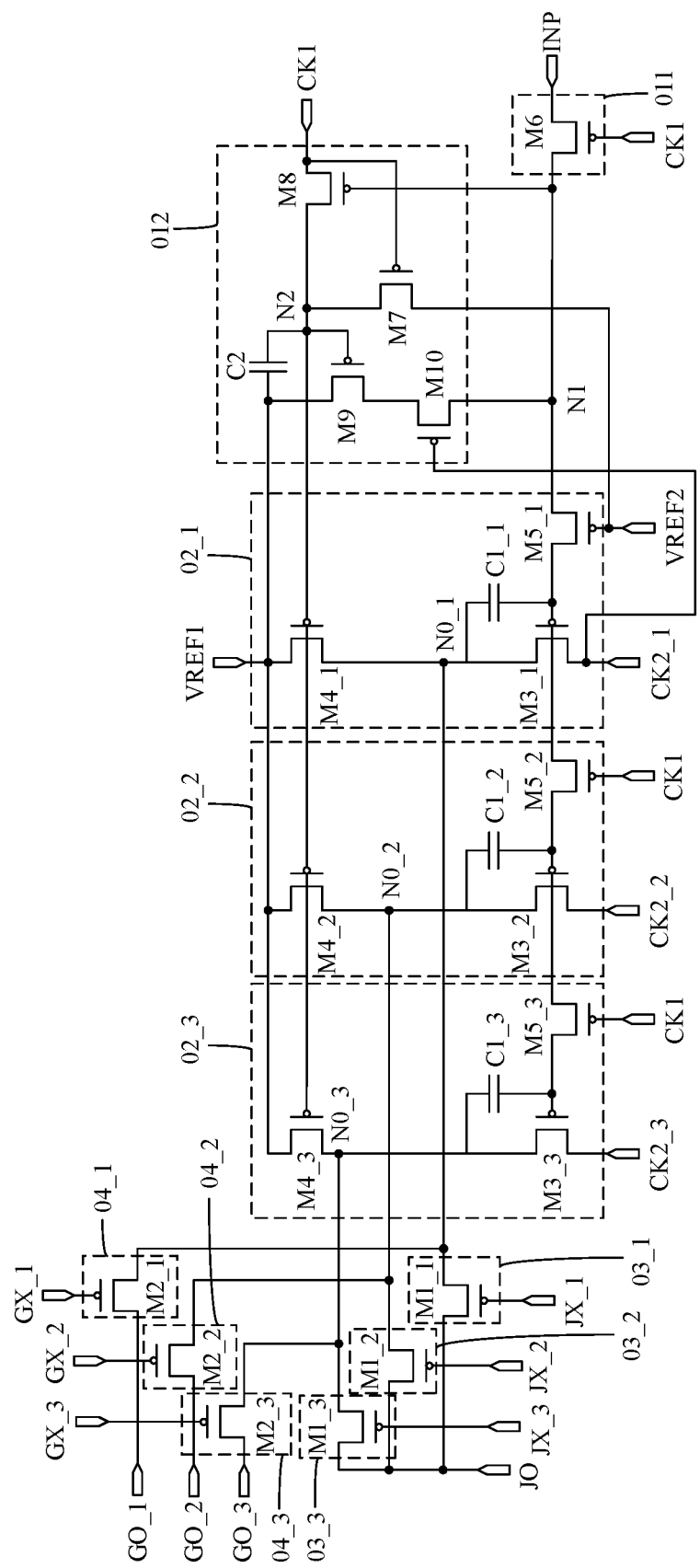
FIG. 3 is a schematic diagram of some specific structures of a shift register unit provided by an embodiment of the present disclosure.

In some embodiments of the present disclosure, as shown in FIG. 3, the $1^{st}$ cascade output circuit 03_1 may include: a $1^{st}$ first transistor M1_1. A control electrode of the $1^{st}$ first transistor M1_1 is coupled with the $1^{st}$ cascade selection signal end JX_1, a first electrode of the $1^{st}$ first transistor M1_1 is coupled with the $1^{st}$ drive node N0_1, and a second electrode of the $1^{st}$ first transistor M1_1 is coupled with the cascade output end JO. Exemplarily, the $1^{st}$ first transistor M1_1 may be turned on when the signal of the $1^{st}$ cascade selection signal end JX_1 is an active level, and may be turned off when the signal of the $1^{st}$ cascade selection signal end JX_1 is an inactive level. For example, the $1^{st}$ first transistor M1_1 may be an N-type transistor, then the active level of the signal of the $1^{st}$ cascade selection signal end JX_1 is a high level, and the inactive level of the signal of the $1^{st}$ cascade selection signal end JX_1 is a low level. Or, the $1^{st}$ first transistor M1_1 may be a P-type transistor, then the active level of the signal of the $1^{st}$ cascade selection signal end JX_1 is a low level, and the inactive level of the signal of the $1^{st}$ cascade selection signal end JX_1 is a high level.

In some embodiments of the present disclosure, as shown in FIG. 3, the $2^{nd}$ cascade output circuit 03_2 may include: a $2^{nd}$ first transistor M1_2. A control electrode of the $2^{nd}$ first transistor M1_2 is coupled with the $2^{nd}$ cascade selection signal end JX_2, a first electrode of the $2^{nd}$ first transistor M1_2 is coupled with the $2^{nd}$ drive node N0_2, and a second electrode of the $2^{nd}$ first transistor M1_2 is coupled with the cascade output end JO. Exemplarily, the $2^{nd}$ first transistor M1_2 may be turned on when the signal of the $2^{nd}$ cascade selection signal end JX_2 is an active level, and may be turned off when the signal of the $2^{nd}$ cascade selection signal end JX_2 is an inactive level. For example, the $2^{nd}$ first transistor M1_2 may be an N-type transistor, then the active level of the signal of the $2^{nd}$ cascade selection signal end JX_2 is a high level, and the inactive level of the signal of the $2^{nd}$ cascade selection signal end JX_2 is a low level. Or, the $2^{nd}$ first transistor M1_2 may be a P-type transistor, then the active level of the signal of the $2^{nd}$ cascade selection signal end JX_2 is a low level, and the inactive level of the signal of the $2^{nd}$ cascade selection signal end JX_2 is a high level.

In some embodiments of the present disclosure, as shown in FIG. 3, the $3^{rd}$ cascade output circuit 03_3 may include: a $3^{rd}$ first transistor M1_3. A control electrode of the $3^{rd}$ first transistor M1_3 is coupled with the $3^{rd}$ cascade selection signal end JX_3, a first electrode of the $3^{rd}$ first transistor M1_3 is coupled with the $3^{rd}$ drive node N0_3, and a second electrode of the $3^{rd}$ first transistor M1_3 is coupled with the cascade output end JO. Exemplarily, the $3^{rd}$ first transistor M1_3 may be turned on when the signal of the $3^{rd}$ cascade selection signal end JX_3 is an active level, and may be turned off when the signal of the $3^{rd}$ cascade selection signal end JX_3 is an inactive level. For example, the $3^{rd}$ first transistor M1_3 may be an N-type transistor, then the active level of the signal of the $3^{rd}$ cascade selection signal end JX_3 is a high level, and the inactive level of the signal of the $3^{rd}$ cascade selection signal end JX_3 is a low level. Or, the $3^{rd}$ first transistor M1_3 may be a P-type transistor, then the active level of the signal of the $3^{rd}$ cascade selection signal end JX_3 is a low level, and the inactive level of the signal of the $3^{rd}$ cascade selection signal end JX_3 is a high level.

In some embodiments of the present disclosure, as shown in FIG. 3, the $1^{st}$ drive output circuit 04_1 may include: a $1^{st}$ second transistor M2_1. A control electrode of the $1^{st}$ second transistor M2_1 is coupled with the $1^{st}$ drive selection signal end GX_1, a first electrode of the $1^{st}$ second transistor M2_1 is coupled with the $1^{st}$ drive node N0_1, and a second electrode of the $1^{st}$ second transistor M2_1 is coupled with the drive output end. Exemplarily, the $1^{st}$ second transistor M2_1 may be turned on when the signal of the $1^{st}$ drive selection signal end GX_1 is an active level, and may be turned off when the signal of the $1^{st}$ drive selection signal end GX_1 is an inactive level. For example, the $1^{st}$ second transistor M2_1 may be an N-type transistor, then the active level of the signal of the $1^{st}$ drive selection signal end GX_1 is a high level, and the inactive level of the signal of the $1^{st}$ drive selection signal end GX_1 is a low level. Or, the $1^{st}$ second transistor M2_1 may be a P-type transistor, then the active level of the signal of the $1^{st}$ drive selection signal end GX_1 is a low level, and the inactive level of the signal of the $1^{st}$ drive selection signal end GX_1 is a high level.

In some embodiments of the present disclosure, as shown in FIG. 3, the $2^{nd}$ drive output circuit 04_2 may include: a $2^{nd}$ second transistor M2_2. A control electrode of the $2^{nd}$ second transistor M2_2 is coupled with the $2^{nd}$ drive selection signal end GX_2, a first electrode of the $2^{nd}$ second transistor M2_2 is coupled with the $2^{nd}$ drive node N0_2, and a second electrode of the $2^{nd}$ second transistor M2_2 is coupled with the drive output end. Exemplarily, the $2^{nd}$ second transistor M2_2 may be turned on when the signal of the $2^{nd}$ drive selection signal end GX_2 is an active level, and may be turned off when the signal of the $2^{nd}$ drive selection signal end GX_2 is an inactive level. For example, the $2^{nd}$ second transistor M2_2 may be an N-type transistor, then the active level of the signal of the $2^{nd}$ drive selection signal end GX_2 is a high level, and the inactive level of the signal of the $2^{nd}$ drive selection signal end GX_2 is a low level. Or, the $2^{nd}$ second transistor M2_2 may be a P-type transistor, then the active level of the signal of the $2^{nd}$ drive selection signal end GX_2 is a low level, and the inactive level of the signal of the $2^{nd}$ drive selection signal end GX_2 is a high level.

In some embodiments of the present disclosure, as shown in FIG. 3, the $3^{rd}$ drive output circuit 04_3 may include: a $3^{rd}$ second transistor M2_3. A control electrode of the $3^{rd}$ second transistor M2_3 is coupled with the $3^{rd}$ drive selection signal end GX_3, a first electrode of the $3^{rd}$ second transistor M2_3 is coupled with the $3^{rd}$ drive node N0_3, and a second electrode of the $3^{rd}$ second transistor M2_3 is coupled with the drive output end. Exemplarily, the $3^{rd}$ second transistor M2_3 may be turned on when the signal of the $3^{rd}$ drive selection signal end GX_3 is an active level, and may be turned off when the signal of the $3^{rd}$ drive selection signal end GX_3 is an inactive level. For example, the $3^{rd}$ second transistor M2_3 may be an N-type transistor, then the active level of the signal of the $3^{rd}$ drive selection signal end GX_3 is a high level, and the inactive level of the signal of the $3^{rd}$ drive selection signal end GX_3 is a low level. Or, the $3^{rd}$ second transistor M2_3 may be a P-type transistor, then the active level of the signal of the $3^{rd}$ drive selection signal end GX_3 is a low level, and the inactive level of the signal of the $3^{rd}$ drive selection signal end GX_3 is a high level.

In some embodiments of the present disclosure, as shown in FIG. 3, the $1^{st}$ second control circuit 02_1 may include: a $1^{st}$ third transistor M3_1, a $1^{st}$ fourth transistor M4_1 and a $1^{st}$ first capacitor C1_1. A control electrode of the $1^{st}$ third transistor M3_1 is coupled with the first node N1, a first electrode of the $1^{st}$ third transistor M3_1 is coupled with the $1^{st}$ second clock signal end CK2_1, and a second electrode of the $1^{st}$ third transistor M3_1 is coupled with the $1^{st}$ drive node N0_1. A control electrode of the $1^{st}$ fourth transistor M4_1 is coupled with the second node N2, a first electrode of the $1^{st}$ fourth transistor M4_1 is coupled with the first reference signal end VREF1, and a second electrode of the $1^{st}$ fourth transistor M4_1 is coupled with the $1^{st}$ drive node N0_1. A first electrode plate of the $1^{st}$ first capacitor C1_1 is coupled with the first node N1, and a second electrode plate of the $1^{st}$ first capacitor C1_1 is coupled with the $1^{st}$ drive node N0_1. Exemplarily, the $1^{st}$ third transistor M3_1 may be turned on when the signal of the first node N1 is an active level, and may be turned off when the signal of the first node N1 is an inactive level. For example, the $1^{st}$ third transistor M3_1 may be an N-type transistor, then the active level of the signal of the first node N1 is a high level, and the inactive level of the signal of the first node N1 is a low level. Or, the $1^{st}$ third transistor M3_1 may be a P-type transistor, then the active level of the signal of the first node N1 is a low level, and the inactive level of the signal of the first node N1 is a high level. The $1^{st}$ fourth transistor M4_1 may be turned on when the signal of the second node N2 is an active level, and may be turned off when the signal of the second node N2 is an inactive level. For example, the $1^{st}$ fourth transistor M4_1 may be an N-type transistor, then the active level of the signal of the second node N2 is a high level, and the inactive level of the signal of the second node N2 is a low level. Or, the $1^{st}$ fourth transistor M4_1 may be a P-type transistor, then the active level of the signal of the second node N2 is a low level, and the inactive level of the signal of the second node N2 is a high level. The $1^{st}$ first capacitor C1_1 may keep voltage on its two electrode plates stable.

In some embodiments of the present disclosure, as shown in FIG. 3, the $2^{nd}$ second control circuit 02_2 may include: a $2^{nd}$ third transistor M3_2, a $2^{nd}$ fourth transistor M4_2 and a $2^{nd}$ first capacitor C1_2. A control electrode of the $2^{nd}$ third transistor M3_2 is coupled with the first node N1, a first electrode of the $2^{nd}$ third transistor M3_2 is coupled with the $2^{nd}$ second clock signal end CK2_2, and a second electrode of the $2^{nd}$ third transistor M3_2 is coupled with the $2^{nd}$ drive node N0_2. A control electrode of the $2^{nd}$ fourth transistor M4_2 is coupled with the second node N2, a first electrode of the $2^{nd}$ fourth transistor M4_2 is coupled with the first reference signal end VREF1, and a second electrode of the $2^{nd}$ fourth transistor M4_2 is coupled with the $2^{nd}$ drive node N0_2. A first electrode plate of the $2^{nd}$ first capacitor C1_2 is coupled with the first node N1, and a second electrode plate of the $2^{nd}$ first capacitor C1_2 is coupled with the $2^{nd}$ drive node N0_2. Exemplarily, the $2^{nd}$ third transistor M3_2 may be turned on when the signal of the first node N1 is an active level, and may be turned off when the signal of the first node N1 is an inactive level. For example, the $2^{nd}$ third transistor M3_2 may be an N-type transistor, then the active level of the signal of the first node N1 is a high level, and the inactive level of the signal of the first node N1 is a low level. Or, the $2^{nd}$ third transistor M3_2 may be a P-type transistor, then the active level of the signal of the first node N1 is a low level, and the inactive level of the signal of the first node N1 is a high level. The $2^{nd}$ fourth transistor M4_2 may be turned on when the signal of the second node N2 is the active level, and may be turned off when the signal of the second node N2 is the inactive level. For example, the $2^{nd}$ fourth transistor M4_2 may be an N-type transistor, then the active level of the signal of the second node N2 is a high level, and the inactive level of the signal of the second node N2 is a low level. Or, the $2^{nd}$ fourth transistor M4_2 may be a P-type transistor, then the active level of the signal of the second node N2 is a low level, and the inactive level of the signal of the second node N2 is a high level. The $2^{nd}$ first capacitor C1_2 may keep voltage on its two electrode plates stable.

In some embodiments of the present disclosure, as shown in FIG. 3, the $3^{rd}$ second control circuit 02_3 may include: a $3^{rd}$ third transistor M3_3, a $3^{rd}$ fourth transistor M4_3 and a $3^{rd}$ first capacitor C1_3. A control electrode of the $3^{rd}$ third transistor M3_3 is coupled with the first node N1, a first electrode of the $3^{rd}$ third transistor M3_3 is coupled with the $3^{rd}$ second clock signal end CK2_3, and a second electrode of the $3^{rd}$ third transistor M3_3 is coupled with the $3^{rd}$ drive node N0_3. A control electrode of the $3^{rd}$ fourth transistor M4_3 is coupled with the second node N2, a first electrode of the $3^{rd}$ fourth transistor M4_3 is coupled with the first reference signal end VREF1, and a second electrode of the $3^{rd}$ fourth transistor M4_3 is coupled with the $3^{rd}$ drive node N0_3. A first electrode plate of the $3^{rd}$ first capacitor C1_3 is coupled with the first node N1, and a second electrode plate of the $3^{rd}$ first capacitor C1_3 is coupled with the $3^{rd}$ drive node N0_3. Exemplarily, the $3^{rd}$ third transistor M3_3 may be turned on when the signal of the first node N1 is an active level, and may be turned off when the signal of the first node N1 is an inactive level. For example, the $3^{rd}$ third transistor M3_3 may be an N-type transistor, then the active level of the signal of the first node N1 is a high level, and the inactive level of the signal of the first node N1 is a low level. Or, the $3^{rd}$ third transistor M3_3 may be a P-type transistor, then the active level of the signal of the first node N1 is a low level, and the inactive level of the signal of the first node N1 is a high level. The $3^{rd}$ fourth transistor M4_3 may be turned on when the signal of the second node N2 is an active level, and may be turned off when the signal of the second node N2 is an inactive level. For example, the $3^{rd}$ fourth transistor M4_3 may be an N-type transistor, then the active level of the signal of the second node N2 is a high level, and the inactive level of the signal of the second node N2 is a low level. Or, the $3^{rd}$ fourth transistor M4_3 may be a P-type transistor, then the active level of the signal of the second node N2 is a low level, and the inactive level of the signal of the second node N2 is a high level. The $3^{rd}$ first capacitor C1_3 may keep voltage on its two electrode plates stable.

In some embodiments of the present disclosure, as shown in FIG. 3, the $1^{st}$ second control circuit 02_1 may further include: a $1^{st}$ fifth transistor M5_1. The control electrode of the $1^{st}$ third transistor M3_1 is coupled with the first node N1 through the $1^{st}$ fifth transistor M5_1. A first electrode of the $1^{st}$ fifth transistor M5_1 is coupled with the first node N1, and a second electrode of the $1^{st}$ fifth transistor M5_1 is coupled with the control electrode of the $1^{st}$ third transistor M3_1. A control electrode of the $1^{st}$ fifth transistor M5_1 is coupled with the second reference signal end VREF2. Exemplarily, the $1^{st}$ fifth transistor M5_1 may be an N-type transistor, and then the signal of the second reference signal end VREF2 is a low-level signal, so as to control the $1^{st}$ fifth transistor M5_1 to be turned on. Or, the $1^{st}$ fifth transistor M5_1 may also be a P-type transistor, and then the signal of the second reference signal end VREF2 is a high-level signal, so as to control the $1^{st}$ fifth transistor M5_1 to be turned on.

In some embodiments of the present disclosure, as shown in FIG. 3, the $2^{nd}$ second control circuit 02_2 may further include: a $2^{nd}$ fifth transistor M5_2. The control electrode of the $2^{nd}$ third transistor M3_2 is coupled with the first node N1 through the $2^{nd}$ fifth transistor M5_2. A first electrode of the $2^{nd}$ fifth transistor M5_2 is coupled with the first node N1, and a second electrode of the $2^{nd}$ fifth transistor M5_2 is coupled with the control electrode of the $2^{nd}$ third transistor M3_2. A control electrode of the $2^{nd}$ fifth transistor M5_2 is coupled with the first clock signal end CK1. Exemplarily, the $2^{nd}$ fifth transistor M5_2 may be turned on when the signal of the first clock signal end CK1 is an active level, and may be turned off when the signal of the first clock signal end CK1 is an inactive level. For example, the $2^{nd}$ fifth transistor M5_2 may be an N-type transistor, then the active level of the signal of the first clock signal end CK1 is a high level, and the inactive level of the signal of the first clock signal end CK1 is a low level. Or, the $2^{nd}$ fifth transistor M5_2 may also be a P-type transistor, then the active level of the signal of the first clock signal end CK1 is a low level, and the inactive level of the signal of the first clock signal end CK1 is a high level.

In some embodiments of the present disclosure, as shown in FIG. 3, the $3^{rd}$ second control circuit 02_3 may further include: a $3^{rd}$ fifth transistor M5_3. The control electrode of the $3^{rd}$ third transistor M3_3 is coupled with the first node N1 through the $3^{rd}$ fifth transistor M5_3. A first electrode of the $3^{rd}$ fifth transistor M5_3 is coupled with the first node N1, and a second electrode of the $3^{rd}$ fifth transistor M5_3 is coupled with the control electrode of the $3^{rd}$ third transistor M3_3. A control electrode of the $3^{rd}$ fifth transistor M5_3 is coupled with the first clock signal end CK1. Exemplarily, the $3^{rd}$ fifth transistor M5_3 may be turned on when the signal of the first clock signal end CK1 is an active level, and may be turned off when the signal of the first clock signal end CK1 is an inactive level. For example, the $3^{rd}$ fifth transistor M5_3 may be an N-type transistor, then the active level of the signal of the first clock signal end CK1 is a high level, and the inactive level of the signal of the first clock signal end CK1 is a low level. Or, the $3^{rd}$ fifth transistor M5_3 may also be a P-type transistor, then the active level of the signal of the first clock signal end CK1 is a low level, and the inactive level of the signal of the first clock signal end CK1 is a high level.

In some embodiments of the present disclosure, as shown in FIG. 3, the input circuit 011 may include: a sixth transistor M6. A control electrode of the sixth transistor M6 is coupled with the first clock signal end CK1, a first electrode of the sixth transistor M6 is coupled with the input signal end INP, and a second electrode of the sixth transistor M6 is coupled with the first node N1. Exemplarily, the sixth transistor M6 may be turned on when the signal of the first clock signal end CK1 is an active level, and may be turned off when the signal of the first clock signal end CK1 is an inactive level. For example, the sixth transistor M6 may be an N-type transistor, then the active level of the signal of the first clock signal end CK1 is a high level, and the inactive level of the signal of the first clock signal end CK1 is a low level. Or, the sixth transistor M6 may also be a P-type transistor, then the active level of the signal of the first clock signal end CK1 is a low level, and the inactive level of the signal of the first clock signal end CK1 is a high level.

In some embodiments of the present disclosure, as shown in FIG. 3, the node control circuit 012 may include: a seventh transistor M7, an eighth transistor M8, a ninth transistor M9, a tenth transistor M10 and a second capacitor C2. A control electrode of the seventh transistor M7 is coupled with the first clock signal end CK1, a first electrode of the seventh transistor M7 is coupled with the second reference signal end VREF2, and a second electrode of the seventh transistor M7 is coupled with the second node N2; a control electrode of the eighth transistor M8 is coupled with the first node N1, a first electrode of the eighth transistor M8 is coupled with the first clock signal end CK1, and a second electrode of the eighth transistor M8 is coupled with the second node N2; a control electrode of the ninth transistor M9 is coupled with the second node N2, a first electrode of the ninth transistor M9 is coupled with the first reference signal end VREF1, and a second electrode of the ninth transistor M9 is coupled with a first electrode of the tenth transistor M10; a control electrode of the tenth transistor M10 is coupled with the $1^{st}$ second clock signal end CK2_1, and a second electrode of the tenth transistor M10 is coupled with the first node N1; and a first electrode plate of the second capacitor C2 is coupled with the second node N2, and a second electrode plate of the second capacitor C2 is coupled with the first reference signal end VREF1. Exemplarily, the seventh transistor M7 may be turned on when the signal of the first clock signal end CK1 is the active level, and may be turned off when the signal of the first clock signal end CK1 is the inactive level. For example, the seventh transistor M7 may be an N-type transistor, then the active level of the signal of the first clock signal end CK1 is a high level, and the inactive level of the signal of the first clock signal end CK1 is a low level. Or, the seventh transistor M7 may be a P-type transistor, then the active level of the signal of the first clock signal end CK1 is a low level, and the inactive level of the signal of the first clock signal end CK1 is a high level. The eighth transistor M8 may be turned on when the signal of the first node N1 is the active level, and may be turned off when the signal of the first node N1 is the inactive level. For example, the eighth transistor M8 may be an N-type transistor, then the active level of the signal of the first node N1 is a high level, and the inactive level of the signal of the first node N1 is a low level. Or, the eighth transistor M8 may be a P-type transistor, then the active level of the signal of the first node N1 is a low level, and the inactive level of the signal of the first node N1 is a high level. The ninth transistor M9 may be turned on when the signal of the second node N2 is the active level, and may be turned off when the signal of the second node N2 is the inactive level. For example, the ninth transistor M9 may be an N-type transistor, then the active level of the signal of the second node N2 is a high level, and the inactive level of the signal of the second node N2 is a low level. Or, the ninth transistor M9 may be a P-type transistor, then the active level of the signal of the second node N2 is a low level, and the inactive level of the signal of the second node N2 is a high level. Moreover, the tenth transistor M10 may be turned on when the signal of the $1^{st}$ second clock signal end CK2_1 is an active level, and may be turned off when the signal of the $1^{st}$ second clock signal end CK2_1 is an inactive level. For example, the tenth transistor M10 may be an N-type transistor, then the active level of the signal of the $1^{st}$ second clock signal end CK2_1 is a high level, and the inactive level of the signal of the $1^{st}$ second clock signal end CK2_1 is a low level. Or, the tenth transistor M10 may be a P-type transistor, then the active level of the signal of the $1^{st}$ second clock signal end CK2_1 is a low level, and the inactive level of the signal of the $1^{st}$ second clock signal end CK2_1 is a high level. The second capacitor C2 may keep voltage on its two electrode plates stable.

The above is only an example to illustrate the specific structure of each circuit in the shift register unit provided in the embodiment of the present disclosure. During specific implementation, the specific structure of each above circuit is not limited to the above structure provided by the embodiment of the present disclosure, but also may be other structures known to those skilled in the art, which will not be limited here.

Optionally, in the above shift register unit provided by the embodiment of the present disclosure, all transistors may adopt the same material. During specific implementation, as shown in FIG. 3, all the transistors may be P-type transistors. Moreover, the signal of the first reference signal end VREF1 is a high-level signal, and the signal of the second reference signal end VREF2 is a low-level signal. Certainly, all the transistors may also be the N-type transistors, the signal of the first reference signal end VREF1 is a low-level signal, and the signal of the second reference signal end VREF2 is a high-level signal, which will not be limited here.

It should be noted that the transistors mentioned in the above embodiment of the present disclosure may be either a thin film transistor (TFT) or a metal oxide semiconductor (MOS) field effect transistor, which will not be limited here. In specific implementation, the control electrodes of these transistors serve as their gates. Moreover, according to different transistor types and signals of the signal ends, the first electrodes of these transistors may be used as sources or drains of the transistors, and the second electrodes may be used as drains or sources of the transistors, which will not be limited here.

The shift register unit provided by the embodiment of the present disclosure may realize two drive modes: a first drive mode and a second drive mode. When at the first drive mode, the signal of each drive node may be provided to the drive output end corresponding to each drive node, so that each drive output end outputs the signal. When at the second drive mode, the signal of one of the plurality of drive nodes may be provided to the corresponding drive output end, so that only one drive output end outputs the signal.

A driving method for the above shift register unit provided by the embodiment of the present disclosure, as shown in FIG. 4, may include: at a first drive mode, one display frame may include a first input phase T11, a first output phase T12 and a first reset phase T13.

S110, at the first input phase T11, a first control circuit controls signals of a first node and a second node according to signals of an input signal end and a first clock signal end; second control circuits control signals of at least two drive nodes according to the signals of the first node, the second node and second clock signal ends; cascade output circuits provide a signal of an $M^{th}$ drive node of the at least two drive nodes to a cascade output end according to cascade selection signal ends; and drive output circuits provide the signal of each of the at least two drive nodes to a drive output end corresponding to each drive node according to drive selection signal ends.

S120, at the first output phase T12, the second control circuits control the signals of the at least two drive nodes according to the signals of the first node and the second clock signal ends; the cascade output circuits provide the signal of the $M^{th}$ drive node of the at least two drive nodes to the cascade output end according to the cascade selection signal ends; and the drive output circuits provide the signal of each of the at least two drive nodes to the drive output end corresponding to each drive node according to the drive selection signal ends.

S130, at the first reset phase T13, the first control circuit controls the signals of the first node and the second node according to the signal of the first clock signal end; the second control circuits control the signals of the at least two drive nodes according to the signal of the second node; the cascade output circuits provide the signal of the $M^{th}$ drive node of the at least two drive nodes to the cascade output end according to the cascade selection signal ends; and the drive output circuits provide the signal of each of the at least two drive nodes to the drive output end corresponding to each drive node according to the drive selection signal ends.

In some embodiments of the present disclosure, taking the active level as a low level as an example, at the first drive mode, the signals of the drive selection signal end are all low-level signals. Moreover, a signal of a cascade selection signal end corresponding to a cascade output circuit coupled with the $M^{th}$ drive node is a low-level signal, and signals of remaining cascade selection signal ends are high-level signals.

Figure 5A:
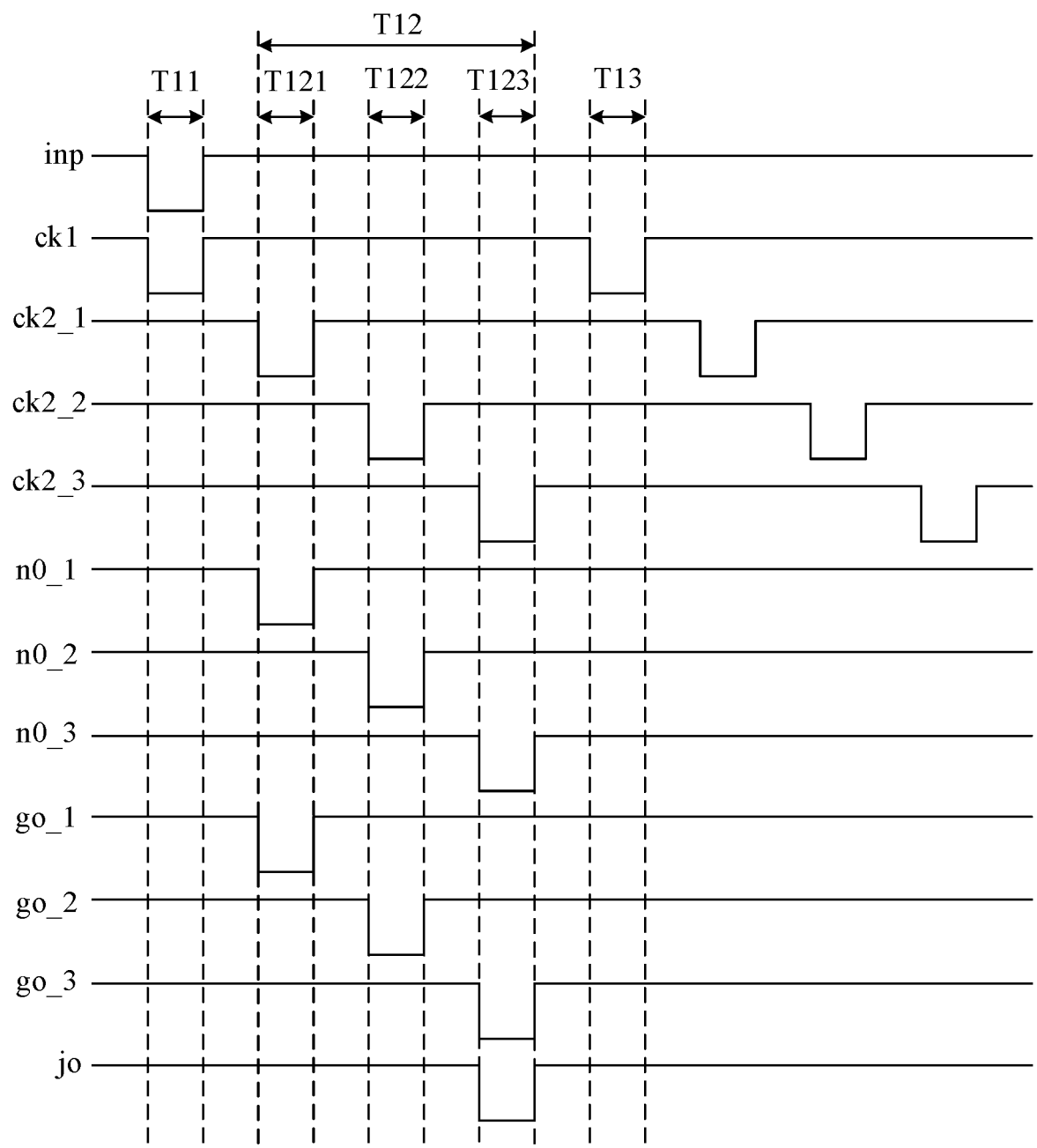
FIG. 5A is a diagram of some signal timings of a shift register unit at a first drive mode provided by an embodiment of the present disclosure.

In some examples, a working process of the above shift register unit provided by the embodiment of the present disclosure at the first drive mode is described below by taking a structure of the shift register unit shown in FIG. 3 as an example, and with reference to a signal timing diagram shown in FIG. 5A. Exemplarily, the first input phase T11, the first output phase T12 and the first reset phase T13 in the signal timing diagram shown in FIG. 5A are mainly selected. The first output phase T12 may include three phases of T121, T122 and T123.

Moreover, inp represents the signal of the input signal end INP, ck1 represents the signal of the first clock signal end CK1, ck2_1 represents a signal of a $1^{st}$ second clock signal end CK2_1, ck2_2 represents a signal of a $2^{nd}$ second clock signal end CK2_2, ck2_3 represents a signal of a $3^{rd}$ second clock signal end CK2_3, n0_1 represents a signal of a $1^{st}$ drive node N0_1, n0_2 represents a signal of a $2^{nd}$ drive node N0_2, n0_3 represents a signal of a $3^{rd}$ drive node N0_3, go_1 represents a signal of a $1^{st}$ drive output end GO_1, go_2 represents a signal of a $2^{nd}$ drive output end GO_2, go_3 represents a signal of a $3^{rd}$ drive output end GO_3, and jo represents the signal of the cascade output end JO. Signals from a $1^{st}$ drive selection signal end GX_1 to a $3^{rd}$ drive selection signal end GX_3 are all low-level signals. A signal of a $3^{rd}$ cascade selection signal end JX_3 is a low-level signal, and signals of both a $1^{st}$ cascade selection signal end JX_1 and a $2^{nd}$ cascade selection signal end JX_2 are high-level signals.

At the first input phase T11, the signal ck1 is a low-level signal, and thus a sixth transistor M6, a seventh transistor M7, a $2^{nd}$ fifth transistor M5_2 and a $3^{rd}$ fifth transistor M5_3 may all be controlled to be turned on. The turned-on sixth transistor M6 provides the low-level signal of the signal inp to the first node N1, so that the signal of the first node N1 is a low-level signal. An eighth transistor M8 may be turned on under control of the low-level signal of the first node N1 so as to provide the low-level signal of the signal ck1 to the second node N2, so that the signal of the second node N2 is a low-level signal. The turned-on seventh transistor M7 provides the low-level signal of the second reference signal end VREF2 to the second node N2, to further make the signal of the second node N2 be the low-level signal so as to control a $1^{st}$ fourth transistor M4_1, a $2^{nd}$ fourth transistor M4_2, and a $3^{rd}$ fourth transistor M4_3 to be all turned on. The turned-on $1^{st}$ fourth transistor M4_1 provides a high-level signal of a first reference signal end VREF1 to the $1^{st}$ drive node N0_1, so that the signal of the $1^{st}$ drive node N0_1 is a high-level signal. The turned-on $2^{nd}$ fourth transistor M4_2 provides the high-level signal of the first reference signal end VREF1 to the $2^{nd}$ drive node N0_2, so that the signal of the $2^{nd}$ drive node N0_2 is a high-level signal. The turned-on $3^{rd}$ fourth transistor M4_3 provides the high-level signal of the first reference signal end VREF1 to the $3^{rd}$ drive node N0_3, so that the signal of the $3^{rd}$ drive node N0_3 is a high-level signal. Because a signal of a second reference signal end VREF2 is a low-level signal, a $1^{st}$ fifth transistor M5_1 may be controlled to be turned on. Therefore, a $1^{st}$ third transistor M3_1 is turned on to provide a high-level signal of the signal ck2_1 to the $1^{st}$ drive node N0_1, so as to further make the signal of the $1^{st}$ drive node N0_1 be the high-level signal. Because the signal of the first node N1 is the low-level signal and the $2^{nd}$ fifth transistor M5_2 is turned on, a $2^{nd}$ third transistor M3_2 is turned on to provide a high-level signal of the signal ck2_2 to the $2^{nd}$ drive node N0_2, so as to further make the signal of the $2^{nd}$ drive node N0_2 be the high-level signal. Because the signal of the first node N1 is the low-level signal and the $3^{rd}$ fifth transistor M5_3 is turned on, a $3^{rd}$ third transistor M3_3 is turned on to provide a high-level signal of the signal ck2_3 to the $3^{rd}$ drive node N0_3, so as to further make the signal of the $3^{rd}$ drive node N0_3 be the high-level signal. Because the signal of the $1^{st}$ drive selection signal end GX_1 is a low level, a $1^{st}$ second transistor M2_1 is turned on to provide the high-level signal of the $1^{st}$ drive node N0_1 to the $1^{st}$ drive output end GO_1, so that the $1^{st}$ drive output end GO_1 outputs the high-level signal. Because the signal of the $2^{nd}$ drive selection signal end GX_2 is a low level, a $2^{nd}$ second transistor M2_2 is turned on to provide the high-level signal of the $2^{nd}$ drive node N0_2 to the $2^{nd}$ drive output end GO_2, so that the $2^{nd}$ drive output end GO_2 outputs the high-level signal. Because the signal of the $3^{rd}$ drive selection signal end GX_3 is a low level, a $3^{rd}$ second transistor M2_3 is turned on to provide the high-level signal of the $3^{rd}$ drive node N0_3 to the $3^{rd}$ drive output end GO_3, so that the $3^{rd}$ drive output end GO_3 outputs the high-level signal. Because the signal of the $3^{rd}$ cascade selection signal end JX_3 is a low-level signal, and the signals of the $1^{st}$ cascade selection signal end JX_1 and the $2^{nd}$ cascade selection signal end JX_2 are both the high-level signals, a $3^{rd}$ first transistor M1_3 is turned on, and a $1^{st}$ first transistor M1_1 and a $2^{nd}$ first transistor M1_2 are both turned off. The turned-on $3^{rd}$ first transistor M1_3 provides the high-level signal of the $3^{rd}$ drive node N0_3 to the cascade output end JO, so that the cascade output end JO outputs the high-level signal.

At the T121 phase in the first output phase T12, the signal ck1 is a high-level signal, and thus the sixth transistor M6, the seventh transistor M7, the $2^{nd}$ fifth transistor M5_2 and the $3^{rd}$ fifth transistor M5_3 may all be controlled to be turned off. Therefore, the first node N1 is in a floating state. Due to the effect of a $1^{st}$ first capacitor C1_1, the signal of the first node N1 may be kept as the low-level signal. The eighth transistor M8 may be turned on under control of the low-level signal of the first node N1 so as to provide the high-level signal of the signal ck1 to the second node N2, so that the signal of the second node N2 is a high-level signal, and the $1^{st}$ fourth transistor M4_1, the $2^{nd}$ fourth transistor M4_2, and the $3^{rd}$ fourth transistor M4_3 are all controlled to be turned off. Because the signal of the second reference signal end VREF2 is the low-level signal, the $1^{st}$ fifth transistor M5_1 may be controlled to be turned on. Therefore, the $1^{st}$ third transistor M3_1 is turned on to provide a low-level signal of the signal ck2_1 to the $1^{st}$ drive node N0_1, so as to make the signal of the $1^{st}$ drive node N0_1 be the low-level signal. Due to a bootstrap effect of the $1^{st}$ first capacitor C1_1, the level of the first node N1 may further be reduced, so that the $1^{st}$ third transistor M3_1 is completely turned on to as far as possible, and the low-level signal of the signal ck2_1 may be provided to the $1^{st}$ drive node N0_1 without voltage loss as much as possible, so as to make the signal of the $1^{st}$ drive node N0_1 be the low-level signal. Because the signal of the first node N1 is the low-level signal and the $2^{nd}$ fifth transistor M5_2 is turned on, the $2^{nd}$ third transistor M3_2 is turned on to provide the high-level signal of the signal ck2_2 to the $2^{nd}$ drive node N0_2, so as to make the signal of the $2^{nd}$ drive node N0_2 be the high-level signal. Because the signal of the first node N1 is the low-level signal and the $3^{rd}$ fifth transistor M5_3 is turned on, the $3^{rd}$ third transistor M3_3 is turned on to provide the high-level signal of the signal ck2_3 to the $3^{rd}$ drive node N0_3, so as to make the signal of the $3^{rd}$ drive node N0_3 be the high-level signal. Because the signal of the $1^{st}$ drive selection signal end GX_1 is the low level, the $1^{st}$ second transistor M2_1 is turned on to provide the low-level signal of the $1^{st}$ drive node N0_1 to the $1^{st}$ drive output end GO_1, so that the $1^{st}$ drive output end GO_1 outputs the low-level signal. Because the signal of the $2^{nd}$ drive selection signal end GX_2 is the low level, the $2^{nd}$ second transistor M2_2 is turned on to provide the high-level signal of the $2^{nd}$ drive node N0_2 to the $2^{nd}$ drive output end GO_2, so that the $2^{nd}$ drive output end GO_2 outputs the high-level signal.

Because the signal of the $3^{rd}$ drive selection signal end GX_3 is the low level, the $3^{rd}$ second transistor M2_3 is turned on to provide the high-level signal of the $3^{rd}$ drive node N0_3 to the $3^{rd}$ drive output end GO_3, so that the $3^{rd}$ drive output end GO_3 outputs the high-level signal. Because the signal of the $3^{rd}$ cascade selection signal end JX_3 is the low-level signal, and the signals of the $1^{st}$ cascade selection signal end JX_1 and the $2^{nd}$ cascade selection signal end JX_2 are both the high-level signals, the $3^{rd}$ first transistor M1_3 is turned on, and the $1^{st}$ first transistor M1_1 and the $2^{nd}$ first transistor M1_2 are both turned off. The turned-on $3^{rd}$ first transistor M1_3 provides the high-level signal of the $3^{rd}$ drive node N0_3 to the cascade output end JO, so that the cascade output end JO outputs the high-level signal.

At the T122 phase in the first output phase T12, the signal ck1 is the high-level signal, and thus the sixth transistor M6, the seventh transistor M7, the $2^{nd}$ fifth transistor M5_2 and the $3^{rd}$ fifth transistor M5_3 may all be controlled to be turned off. Therefore, the first node N1 is in the floating state. Due to the effect of the $1^{st}$ first capacitor C1_1, the signal of the first node N1 may be kept as the low-level signal. The eighth transistor M8 may be turned on under control of the low-level signal of the first node N1 so as to provide the high-level signal of the signal ck1 to the second node N2, so that the signal of the second node N2 is a high-level signal, and the $1^{st}$ fourth transistor M4_1, the $2^{nd}$ fourth transistor M4_2, and the $3^{rd}$ fourth transistor M4_3 are all controlled to be turned off. Because the signal of the second reference signal end VREF2 is the low-level signal, the $1^{st}$ fifth transistor M5_1 may be controlled to be turned on. Therefore, the $1^{st}$ third transistor M3_1 is turned on to provide the high-level signal of the signal ck2_1 to the $1^{st}$ drive node N0_1, so as to further make the signal of the $1^{st}$ drive node N0_1 be the high-level signal. Because the $2^{nd}$ fifth transistor M5_2 is turned off and due to the effect of a $2^{nd}$ first capacitor C1_2, a signal of a control electrode of the $2^{nd}$ third transistor M3_2 may be kept as a low-level signal, so that the $2^{nd}$ third transistor M3_2 is turned on to provide the low-level signal of the signal ck2_2 to the $2^{nd}$ drive node N0_2, so as to make the signal of the $2^{nd}$ drive node N0_2 be the low-level signal. Due to a bootstrap effect of the $2^{nd}$ first capacitor C1_2, a level of the control electrode of the $2^{nd}$ third transistor M3_2 may further be reduced, so that the $2^{nd}$ third transistor M3_2 is completely turned on as far as possible, and the low-level signal of the signal ck2_2 may be provided to the $2^{nd}$ drive node N0_2 without voltage loss as much as possible, so as to make the signal of the $2^{nd}$ drive node N0_2 be the low-level signal. Due to the effect of a $3^{rd}$ first capacitor C1_3, a level of a control electrode of the $3^{rd}$ third transistor M3_3 may be kept as the low level, thus the $3^{rd}$ third transistor M3_3 is turned on to provide the high-level signal of the signal ck2_3 to the $3^{rd}$ drive node N0_3, so as to make the signal of the $3^{rd}$ drive node N0_3 be the high-level signal. Because the signal of the $1^{st}$ drive selection signal end GX_1 is the low level, the $1^{st}$ second transistor M2_1 is turned on to provide the high-level signal of the $1^{st}$ drive node N0_1 to the $1^{st}$ drive output end GO_1, so that the $1^{st}$ drive output end GO_1 outputs the high-level signal. Because the signal of the $2^{nd}$ drive selection signal end GX_2 is the low level, the $2^{nd}$ second transistor M2_2 is turned on to provide the low-level signal of the $2^{nd}$ drive node N0_2 to the $2^{nd}$ drive output end GO_2, so that the $2^{nd}$ drive output end GO_2 outputs the low-level signal. Because the signal of the $3^{rd}$ drive selection signal end GX_3 is the low level, the $3^{rd}$ second transistor M2_3 is turned on to provide the high-level signal of the $3^{rd}$ drive node N0_3 to the $3^{rd}$ drive output end GO_3, so that the $3^{rd}$ drive output end GO_3 outputs the high-level signal. Because the signal of the $3^{rd}$ cascade selection signal end JX_3 is the low-level signal, and the signals of the $1^{st}$ cascade selection signal end JX_1 and the $2^{nd}$ cascade selection signal end JX_2 are both the high-level signals, the $3^{rd}$ first transistor M1_3 is turned on, and the $1^{st}$ first transistor M1_1 and the $2^{nd}$ first transistor M1_2 are both turned off. The turned-on $3^{rd}$ first transistor M1_3 provides the high-level signal of the $3^{rd}$ drive node N0_3 to the cascade output end JO, so that the cascade output end JO outputs the high-level signal.

At the T123 phase in the first output phase T12, the signal ck1 is the high-level signal, and thus the sixth transistor M6, the seventh transistor M7, the $2^{nd}$ fifth transistor M5_2 and the $3^{rd}$ fifth transistor M5_3 may all be controlled to be turned off. Therefore, the first node N1 is in the floating state. Due to the effect of the $1^{st}$ first capacitor C1_1, the signal of the first node N1 may be kept as the low-level signal. The eighth transistor M8 may be turned on under control of the low-level signal of the first node N1 so as to provide the high-level signal of the signal ck1 to the second node N2, so that the signal of the second node N2 is a high-level signal, and the $1^{st}$ fourth transistor M4_1, the $2^{nd}$ fourth transistor M4_2, and the $3^{rd}$ fourth transistor M4_3 are all controlled to be turned off. Because the signal of the second reference signal end VREF2 is the low-level signal, the $1^{st}$ fifth transistor M5_1 may be controlled to be turned on. Therefore, the $1^{st}$ third transistor M3_1 is turned on to provide the high-level signal of the signal ck2_1 to the $1^{st}$ drive node N0_1, so as to further make the signal of the $1^{st}$ drive node N0_1 be the high-level signal. Because the $2^{nd}$ fifth transistor M5_2 is turned off and due to the effect of a $2^{nd}$ first capacitor C1_2, a signal of a control electrode of the $2^{nd}$ third transistor M3_2 may be kept as a low-level signal, so that the $2^{nd}$ third transistor M3_2 is turned on to provide the high-level signal of the signal ck2_2 to the $2^{nd}$ drive node N0_2, so as to make the signal of the $2^{nd}$ drive node N0_2 be the high-level signal. Due to the effect of the $3^{st}$ first capacitor C1_3, the level of the control electrode of the $3^{rd}$ third transistor M3_3 may be kept as the low level, thus the $3^{rd}$ third transistor M3_3 is turned on to provide the low-level signal of the signal ck2_3 to the $3^{rd}$ drive node N0_3, so as to make the signal of the $3^{rd}$ drive node N0_3 be the low-level signal. Due to a bootstrap effect of the $3^{rd}$ first capacitor C1_3, the level of the control electrode of the $3^{rd}$ third transistor M3_3 may further be reduced, so that the $3^{rd}$ third transistor M3_3 is completely turned on as far as possible, and the low-level signal of the signal ck2_3 may be provided to the $3^{rd}$ drive node N0_3 without voltage loss as much as possible, so as to make the signal of the $3^{rd}$ drive node N0_3 be the low-level signal. Because the signal of the $1^{st}$ drive selection signal end GX_1 is the low level, the $1^{st}$ second transistor M2_1 is turned on to provide the high-level signal of the $1^{st}$ drive node N0_1 to the $1^{st}$ drive output end GO_1, so that the $1^{st}$ drive output end GO_1 outputs the high-level signal. Because the signal of the $2^{nd}$ drive selection signal end GX_2 is the low level, the $2^{nd}$ second transistor M2_2 is turned on to provide the high-level signal of the $2^{nd}$ drive node N0_2 to the $2^{nd}$ drive output end GO_2, so that the $2^{nd}$ drive output end GO_2 outputs the high-level signal. Because the signal of the $3^{rd}$ drive selection signal end GX_3 is the low level, the $3^{rd}$ second transistor M2_3 is turned on to provide the low-level signal of the $3^{rd}$ drive node N0_3 to the $3^{rd}$ drive output end GO_3, so that the $3^{rd}$ drive output end GO_3 outputs the low-level signal. Because the signal of the $3^{rd}$ cascade selection signal end JX_3 is the low-level signal, and the signals of the $1^{st}$ cascade selection signal end JX_1 and the $2^{nd}$ cascade selection signal end JX_2 are both the high-level signals, the $3^{rd}$ first transistor M1_3 is turned on, and the $1^{st}$ first transistor M1_1 and the $2^{nd}$ first transistor M1_2 are both turned off. The turned-on $3^{rd}$ first transistor M1_3 provides the low-level signal of the $3^{rd}$ drive node N0_3 to the cascade output end JO, so that the cascade output end JO outputs the low-level signal.

At the first reset phase T13, the signal ck1 is the low-level signal, and thus the sixth transistor M6, the seventh transistor M7, the $2^{nd}$ fifth transistor M5_2 and the $3^{rd}$ fifth transistor M5_3 may all be controlled to be turned on. The turned-on sixth transistor M6 provides the high-level signal of the signal inp to the first node N1, so that the signal of the first node N1 is the high-level signal. The eighth transistor M8 may be turned off under the control of the high-level signal of the first node N1. The turned-on seventh transistor M7 provides the low-level signal of the second reference signal end VREF2 to the second node N2, to make the signal of the second node N2 be the low-level signal so as to control the $1^{st}$ fourth transistor M4_1, the $2^{nd}$ fourth transistor M4_2, and the $3^{rd}$ fourth transistor M4_3 to be all turned on. The turned-on $1^{st}$ fourth transistor M4_1 provides the high-level signal of the first reference signal end VREF1 to the $1^{st}$ drive node N0_1, so that the signal of the $1^{st}$ drive node N0_1 is the high-level signal. The turned-on $2^{nd}$ fourth transistor M4_2 provides the high-level signal of the first reference signal end VREF1 to the $2^{nd}$ drive node N0_2, so that the signal of the $2^{nd}$ drive node N0_2 is the high-level signal. The turned-on $3^{rd}$ fourth transistor M4_3 provides the high-level signal of the first reference signal end VREF1 to the $3^{rd}$ drive node N0_3, so that the signal of the $3^{rd}$ drive node N0_3 is the high-level signal. Because the signal of the second reference signal end VREF2 is the low-level signal, the $1^{st}$ fifth transistor M5_1 may be controlled to be turned on. Therefore, the $1^{st}$ third transistor M3_1 may be turned off under the control of the high-level signal of the first node N1. Because the signal of the first node N1 is the high-level signal and the $2^{nd}$ fifth transistor M5_2 is turned on, the $2^{nd}$ third transistor M3_2 is turned off. Because the signal of the first node N1 is the high-level signal and the $3^{rd}$ fifth transistor M5_3 is turned on, the $3^{rd}$ third transistor M3_3 is turned off. Because the signal of the $1^{st}$ drive selection signal end GX_1 is the low level, the $1^{st}$ second transistor M2_1 is turned on to provide the high-level signal of the $1^{st}$ drive node N0_1 to the $1^{st}$ drive output end GO_1, so that the $1^{st}$ drive output end GO_1 outputs the high-level signal. Because the signal of the $2^{nd}$ drive selection signal end GX_2 is the low level, the $2^{nd}$ second transistor M2_2 is turned on to provide the high-level signal of the $2^{nd}$ drive node N0_2 to the $2^{nd}$ drive output end GO_2, so that the $2^{nd}$ drive output end GO_2 outputs the high-level signal. Because the signal of the $3^{rd}$ drive selection signal end GX_3 is the low level, the $3^{rd}$ second transistor M2_3 is turned on to provide the high-level signal of the $3^{rd}$ drive node N0_3 to the $3^{rd}$ drive output end GO_3, so that the $3^{rd}$ drive output end GO_3 outputs the high-level signal. Because the signal of the $3^{rd}$ cascade selection signal end JX_3 is the low-level signal, and the signals of the $1^{st}$ cascade selection signal end JX_1 and the $2^{nd}$ cascade selection signal end JX_2 are both the high-level signals, the $3^{rd}$ first transistor M1_3 is turned on, and the $1^{st}$ first transistor M1_1 and the $2^{nd}$ first transistor M1_2 are both turned off. The turned-on $3^{rd}$ first transistor M1_3 provides the high-level signal of the $3^{rd}$ drive node N0_3 to the cascade output end JO, so that the cascade output end JO outputs the high-level signal.

It should be noted that signals output from the $1^{st}$ drive output end GO_1 to the $3^{rd}$ drive output end GO_3 are gate scanning signals. In FIG. 5A, there is a holding phase between every two adjacent phases. That is, when the signals inp, ck1, ck2_1, ck2_2, ck2_3 are all high levels, the shift register unit may enter into the next phase after the signals are stable. In this way, there is an interval duration between low levels of the gate scanning signals input into the two adjacent gate lines. Exemplarily, the interval duration may be 1H. H represents a duration of the low level of the gate scanning signal loaded by one gate.

It should be noted that due to presence of the $1^{st}$ first capacitor C1_1, the $2^{nd}$ first capacitor C1_2 and the $3^{rd}$ first capacitor C1_3, if the $2^{nd}$ fifth transistor M5_2 and the $3^{rd}$ fifth transistor M5_3 are not arranged but this position is replaced with a conventional wire, when the signal of the $1^{st}$ drive output end GO_1 changes, there will be a spike voltage between the signals output by the $2^{nd}$ drive output end GO_2 and the $3^{rd}$ drive output end GO_3 due to a coupling effect among the $1^{st}$ first capacitor C1_1, the $2^{nd}$ first capacitor $C_{1\_2}$ and the $3^{rd}$ first capacitor C1_3. Similarly, when the signal of the $2^{nd}$ drive output end GO_2 changes, there will be a spike voltage between the signals output by the $1^{st}$ drive output end GO_1 and the $3^{rd}$ drive output end GO_3 due to the coupling effect among the $1^{st}$ first capacitor C1_1, the $2^{nd}$ first capacitor $C_{1\_2}$ and the $3^{rd}$ first capacitor C1_3. When the signal of the $3^{rd}$ drive output end GO_3 changes, there will be a spike voltage between the signals output by the $2^{nd}$ drive output end GO_2 and the $1^{st}$ drive output end GO_1 due to a coupling effect among the $1^{st}$ first capacitor C1_1, the $2^{nd}$ first capacitor C1_2 and the $3^{rd}$ first capacitor C1_3. Based on this, the embodiment of the present disclosure arranges the $2^{nd}$ fifth transistor M5_2 and the $3^{rd}$ fifth transistor M5_3, thus by arranging the $2^{nd}$ fifth transistor M5_2 and the $3^{rd}$ fifth transistor M5_3, the control electrode of the $2^{nd}$ third transistor M3_2 and the control electrode of the $3^{rd}$ third transistor M3_3 may be separated from other signals, so as to avoid mutual influence of the signals and improve the stability of output.

Figure 5B:
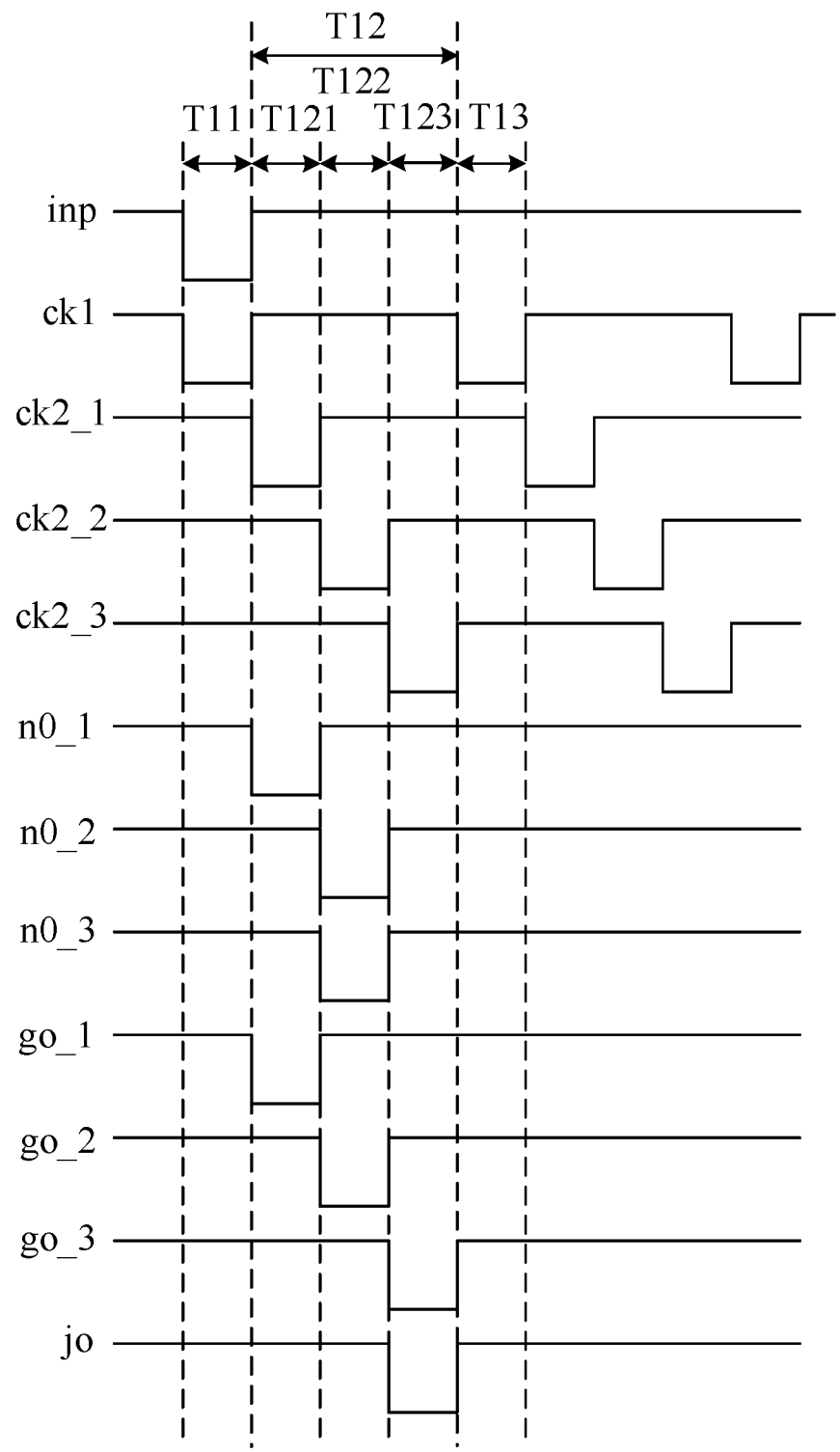
FIG. 5B is a diagram of some other signal timings of a shift register unit at a first drive mode provided by an embodiment of the present disclosure.

In some other examples, some other working processes of the above shift register unit provided by the embodiment of the present disclosure at the first drive mode are described below by taking the structure of the shift register unit shown in FIG. 3 as an example, and with reference to a signal timing diagram shown in FIG. 5B. Exemplarily, the first input phase T11, the first output phase T12 and the first reset phase T13 in the signal timing diagram shown in FIG. 5B are mainly selected. The first output phase T12 may include three phases of T121, T122 and T123. The first input phase T11, T121, T122 and T123 and the first reset phase T13 when the shift register unit shown in FIG. 3 works with reference to the signal timing diagram shown in FIG. 5B are basically the same as the first input phase T11, T121, T122 and T123 and the first reset phase T13 when the shift register unit shown in FIG. 3 works with reference to the signal timing diagram shown in FIG. 5A in the working process, which will not be repeated here.

It should be noted that signals output from the $1^{st}$ drive output end GO_1 to the $3^{rd}$ drive output end GO_3 are the gate scanning signals. In FIG. 5B, the above holding phase is not set between every two adjacent phases, so that there is no above interval duration between the low levels of the gate scanning signals input into the two adjacent gate lines. In this way, a refresh time when the shift register unit scans the gate lines row by row with reference to the signal timing diagram shown in FIG. 5B may be less than the scan time when the shift register unit scans the gate lines row by row with reference to the signal timing diagram shown in FIG.

5A, so that the scan time of one display frame can be reduced and then refresh frequency can be improved.

It should be noted that when the shift register unit shown in FIG. 3 works with reference to the diagrams of signal timings shown in FIG. 5A and FIG. 5B, the gate scanning signal may be output for each gate line to scan these gate lines row by row. Moreover, clock cycles of the signals ck2_1-ck2_3 shown in FIG. 5A are 8H, and clock cycles of the signals ck2_1-ck2_3 shown in FIG. 5B are 4H.

A driving method for the above shift register unit provided by the embodiment of the present disclosure, as shown in FIG. 6, may include: at a second drive mode, one display frame may include a second input phase T21, a second output phase T22 and a second reset phase T23.

S210, at the second input phase 121, a first control circuit controls signals of a first node and a second node according to signals of an input signal end and a first clock signal end; second control circuits control signals of at least two drive nodes according to the signals of the first node, the second node and second clock signal ends; cascade output circuits provide a signal of an $m^{th}$ drive node of the at least two drive nodes to a cascade output end according to cascade selection signal ends; and drive output circuits provide the signal of the $m^{th}$ drive node of the at least two drive nodes to a corresponding drive output end according to drive selection signal ends.

S220, at the second output phase T22, the second control circuits control the signals of the at least two drive nodes according to the signals of the first node and the second clock signal end; the cascade output circuits provide the signal of the $m^{th}$ drive node of the at least two drive nodes to the cascade output end according to the cascade selection signal ends; and the drive output circuits provide the signal of the $m^{th}$ drive node of the at least two drive nodes to the corresponding drive output end according to the drive selection signal ends.

S230, at the second reset phase T23, the first control circuit controls the signals of the first node and the second node according to the signal of the first clock signal end; the second control circuits control the signals of the at least two drive nodes according to the signal of the second node; the cascade output circuits provide the signal of the $m^{th}$ drive node of the at least two drive nodes to the cascade output end according to the cascade selection signal ends; and the drive output circuits provide the signal of the $m^{th}$ drive node of the at least two drive nodes to the corresponding drive output end according to the drive selection signal ends.

In some embodiments of the present disclosure, taking an active level as a low level as an example, at the second drive mode, a signal of the cascade selection signal end corresponding to the $m^{th}$ drive node may be a low-level signal, and signals of remaining cascade selection signal ends may be high-level signals. A signal of the drive selection signal end corresponding to the $m^{th}$ drive node is a low-level signal, and signals of remaining drive selection signal ends are high-level signals.

In some embodiments of the present disclosure, at the second drive mode, a $1^{st}$ drive output end GO_1 of each stage of shift register unit may be controlled to output a gate scanning signal to a coupled gate line to realize interlaced scanning.

Figure 7A:
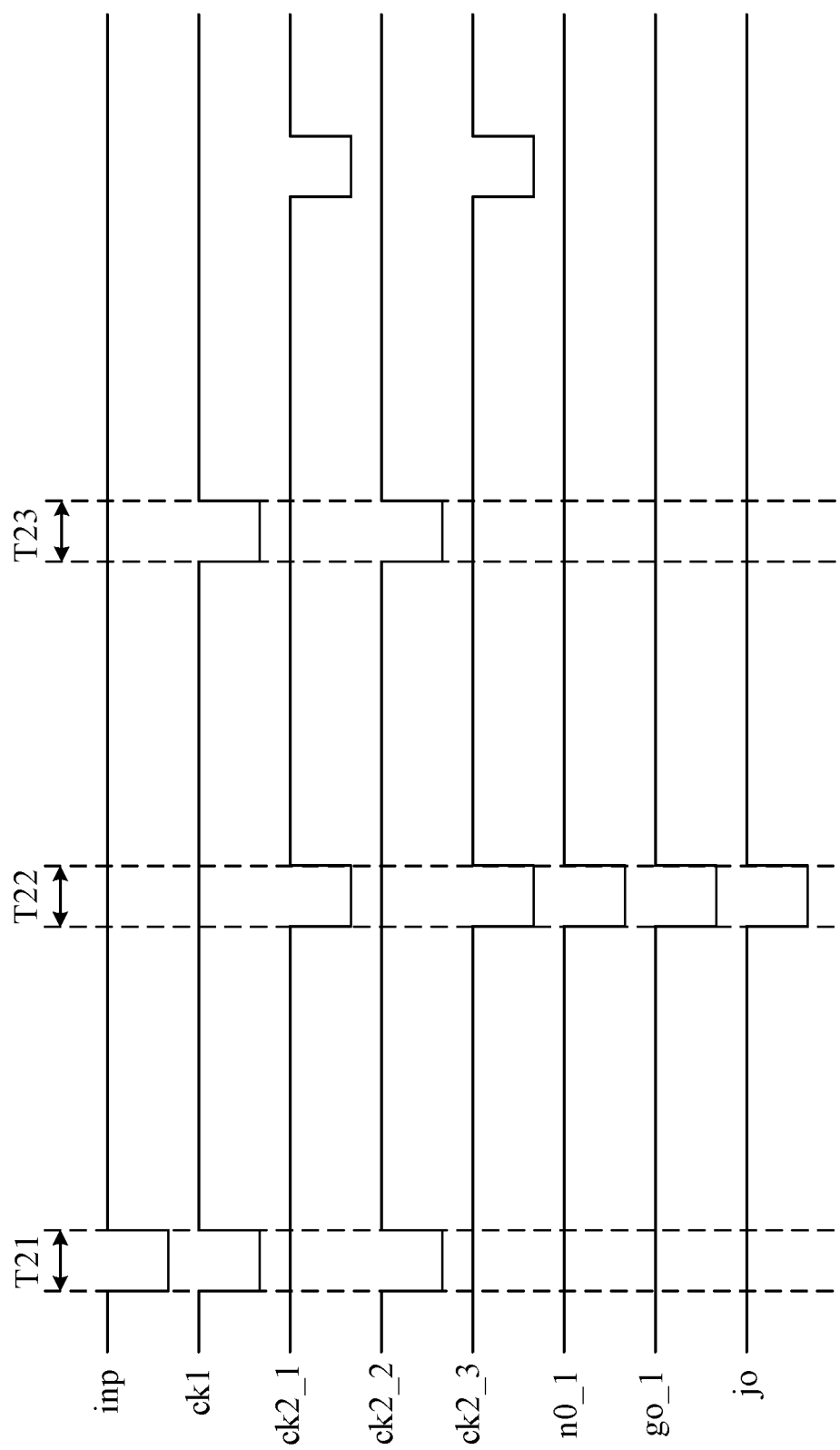
FIG. 7A is a diagram of some signal timings of a shift register unit at a second drive mode provided by an embodiment of the present disclosure.

In some examples, a working process of the above shift register unit provided by the embodiment of the present disclosure at the second drive mode is described below by taking a structure of the shift register unit shown in FIG. 3 as an example, and with reference to a signal timing diagram shown in FIG. 7A. Exemplarily, the second input phase T21, the second output phase T22 and the second reset phase T23 in the signal timing diagram shown in FIG. 7A are mainly selected.

Moreover, inp represents the signal of the input signal end INP, ck1 represents the signal of the first clock signal end CK1, ck2_1 represents a signal of a $1^{st}$ second clock signal end CK2_1, ck2_2 represents a signal of a $2^{nd}$ second clock signal end CK2_2, ck2_3 represents a signal of a $3^{rd}$ second clock signal end CK2_3, n0_1 represents a signal of a $1^{st}$ drive node N0_1, go_1 represents a signal of a $1^{st}$ drive output end GO_1, and jo represents the signal of the cascade output end JO. A signal of a $1^{st}$ drive selection signal end GX_1 is a low-level signal, and signals of both a $2^{nd}$ drive selection signal end GX_2 and a $3^{rd}$ drive selection signal end GX_3 are high-level signals. A signal of a $1^{st}$ cascade selection signal end JX_1 is a low-level signal, and signals of both a $2^{nd}$ cascade selection signal end JX_2 and a $3^{rd}$ cascade selection signal end JX_3 are high-level signals. Because the signals of both the $2^{nd}$ drive selection signal end GX_2 and the $3^{rd}$ drive selection signal end GX_3 are high-level signals, in the present embodiment, both a $2^{nd}$ second transistor M2_2 and a $3^{rd}$ second transistor M2_3 are turned off. Because the signals of both the $2^{nd}$ cascade selection signal end JX_2 and the $3^{rd}$ cascade selection signal end JX_3 are high-level signals, in the present embodiment, both a $2^{nd}$ first transistor M1_2 and a $3^{rd}$ first transistor M1_3 are turned off. Therefore, in the present embodiment, only the signal of the $1^{st}$ drive node N0_1 may be output to the cascade output end JO and the $1^{st}$ drive output end GO_1, while signals of both a $2^{nd}$ drive node N0_2 and a $3^{rd}$ drive node N0_3 are not output. Therefore, a change process of the signals of the $2^{nd}$ drive node N0_2 and the $3^{rd}$ drive node N0_3 has no effect on the present embodiment. Therefore, the change of the signal of the $1^{st}$ drive node N0_1 is illustrated below, and the change of the signals of both the $2^{nd}$ drive node N0_2 and a $3^{rd}$ drive node N0_3 is no longer illustrated.

At the second input phase T21, the signal ck1 is a low-level signal, and thus a sixth transistor M6, a seventh transistor M7, a $2^{nd}$ fifth transistor M5_2 and a $3^{rd}$ fifth transistor M5_3 may all be controlled to be turned on. The turned-on sixth transistor M6 provides the low-level signal of the signal inp to the first node N1, so that the signal of the first node N1 is a low-level signal. An eighth transistor M8 may be turned on under control of the low-level signal of the first node N1 so as to provide the low-level signal of the signal ck1 to the second node N2, so that the signal of the second node N2 is a low-level signal. The turned-on seventh transistor M7 provides the low-level signal of the second reference signal end VREF2 to the second node N2, to further make the signal of the second node N2 be the low-level signal so as to control a $1^{st}$ fourth transistor M4_1, a $2^{nd}$ fourth transistor M4_2, and a $3^{rd}$ fourth transistor M4_3 to be all turned on. The turned-on $1^{st}$ fourth transistor M4_1 provides the high-level signal of the first reference signal end VREF1 to the $1^{st}$ drive node NO 1, so that the signal of the $1^{st}$ drive node N0_1 is the high-level signal. Because the signal of the second reference signal end VREF2 is the low-level signal, the $1^{st}$ fifth transistor M5_1 may be controlled to be turned on. Therefore, a $1^{st}$ third transistor M3_1 is turned on to provide a high-level signal of the signal ck2_1 to the $1^{st}$ drive node N0_1, so as to further make the signal of the $1^{st}$ drive node N0_1 be the high-level signal. A turned-on $1^{st}$ second transistor M2_1 provides the high-level signal of the $1^{st}$ drive node N0_1 to the $1^{st}$ drive output end GO_1, so that the $1^{st}$ drive output end GO_1 outputs the high-level signal. A turned-on $1^{st}$ first transistor M1_1 provides the high-level signal of the $1^{st}$ drive node N0_1 to the cascade output end JO, so that the cascade output end JO outputs the high-level signal.

In the second output phase 122, the signal ck1 is the high-level signal, and thus the sixth transistor M6, the seventh transistor M7, the $2^{nd}$ fifth transistor M5_2 and the $3^{rd}$ fifth transistor M5_3 may all be controlled to be turned off. Therefore, the first node N1 is in a floating state. Due to the effect of a $1^{st}$ first capacitor C1_1, the signal of the first node N1 may be kept as a low-level signal. The eighth transistor M8 may be turned on under control of the low-level signal of the first node N1 so as to provide the high-level signal of the signal ck1 to the second node N2, so that the signal of the second node N2 is a high-level signal, and the $1^{st}$ fourth transistor M4_1, the $2^{nd}$ fourth transistor M4_2, and the $3^{rd}$ fourth transistor M4_3 are all controlled to be turned off. Because the signal of the second reference signal end VREF2 is the low-level signal, the $1^{st}$ fifth transistor M5_1 may be controlled to be turned on. Therefore, a $1^{st}$ third transistor M3_1 is turned on to provide a low-level signal of the signal ck2_1 to the $1^{st}$ drive node N0_1, so as to make the signal of the $1^{st}$ drive node N0_1 be the low-level signal. Due to a bootstrap effect of the $1^{st}$ first capacitor C1_1, the level of the first node N1 may further be reduced, so that the $1^{st}$ third transistor M3_1 is completely turned on as far as possible, and the low-level signal of the signal ck2_1 may be provided to the $1^{st}$ drive node N0_1 without voltage loss as much as possible, so as to make the signal of the $1^{st}$ drive node N0_1 be the low-level signal. A turned-on $1^{st}$ second transistor M2_1 provides the low-level signal of the $1^{st}$ drive node N0_1 to the $1^{st}$ drive output end GO_1, so that the $1^{st}$ drive output end GO_1 outputs the low-level signal. A turned-on $1^{st}$ first transistor M1_1 provides the low-level signal of the $1^{st}$ drive node N0_1 to the cascade output end JO, so that the cascade output end JO outputs the low-level signal.

At the second reset phase T23, the signal ck1 is the low-level signal, and thus the sixth transistor M6, the seventh transistor M7, the $2^{nd}$ fifth transistor M5_2 and the $3^{rd}$ fifth transistor M5_3 may all be controlled to be turned on. The turned-on sixth transistor M6 provides the high-level signal of the signal inp to the first node N1, so that the signal of the first node N1 is the high-level signal. The eighth transistor M8 may be turned off under the control of the high-level signal of the first node N1. The turned-on seventh transistor M7 provides the low-level signal of the second reference signal end VREF2 to the second node N2, to make the signal of the second node N2 be the low-level signal so as to control the $1^{st}$ fourth transistor M4_1, the $2^{nd}$ fourth transistor M4_2, and the $3^{rd}$ fourth transistor M4_3 to be all turned on. The turned-on $1^{st}$ fourth transistor M4_1 provides the high-level signal of the first reference signal end VREF1 to the $1^{st}$ drive node N0_1, so that the signal of the $1^{st}$ drive node N0_1 is the high-level signal. Because the signal of the second reference signal end VREF2 is the low-level signal, the $1^{st}$ fifth transistor M5_1 may be controlled to be turned on. Therefore, the $1^{st}$ third transistor M3_1 may be turned off under the control of the high-level signal of the first node N1. A turned-on $1^{st}$ second transistor M2_1 provides the high-level signal of the $1^{st}$ drive node N0_1 to the $1^{st}$ drive output end GO_1, so that the $1^{st}$ drive output end GO_1 outputs the high-level signal. The turned-on $1^{st}$ first transistor M1_1 provides the high-level signal of the $1^{st}$ drive node N0_1 to the cascade output end JO, so that the cascade output end JO outputs the high-level signal.

It should be noted that signal output by the $1^{st}$ drive output end GO_1 is the gate scanning signal. In FIG. 7A, there is a holding phase between every two adjacent phases. That is, when the signals inp, ck1, ck2_1, ck2_2, ck2_3 are all high levels, the shift register unit may enter into the next phase after the signals are stable. In this way, there is an interval duration between low levels of the gate scanning signals output by the $1^{st}$ drive output end GO_1 of every two adjacent stages of shift register units. Exemplarily, the interval duration may be 5H.

Figure 7B:
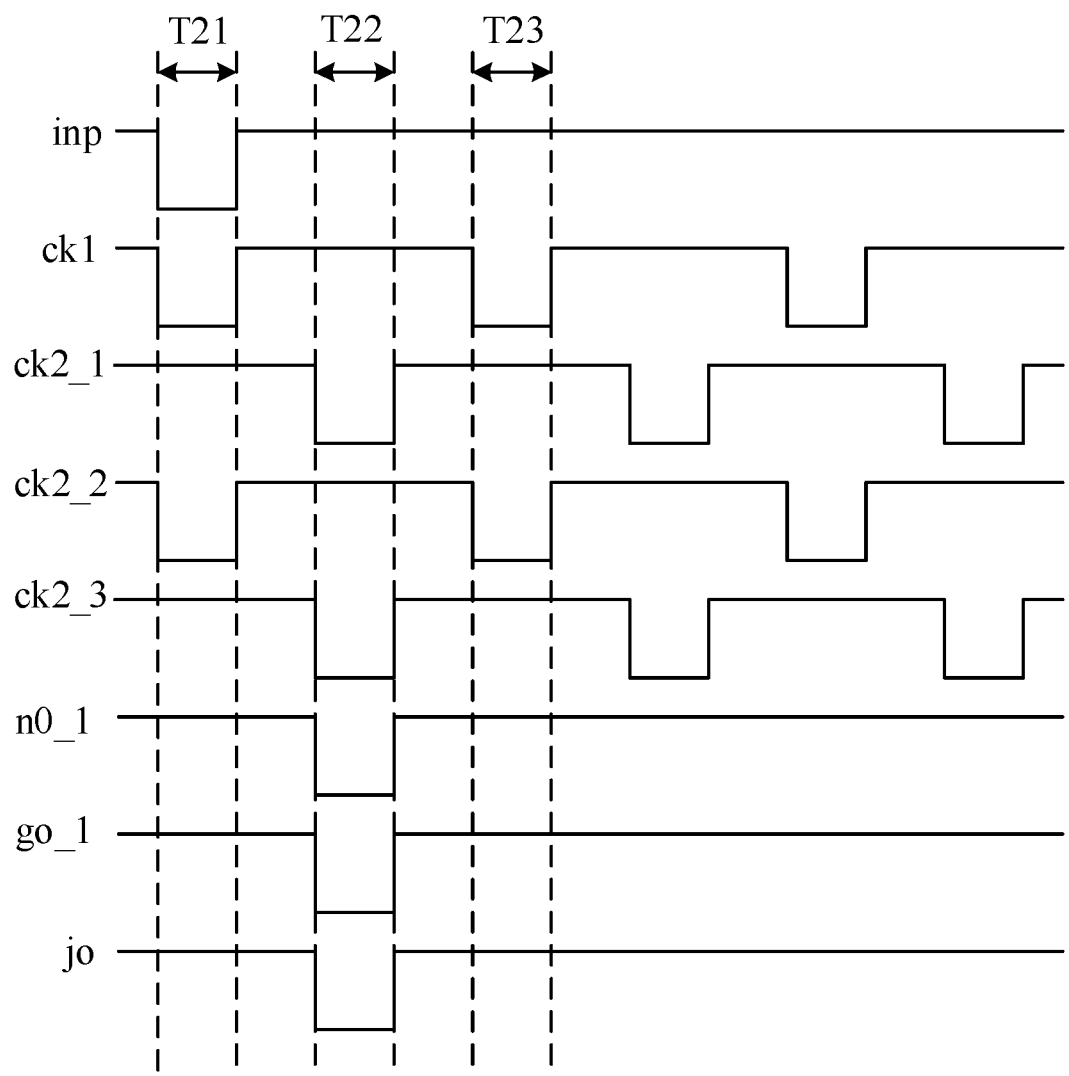
FIG. 7B is a diagram of some other signal timings of a shift register unit at a second drive mode provided by an embodiment of the present disclosure.

In some other examples, some other working processes of the above shift register unit provided by the embodiment of the present disclosure at the second drive mode are described below by taking the structure of the shift register unit shown in FIG. 3 as an example, and with reference to a signal timing diagram shown in FIG. 7B. Exemplarily, the second input phase T21, the second output phase T22 and the second reset phase T23 in the signal timing diagram shown in FIG. 7b are mainly selected. Moreover, the second input phase T21, the second output phase T22 and the second reset phase T23 when the shift register unit shown in FIG. 3 works with reference to the signal timing diagram shown in FIG. 7B are basically the same as the second input phase T21, the second output phase T22 and the second reset phase T23 when the shift register unit shown in FIG. 3 works with reference to the signal timing diagram shown in FIG. 7A in working process, which will not be repeated here.

It should be noted that signal output by the $1^{st}$ drive output end GO_1 is the gate scanning signal. In FIG. 7B, there is a holding phase between every two adjacent phases. That is, when the signals inp, ck1, ck2_1, ck2_2, ck2_3 are all high levels, the shift register unit may enter into the next phase after the signals are stable. In this way, there is the interval duration between low levels of the gate scanning signals output by the $1^{st}$ drive output end GO_1 of every two adjacent stages of shift register units. Exemplarily, the interval duration may be 1H.

In yet some examples, some other working processes of the above shift register unit provided by the embodiment of the present disclosure at the second drive mode are described below by taking the structure of the shift register unit shown in FIG. 3 as an example, and with reference to a signal timing diagram shown in FIG. 7C. Exemplarily, the second input phase T21, the second output phase T22 and the second reset phase T23 in the signal timing diagram shown in FIG. 7B are mainly selected. Moreover, the second input phase T21, the second output phase T22 and the second reset phase T23 when the shift register unit shown in FIG. 3 works with reference to the signal timing diagram shown in FIG. 7B are basically the same as the second input phase T21, the second output phase T22 and the second reset phase T23 when the shift register unit shown in FIG. 3 works with reference to the signal timing diagram shown in FIG. 7A in working process, which will not be repeated here.

It should be noted that signal output by the $1^{st}$ drive output end GO_1 is the gate scanning signal. In FIG. 7C, the above holding phase is not set between every two adjacent phases, so that there is no above interval duration between the low levels of the gate scanning signals output by the $1^{st}$ drive output end GO_1 of every two adjacent stages of shift register units. In this way, a refresh time when the shift register unit scans the gate lines row by row with reference to the signal timing diagram shown in FIG. 7C may be less than the refresh time when the shift register unit scans the gate lines in an interlaced mode with reference to the signal timing diagram shown in FIG. 7B, so that the scan time of one display frame can be reduced and then refresh frequency can be improved.

Figure 7C:
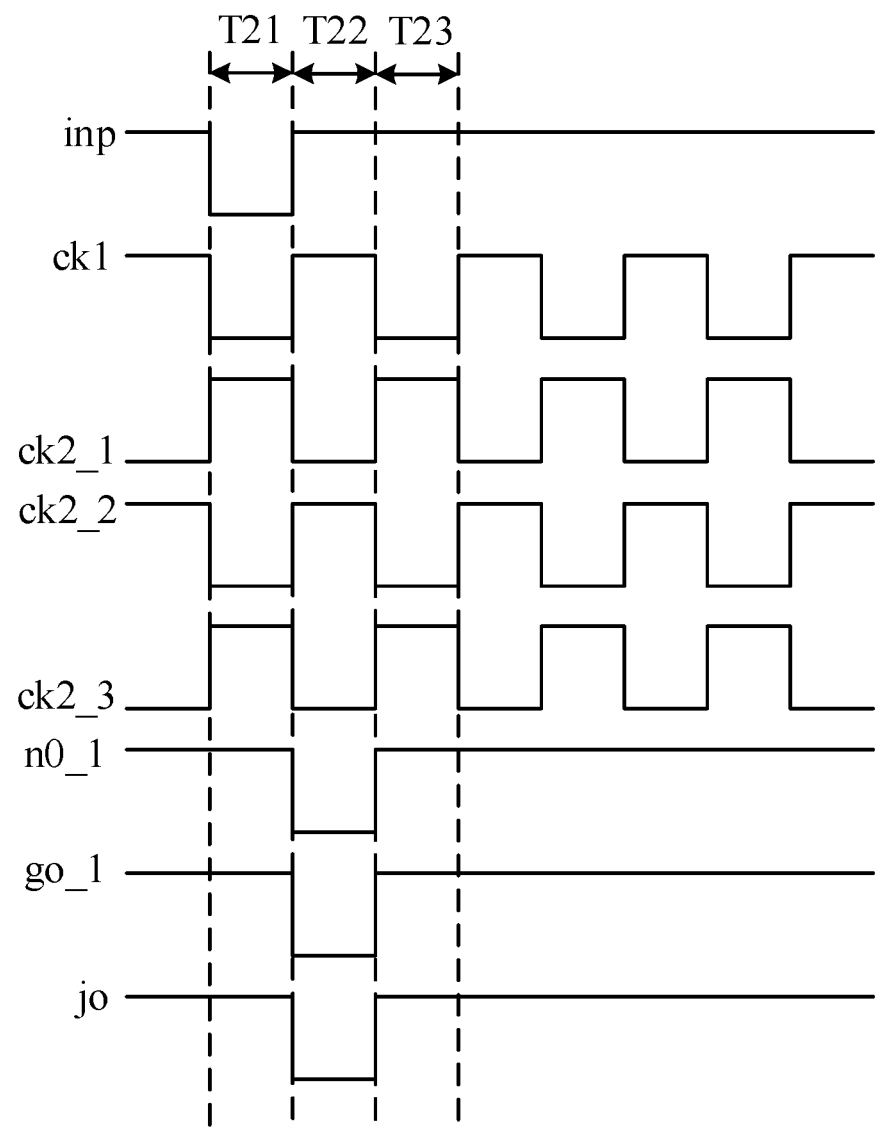
FIG. 7C is yet a diagram of some signal timings of a shift register unit at a second drive mode provided by an embodiment of the present disclosure.

It should be noted that when the shift register unit shown in FIG. 3 works with reference to the signal timing diagram shown in FIG. 7A to FIG. 7C, the gate scanning signal may be output for a gate line coupled with the $1^{st}$ drive output end GO_1 of each stage of shift register unit to only scan these gate lines. Moreover, clock cycles of the signals ck2_1-ck2_3 shown in FIG. 7A are 12H, clock cycles of the signals ck2_1-ck2_3 shown in FIG. 7B are 4H, and clock cycles of the signals ck2_1-ck2_3 shown in FIG. 7C are 2H.

In some other embodiments of the present disclosure, at the second drive mode, a $2^{nd}$ drive output end GO_2 of each stage of shift register unit may be controlled to output the gate scanning signal to the coupled gate line to realize interlaced scanning.

Figure 8:
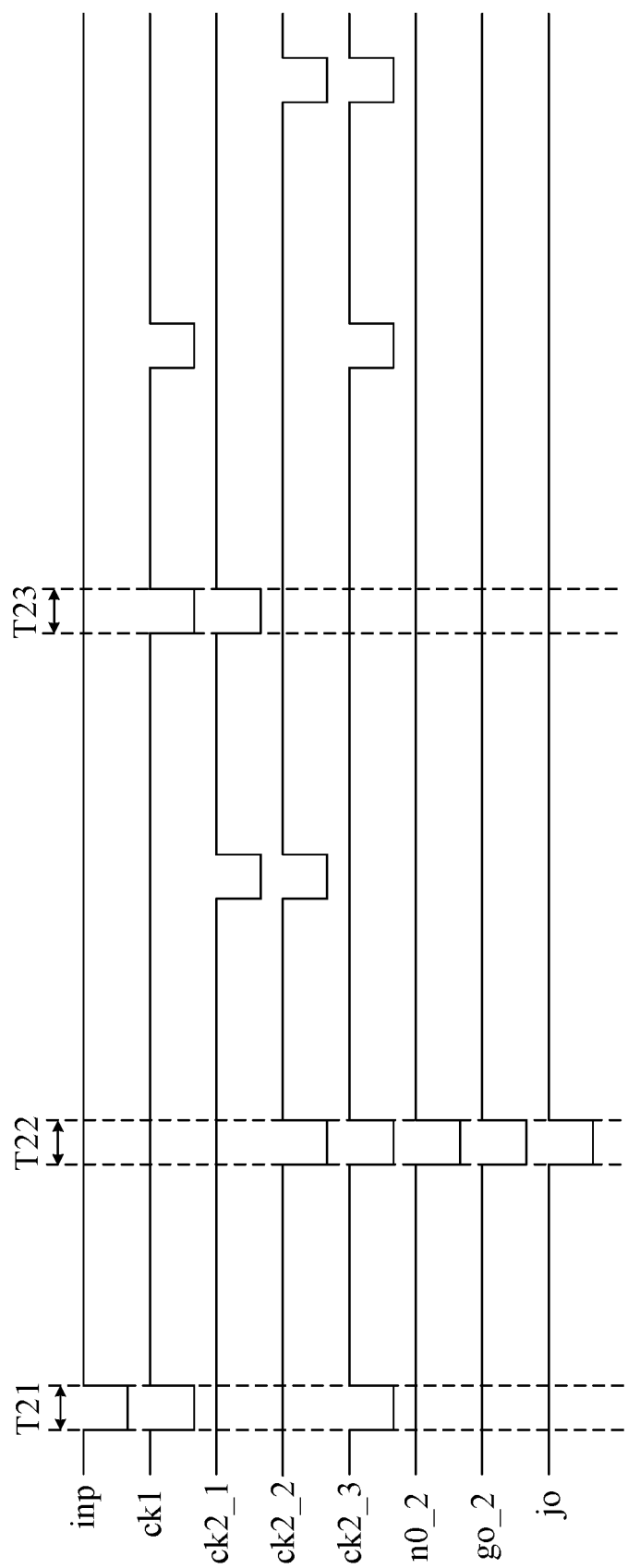
FIG. 8 is a diagram of yet some signal timings of a shift register unit at a second drive mode provided by an embodiment of the present disclosure.

In some examples, a working process of the above shift register unit provided by the embodiment of the present disclosure at the second drive mode is described below by taking a structure of the shift register unit shown in FIG. 3 as an example, and with reference to a signal timing diagram shown in FIG. 8. Exemplarily, the second input phase T21, the second output phase T22 and the second reset phase T23 in the signal timing diagram shown in FIG. 8 are mainly selected.

Moreover, inp represents the signal of the input signal end INP, ck1 represents the signal of the first clock signal end CK1, ck2_1 represents the signal of the $1^{st}$ second clock signal end CK2_1, ck2_2 represents the signal of the $2^{nd}$ second clock signal end CK2_2, ck2_3 represents the signal of the $3^{rd}$ second clock signal end CK2_3, n0_2 represents the signal of the $2^{nd}$ drive node N0_2, go_2 represents the signal of the $2^{nd}$ drive output end GO_2, and jo represents the signal of the cascade output end JO. The signal of the $2^{nd}$ drive selection signal end GX_2 is the low-level signal, and the signals of both the $1^{st}$ drive selection signal end GX_1 and the $3^{rd}$ drive selection signal end GX_3 are the high-level signals. The signal of the $2^{nd}$ cascade selection signal end JX_2 is the low-level signal, and the signals of both the $1^{st}$ cascade selection signal end JX_1 and the $3^{rd}$ cascade selection signal end JX_3 are the high-level signals. Because the signals of both the $1^{st}$ drive selection signal end GX_1 and the $3^{rd}$ drive selection signal end GX_3 are the high-level signals, in the present embodiment, both the $1^{st}$ second transistor M2_1 and the $3^{rd}$ second transistor M2_3 are turned off. Because the signals of both the $1^{st}$ cascade selection signal end JX_1 and the $3^{rd}$ cascade selection signal end JX_3 are the high-level signals, in the present embodiment, both the $1^{st}$ first transistor M1_1 and the $3^{rd}$ first transistor M1_3 are turned off. Therefore, in the present embodiment, only the signal of the $2^{nd}$ drive node N0_2 may be output to the cascade output end JO and the $2^{nd}$ drive output end GO_2, while the signals of both the $1^{st}$ drive node N0_1 and the $3^{rd}$ drive node N0_3 are not output. Therefore, a change process of the signals of the $1^{st}$ drive node N0_1 and the $3^{rd}$ drive node N0_3 has no effect on the present embodiment. Therefore, the change of the signal of the $2^{nd}$ drive node N0_2 is illustrated below, and the change of the signals of both the $1^{st}$ drive node N0_1 and the $3^{rd}$ drive node N0_3 is no longer illustrated.

In the second input phase T21, the signal ck1 is the low-level signal, and thus the sixth transistor M6, the seventh transistor M7, the $2^{nd}$ fifth transistor M5_2 and the $3^{rd}$ fifth transistor M5_3 may all be controlled to be turned on. The turned-on sixth transistor M6 provides the low-level signal of the signal inp to the first node N1, so that the signal of the first node N1 is the low-level signal. The eighth transistor M8 may be turned on under control of the low-level signal of the first node N1 so as to provide the low-level signal of the signal ck1 to the second node N2, so that the signal of the second node N2 is the low-level signal. The turned-on seventh transistor M7 provides the low-level signal of the second reference signal end VREF2 to the second node N2, to further make the signal of the second node N2 be the low-level signal so as to control the $1^{st}$ fourth transistor M4_1, the $2^{nd}$ fourth transistor M4_2, and the $3^{rd}$ fourth transistor M4_3 to be all turned on. The turned-on $2^{nd}$ fourth transistor M4_2 provides the high-level signal of the first reference signal end VREF1 to the $2^{nd}$ drive node N0_2, so that the signal of the $2^{nd}$ drive node N0_2 is the high-level signal. Because the signal of the second reference signal end VREF2 is the low-level signal, the $1^{st}$ fifth transistor M5_1 may be controlled to be turned on. Moreover, the $2^{nd}$ fifth transistor M5_2 is also turned on, so that a level of a control electrode of the $2^{nd}$ third transistor M3_2 may be made to be a low level. Therefore, the $2^{nd}$ third transistor M3_2 is turned on to provide the high-level signal of the signal ck2_2 to the $2^{nd}$ drive node N0_2, so as to further make the signal of the $2^{nd}$ drive node N0_2 be the high-level signal. The turned-on $2^{nd}$ second transistor M2_2 provides the high-level signal of the $2^{nd}$ drive node N0_2 to the $2^{nd}$ drive output end GO_2, so that the $2^{nd}$ drive output end GO_2 outputs the high-level signal. The turned-on $2^{nd}$ first transistor M1_2 provides the high-level signal of the $2^{nd}$ drive node N0_2 to the cascade output end JO, so that the cascade output end JO outputs the high-level signal.

In the second output phase 122, the signal ck1 is the high-level signal, and thus the sixth transistor M6, the seventh transistor M7, the $2^{nd}$ fifth transistor M5_2 and the $3^{rd}$ fifth transistor M5_3 may all be controlled to be turned off. Therefore, the first node N1 is in the floating state. Due to the effect of the $1^{st}$ first capacitor C1_1, the signal of the first node N1 may be kept as the low-level signal. The eighth transistor M8 may be turned on under control of the low-level signal of the first node N1 so as to provide the high-level signal of the signal ck1 to the second node N2, so that the signal of the second node N2 is the high-level signal, and the $1^{st}$ fourth transistor M4_1, the $2^{nd}$ fourth transistor M4_2, and the $3^{rd}$ fourth transistor M4_3 are all controlled to be turned off. Due to the effect of the $2^{nd}$ first capacitor C1_2, the level of the control electrode of the $2^{nd}$ third transistor M3_2 may be kept as the low level, thus the $2^{nd}$ third transistor M3_2 is turned on to provide the low-level signal of the signal ck2_2 to the $2^{nd}$ drive node N0_2, so as to make the signal of the $2^{nd}$ drive node N0_2 be the low-level signal. Due to a bootstrap effect of the $2^{nd}$ first capacitor C1_2, the level of the control electrode of the $2^{nd}$ third transistor M3_2 may further be reduced, so that the $2^{nd}$ third transistor M3_2 is completely turned on as far as possible, and the low-level signal of the signal ck2_2 may be provided to the $2^{nd}$ drive node N0_2 without voltage loss as much as possible, so as to make the signal of the $2^{nd}$ drive node N0_2 be the low-level signal. The turned-on $2^{nd}$ second transistor M2_2 provides the low-level signal of the $2^{nd}$ drive node N0_2 to the $2^{nd}$ drive output end GO_2, so that the $2^{nd}$ drive output end GO_2 outputs the low-level signal. The turned-on $2^{nd}$ first transistor M1_2 provides the low-level signal of the $2^{nd}$ drive node N0_2 to the cascade output end JO, so that the cascade output end JO outputs the low-level signal.

At the second reset phase T23, the signal ck1 is the low-level signal, and thus the sixth transistor M6, the seventh transistor M7, the $2^{nd}$ fifth transistor M5_2 and the $3^{rd}$ fifth transistor M5_3 may all be controlled to be turned on. The turned-on sixth transistor M6 provides the high-level signal of the signal inp to the first node N1, so that the signal of the first node N1 is the high-level signal. The eighth transistor M8 may be turned off under the control of the high-level signal of the first node N1. The turned-on seventh transistor M7 provides the low-level signal of the second reference signal end VREF2 to the second node N2, to make the signal of the second node N2 be the low-level signal so as to control the $1^{st}$ fourth transistor M4_1, the $2^{nd}$ fourth transistor M4_2, and the $3^{rd}$ fourth transistor M4_3 to be all turned on. The turned-on $2^{nd}$ fourth transistor M4_2 provides the high-level signal of the first reference signal end VREF1 to the $2^{nd}$ drive node N0_2, so that the signal of the $2^{nd}$ drive node N0_2 is the high-level signal. Because the signal of the first node N1 is the high-level signal and the $2^{nd}$ fifth transistor M5_2 is turned on, the $2^{nd}$ third transistor M3_2 is turned off. The turned-on $2^{nd}$ second transistor M2_2 provides the high-level signal of the $2^{nd}$ drive node N0_2 to the $2^{nd}$ drive output end GO_2, so that the $2^{nd}$ drive output end GO_2 outputs the high-level signal. The turned-on $2^{nd}$ first transistor M1_2 provides the high-level signal of the $2^{nd}$ drive node N0_2 to the cascade output end JO, so that the cascade output end JO outputs the high-level signal.

It should be noted that signal output by the $2^{nd}$ drive output end GO_2 is the gate scanning signal. In FIG. 8, there is the holding phase between every two adjacent phases. That is, when the signals inp, ck1, ck2_1, ck2_2, ck2_3 are all high levels, the shift register unit may enter into the next phase after the signals are stable. In this way, there is the interval duration between low levels of the gate scanning signals output by the $2^{nd}$ drive output end GO_2 of every two adjacent stages of shift register units. Exemplarily, the interval duration may be 5H. Exemplarily, when the signal output by only the $2^{nd}$ drive output end GO_2 of the shift register unit is controlled, clock cycles of the signals ck1, ck2_1, ck2_2, and ck2_3 may be reduced, to make the interval duration between the low levels of the gate scanning signals output by the $2^{nd}$ drive output end GO_2 of every two adjacent stages of shift register units be reduced, or even canceled, so that the scan time of one display frame may be reduced, and the refresh frequency is further improved.

In yet some embodiments of the present disclosure, at the second drive mode, the $3^{rd}$ drive output end GO_3 of each stage of shift register unit may be controlled to output the gate scanning signal to the coupled gate line to realize interlaced scanning.

Figure 9:
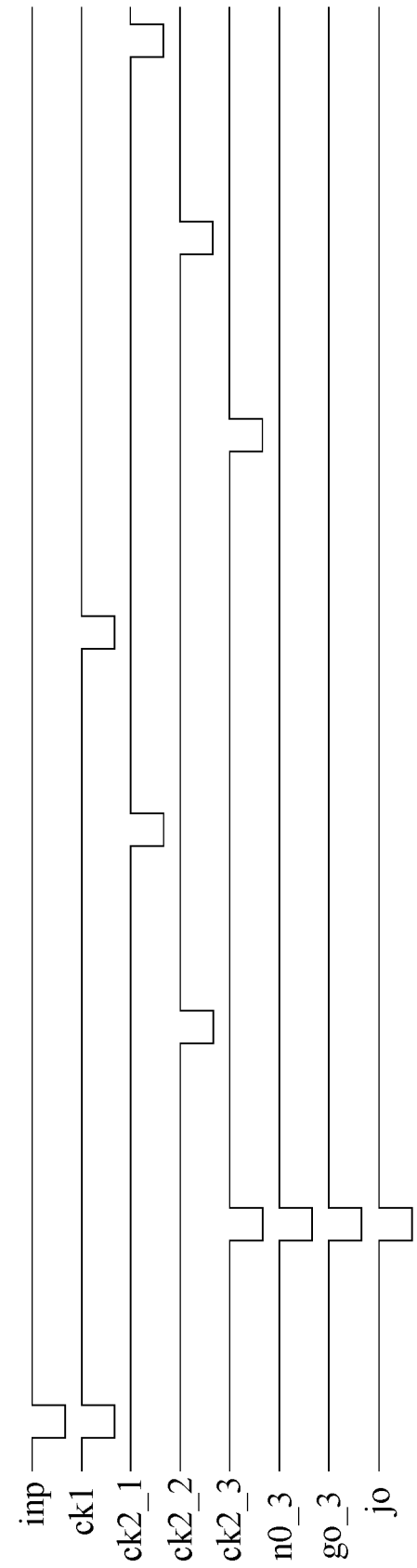
FIG. 9 is a diagram of yet some signal timings of a shift register unit at a second drive mode provided by an embodiment of the present disclosure.

In some examples, the working process of the above shift register unit provided by the embodiment of the present disclosure at the second drive mode is described below by taking the structure of the shift register unit shown in FIG. 3 as an example, and with reference to the signal timing diagram shown in FIG. 9. Exemplarily, the second input phase T21, the second output phase T22 and the second reset phase T23 in the signal timing diagram shown in FIG. 9 are mainly selected.

Moreover, inp represents the signal of the input signal end INP, ck1 represents the signal of the first clock signal end CK1, ck2_1 represents the signal of the $1^{st}$ second clock signal end CK2_1, ck2_2 represents the signal of the $2^{nd}$ second clock signal end CK2_2, ck2_3 represents the signal of the $3^{rd}$ second clock signal end CK2_3, n0_2 represents the signal of the $2^{nd}$ drive node N0_2, go_2 represents the signal of the $2^{nd}$ drive output end GO_2, and jo represents the signal of the cascade output end JO. The signal of the $3^{rd}$ drive selection signal end GX_3 is the low-level signal, and the signals of both the $1^{st}$ drive selection signal end GX_1 and the $2^{nd}$ drive selection signal end GX_2 are the high-level signals. The signal of the $3^{rd}$ cascade selection signal end JX_3 is the low-level signal, and the signals of both the $1^{st}$ cascade selection signal end JX_1 and the $2^{nd}$ cascade selection signal end JX_2 are the high-level signals. Because the signals of both the $1^{st}$ drive selection signal end GX_1 and the $2^{nd}$ drive selection signal end GX_2 are the high-level signals, in the present embodiment, both the $1^{st}$ second transistor M2_1 and the $2^{nd}$ second transistor M2_2 are turned off. Because the signals of both the $1^{st}$ cascade selection signal end JX_1 and the $2^{nd}$ cascade selection signal end JX_2 are the high-level signals, in the present embodiment, both the $1^{st}$ first transistor M1_1 and the $2^{nd}$ first transistor M1_2 are turned off. Therefore, in the present embodiment, only the signal of the $3^{rd}$ drive node N0_3 may be output to the cascade output end JO and the $3^{rd}$ drive output end GO_3, while the signals of both the $1^{st}$ drive node N0_1 and the $2^{nd}$ drive node N0_2 are not output. Therefore, a change process of the signals of the $1^{st}$ drive node N0_1 and the $2^{nd}$ drive node N0_2 has no effect on the present embodiment. Therefore, the change of the signal of the $3^{rd}$ drive node N0_3 is illustrated below, and the change of the signals of both the $1^{st}$ drive node N0_1 and the $2^{nd}$ drive node N0_2 is no longer illustrated.

In the second input phase 121, the signal ck1 is the low-level signal, and thus the sixth transistor M6, the seventh transistor M7, the $2^{nd}$ fifth transistor M5_2 and the $3^{rd}$ fifth transistor M5_3 may all be controlled to be turned on. The turned-on sixth transistor M6 provides the low-level signal of the signal inp to the first node N1, so that the signal of the first node N1 is the low-level signal. The eighth transistor M8 may be turned on under control of the low-level signal of the first node N1 so as to provide the low-level signal of the signal ck1 to the second node N2, so that the signal of the second node N2 is the low-level signal. The turned-on seventh transistor M7 provides the low-level signal of the second reference signal end VREF2 to the second node N2, to further make the signal of the second node N2 be the low-level signal so as to control the $1^{st}$ fourth transistor M4_1, the $2^{nd}$ fourth transistor M4_2, and the $3^{rd}$ fourth transistor M4_3 to be all turned on. The turned-on $3^{rd}$ fourth transistor M4_3 provides the high-level signal of the first reference signal end VREF1 to the $3^{rd}$ drive node N0_3, so that the signal of the $3^{rd}$ drive node N0_3 is the high-level signal. Because the signal of the second reference signal end VREF2 is the low-level signal, the $1^{st}$ fifth transistor M5_1 may be controlled to be turned on. Moreover, the $3^{rd}$ fifth transistor M5_3 is also turned on, so that a level of a control electrode of the $3^{rd}$ third transistor M3_3 may be made to be a low level. Therefore, the $3^{rd}$ third transistor M3_3 is turned on to provide the high-level signal of the signal ck2_3 to the $3^{rd}$ drive node N0_3, so as to make the signal of the $3^{rd}$ drive node N0_3 be the high-level signal. The turned-on $3^{rd}$ second transistor M2_3 provides the high-level signal of the $3^{rd}$ drive node N0_3 to the $3^{rd}$ drive output end GO_3, so that the $3^{rd}$ drive output end GO_3 outputs the high-level signal. The turned-on $3^{rd}$ first transistor M1_3 provides the high-level signal of the $3^{rd}$ drive node N0_3 to the cascade output end JO, so that the cascade output end JO outputs the high-level signal.

In the second output phase 122, the signal ck1 is the high-level signal, and thus the sixth transistor M6, the seventh transistor M7, the $2^{nd}$ fifth transistor M5_2 and the $3^{rd}$ fifth transistor M5_3 may all be controlled to be turned off. Therefore, the first node N1 is in the floating state. Due to the effect of the $1^{st}$ first capacitor C1_1, the signal of the first node N1 may be kept as the low-level signal. The eighth transistor M8 may be turned on under control of the low-level signal of the first node N1 so as to provide the high-level signal of the signal ck1 to the second node N2, so that the signal of the second node N2 is the high-level signal, and the $1^{st}$ fourth transistor M4_1, the $2^{nd}$ fourth transistor M4_2, and the $3^{rd}$ fourth transistor M4_3 are all controlled to be turned off. Due to the effect of the $3^{rd}$ first capacitor C1_3, the level of the control electrode of the $3^{rd}$ third transistor M3_3 may be kept as the low level, therefore the $3^{rd}$ third transistor M3_3 is turned on to provide the low-level signal of the signal ck2_3 to the $3^{rd}$ drive node N0_3, so as to make the signal of the $3^{rd}$ drive node N0_3 be the low-level signal. Due to a bootstrap effect of the $3^{rd}$ first capacitor C1_3, the level of the control electrode of the $3^{rd}$ third transistor M3_3 may further be reduced, so that the $3^{rd}$ third transistor M3_3 is completely turned on as far as possible, and the low-level signal of the signal ck2_3 may be provided to the $3^{rd}$ drive node N0_3 without voltage loss as much as possible, so as to make the signal of the $3^{rd}$ drive node N0_3 be the low-level signal. The turned-on $3^{rd}$ second transistor M2_3 provides the low-level signal of the $3^{rd}$ drive node N0_3 to the $3^{rd}$ drive output end GO_3, so that the $3^{rd}$ drive output end GO_3 outputs the low-level signal. The turned-on $3^{rd}$ first transistor M1_3 provides the low-level signal of the $3^{rd}$ drive node N0_3 to the cascade output end JO, so that the cascade output end JO outputs the low-level signal.

At the second reset phase T23, the signal ck1 is the low-level signal, and thus the sixth transistor M6, the seventh transistor M7, the $2^{nd}$ fifth transistor M5_2 and the $3^{rd}$ fifth transistor M5_3 may all be controlled to be turned on. The turned-on sixth transistor M6 provides the high-level signal of the signal inp to the first node N1, so that the signal of the first node N1 is the high-level signal. The eighth transistor M8 may be turned off under the control of the high-level signal of the first node N1. The turned-on seventh transistor M7 provides the low-level signal of the second reference signal end VREF2 to the second node N2, to make the signal of the second node N2 be the low-level signal so as to control the $1^{st}$ fourth transistor M4_1, the $2^{nd}$ fourth transistor M4_2, and the $3^{rd}$ fourth transistor M4_3 to be all turned on. The turned-on $3^{rd}$ fourth transistor M4_3 provides the high-level signal of the first reference signal end VREF1 to the $3^{rd}$ drive node N0_3, so that the signal of the $3^{rd}$ drive node N0_3 is the high-level signal. Because the signal of the first node N1 is the high-level signal and the $3^{rd}$ fifth transistor M5_3 is turned on, the $3^{rd}$ third transistor M3_3 is turned off. The turned-on $3^{rd}$ second transistor M2_3 provides the high-level signal of the $3^{rd}$ drive node N0_3 to the $3^{rd}$ drive output end GO_3, so that the $3^{rd}$ drive output end GO_3 outputs the high-level signal. The turned-on $3^{rd}$ first transistor M1_3 provides the high-level signal of the $3^{rd}$ drive node N0_3 to the cascade output end JO, so that the cascade output end JO outputs the high-level signal.

It should be noted that signal output by the $3^{rd}$ drive output end GO_3 is the gate scanning signal. In FIG. 7A, there is the holding phase between every two adjacent phases. That is, when the signals inp, ck1, ck2_1, ck2_2, ck2_3 are all high levels, the shift register unit may enter into the next phase after the signals are stable. In this way, there is the interval duration between low levels of the gate scanning signals output by the $1^{st}$ drive output end GO_1 of every two adjacent stages of shift register units. Exemplarily, the interval duration may be 5H. Exemplarily, when the signal output by only the $3^{rd}$ drive output end GO_3 of the shift register unit is controlled, clock cycles of the signals ck1, ck2_1, ck2_2, and ck2_3 may be reduced, to make the interval duration between the low levels of the gate scanning signals output by the $3^{rd}$ drive output end GO_3 of every two adjacent stages of shift register units be reduced, or even canceled, so that the scan time of one display frame may be reduced, and the refresh frequency is further improved.

An embodiment of the present disclosure further provides a gate drive circuit, which may include the plurality of above cascaded shift register units. An input signal end of a first-stage shift register unit is coupled with a frame start signal line. In every two adjacent stages of shift register units, an input signal end of a next-stage shift register unit is coupled with a cascade output end of a previous-stage shift register unit. In this way, a signal output from the cascade output end of the previous-stage shift register unit may be input to the input signal end of the next-stage shift register unit, so that the cascade signal end and the drive signal end of the next-stage shift register unit may output the corresponding signals.

Figure 10:
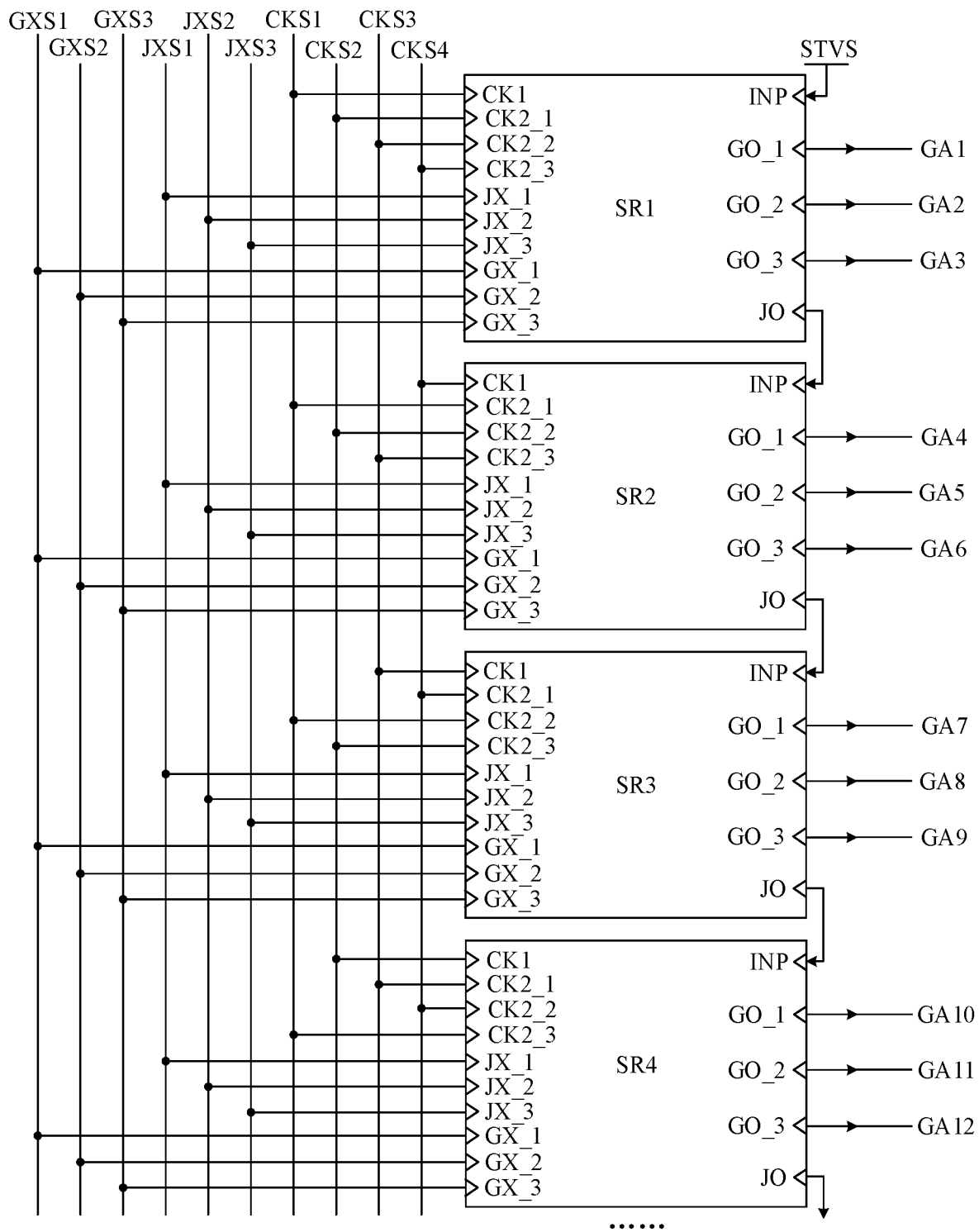
FIG. 10 is a schematic diagram of some structures of a gate drive circuit provided by an embodiment of the present disclosure.

Exemplarily, taking a structure of the shift register unit shown in FIG. 3 and a first-stage shift register unit to a fourth-stage shift register unit as an example, as shown in FIG. 10, the input signal end INP of the first-stage shift register unit SR1 is coupled with the frame start signal line STV. An input signal end INP of a second-stage shift register unit SR2 is coupled with a cascade output end JO of the first-stage shift register unit SR1. An input signal end INP of a third-stage shift register unit SR3 is coupled with a cascade output end JO of the second-stage shift register unit SR2. An input signal end INP of a fourth-stage shift register unit SR4 is coupled with a cascade output end JO of the third-stage shift register unit SR3.

It should be noted that a specific structure of each shift register unit in the above gate drive circuit is the same as the above shift register unit of the present disclosure in function and structure, and repetitions will be omitted.

In some embodiments of the present disclosure, a first reference signal end VREF1 of each stage of shift register unit is coupled with the same first reference signal line, and a second reference signal end VREF2 of each stage of shift register unit is coupled with the same second reference signal line.

Figure 11:
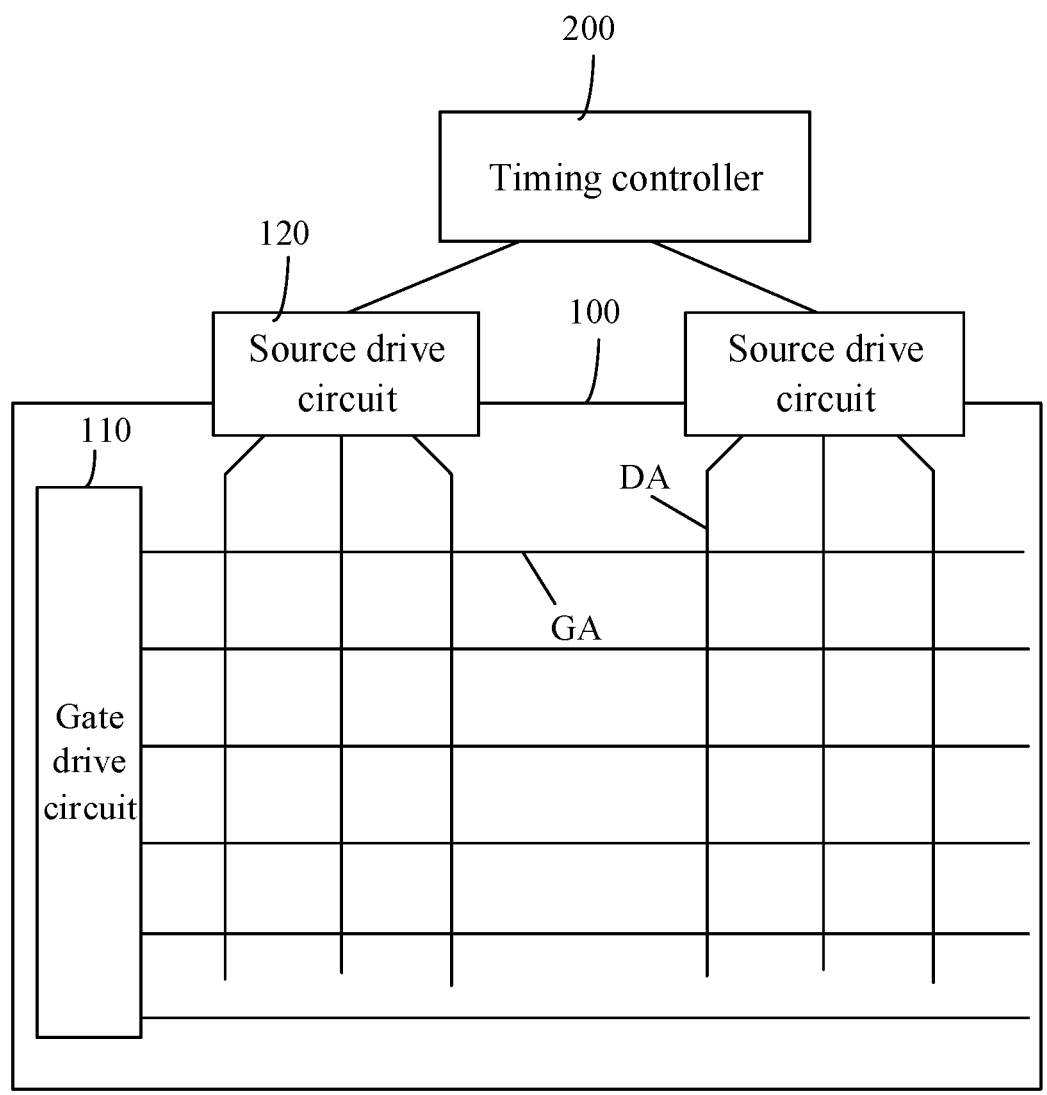
FIG. 11 is a schematic diagram of some structures of a display apparatus provided by an embodiment of the present disclosure.

An embodiment of the present disclosure further provides a display apparatus, as shown in FIG. 11, the display apparatus may include a display panel 100 and a timing controller 200. The display panel 100 may include: a plurality of pixel units arranged in an array, a plurality of gate lines GA, a plurality of data lines DA which are insulated and intersect with the gate lines GA, a gate drive circuit 110 respectively coupled with each gate line GA, and a source drive circuit 120 coupled with each data line DA. Exemplarily, there may be two source drive circuits 120 arranged, one of the source drive circuits 120 is coupled with half of the number of data lines, and the other source drive circuit 120 is coupled with the other half of the number of data lines. Certainly, there may also be three, four or more source drive circuits 120 arranged, which can be designed and determined according to the needs of the practical applications, and is not limited here.

In some embodiments of the present disclosure, each pixel unit may include a plurality of sub-pixels SPX. Exemplarily, each pixel unit may include a plurality of sub-pixels of different colors arranged in a column direction. For example, each pixel unit may include a first-color sub-pixel, a second-color sub-pixel and a third-color sub-pixel arranged in sequence in the column direction. In this way, one row of sub-pixels may have the same color. For example, a first-color sub-pixel row, a second-color sub-pixel row and a third-color sub-pixel row may be arranged repeatedly.

Figure 12:
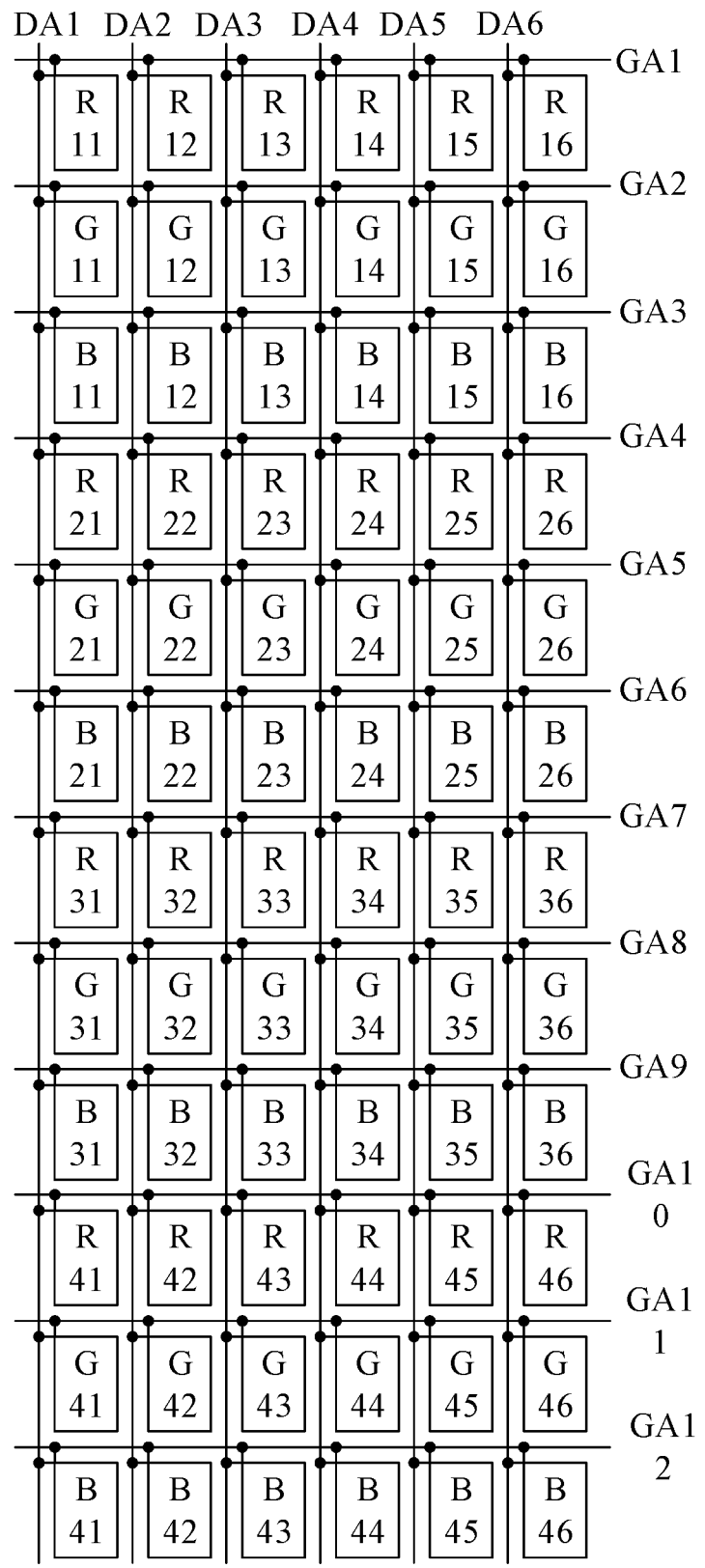
FIG. 12 is a schematic diagram of some structures of a display panel provided by an embodiment of the present disclosure.

Exemplarily, the first-color sub-pixel, the second-color sub-pixel and the third-color sub-pixel may be selected from a red sub-pixel, a green sub-pixel and a blue sub-pixel. For example, the first-color sub-pixel is a red sub-pixel, the second-color sub-pixel is a green sub-pixel, and the third-color sub-pixel is a blue sub-pixel. In this way, a red sub-pixel row, a green sub-pixel row, and a blue sub-pixel row may be arranged repeatedly to achieve color display by mixing red, green, blue and white. For example, as shown in FIG. 12, a first row of sub-pixels is red sub-pixels R11-R16, a second row of sub-pixels is green sub-pixels G11-G16, a third row of sub-pixels is blue sub-pixels B11-B16, a fourth row of sub-pixels is red sub-pixels R21-R26, a fifth row of sub-pixels is green sub-pixels G21-G26, a sixth row of sub-pixels is blue sub-pixels B21-B26, a seventh row of sub-pixels is red sub-pixels R31-R36, an eighth row of sub-pixels is green sub-pixels G31-G36, a ninth row of sub-pixels is blue sub-pixels B31-B36, a tenth row of sub-pixels is red sub-pixels R41-R46, an eleventh row of sub-pixels is green sub-pixels G41-G46, and a twelfth row of sub-pixels is blue sub-pixels B41-B46. Moreover, the red sub-pixel R11, the green sub-pixel G11 and the blue sub-pixel B11 are one pixel unit; the red sub-pixel R12, the green sub-pixel G12 and the blue sub-pixel B12 are one pixel unit; the red sub-pixel R13, the green sub-pixel G13 and the blue sub-pixel B13 are one pixel unit; the red sub-pixel R14, the green sub-pixel G14 and the blue sub-pixel B14 are one pixel unit; the red sub-pixel R15, the green sub-pixel G15 and the blue sub-pixel B15 are one pixel unit; and the red sub-pixel R16, the green sub-pixel G16 and the blue sub-pixel B16 are one pixel unit. The rest are the same and may be deduced by analogy, which is not repeated here.

It should be noted that in practical applications, light-emitting color of the sub-pixels in the pixel unit may be designed and determined according to a practical application environment, which is not limited here.

Figure 13:
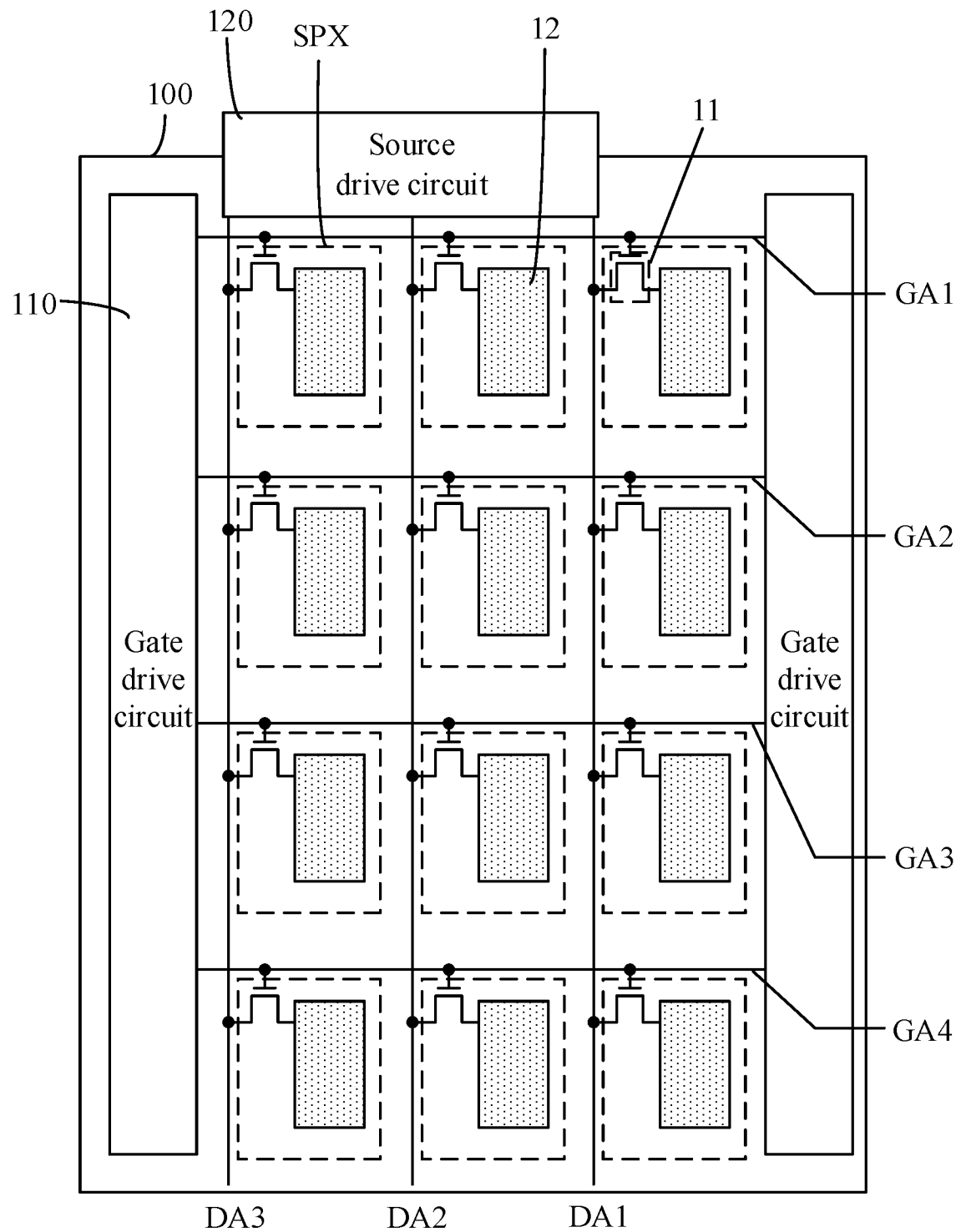
FIG. 13 is a schematic diagram of some other structures of a display panel provided by an embodiment of the present disclosure.

Exemplarily, as shown in FIG. 13, each pixel SPX may include a transistor 11 and a pixel electrode 12. For example, one row of sub-pixels SPX is correspondingly coupled with one gate line, and one column of sub-pixels SPX is correspondingly coupled with one data line. For example, a gate of the transistor 11 is coupled with the corresponding gate line, a source of the transistor 11 is coupled with the corresponding data line, and a drain of the transistor 11 is coupled with the pixel electrode 12. It should be noted that a pixel array structure of the present disclosure may further be a double-gate structure. That is, two gate lines are arranged between two adjacent lines of sub-pixels. The arrangement mode may reduce half of the data lines, that is, some of the adjacent two columns of sub-pixels contain the data line, some of the adjacent two columns of sub-pixels may not include the data line, and the specific sub-pixel arrangement structure and the arrangement mode of the data lines and a scan line are not limited.

Exemplarily, the timing controller 200 may obtain display data of a to-be-display picture in each display frame, and the timing controller 200 may input a clock signal to the gate drive circuit 110, so that the gate drive circuit 110 outputs a gate scanning signal to the gate line GA according to the input clock signal, to scan the gate line GA, so as to control a transistor in the coupled sub-pixel to be turned on. The timing controller 200 inputs the corresponding display data to the source drive circuit 120, so that the source drive circuit 120 may input a corresponding data voltage to the coupled data line DA according to the input display data, to input a voltage on the data line DA into the sub-pixel through the turned-on transistor in the sub-pixel, so as to charge the sub-pixel, and then charge each sub-pixel with the corresponding data voltage to achieve a picture display function.

It should be noted that the display panel in the embodiment of the present disclosure may be a liquid crystal display panel, an OLED display panel, and the like, which is not limited here. Exemplarily, the liquid crystal display panel may generally include an upper substrate and a lower substrate which are oppositely closed, and liquid crystal molecules encapsulated between the upper substrate and the lower substrate. When displaying the picture, because there is a voltage difference between the data voltage loaded on a pixel electrode of the sub-pixel and a common electrode voltage on a common electrode, the voltage difference may form an electric field, so that the liquid crystal molecules deflect under the effect of the electric field. Due to the different degree of deflection of the liquid crystal molecules caused by different intensity of electric field, transmittance of the sub-pixel is different, so that the sub-pixel SPX achieves brightness with different gray scales, and then realizes the picture display.

In some embodiments of the present disclosure, as shown in FIG. 10, the gate drive circuit may include the plurality of cascaded shift register units. Each drive output end of each shift register unit in the gate drive circuit is coupled with the plurality of gate lines in a one-to-one correspondence mode. In this way, the gate scanning signal may be output to the coupled gate through the drive output end. Exemplarily, taking a structure of the shift register unit shown in FIG. 3 and a first-stage shift register unit to a fourth-stage shift register unit as an example, as shown in FIG. 10, a $1^{st}$ drive output end GO_1 of a first-stage shift register unit SR1 is coupled with a gate line GA1, a $2^{nd}$ drive output end GO_2 of the first-stage shift register unit SR1 is coupled with a gate line GA2, and a $3^{rd}$ drive output end GO_3 of the first-stage shift register unit SR1 is coupled with a gate line GA3. A $1^{st}$ drive output end GO_1 of a second-stage shift register unit SR2 is coupled with a gate line GA4, a $2^{nd}$ drive output end GO_2 of the second-stage shift register unit SR2 is coupled with a gate line GA5, and a $3^{rd}$ drive output end GO_3 of the second-stage shift register unit SR2 is coupled with a gate line GA6. A $1^{st}$ drive output end GO_1 of a third-stage shift register unit SR3 is coupled with a gate line GA7, a $2^{nd}$ drive output end GO_2 of the third-stage shift register unit SR3 is coupled with a gate line GA8, and a $3^{rd}$ drive output end GO_3 of the third-stage shift register unit SR3 is coupled with a gate line GA9. A $1^{st}$ drive output end GO_1 of a fourth-stage shift register unit SR4 is coupled with a gate line GA10, a $2^{nd}$ drive output end GO_2 of the fourth-stage shift register unit SR4 is coupled with a gate line GA11, and a $3^{rd}$ drive output end GO_3 of the fourth-stage shift register unit SR4 is coupled with a gate line GA12.

Exemplarily, an active level of the gate scanning signal may control a transistor in the sub-pixel coupled with the corresponding gate line to be turned on, and an inactive level may control the transistor in the sub-pixel coupled with the corresponding gate line to be turned off. Exemplarily, with reference to the structure of the shift register unit shown in FIG. 3, the active level of the gate scanning signal may be a low level, and the inactive level of the gate scanning signal may be a high level. Certainly, it is also possible to make the active level of the gate scanning signal be the high level and the inactive level of the gate scanning signal be the low level, which is not limited here.

In some embodiments of the present disclosure, the display panel may further include a plurality of clock signal lines and a frame start signal line, and the plurality of clock signal lines and the frame start signal line are respectively coupled with the gate drive circuit. In this way, a plurality of corresponding clock signals may be input to the gate drive circuit through the clock signal lines, and the plurality of clock signals are respectively input to a first clock signal end CK1 and M second clock signal ends of the shift register unit, so that the shift register unit outputs the gate scanning signal to the coupled gate line. Exemplarily, taking the structure of the shift register unit shown in FIG. 3 and a first-stage shift register unit to a fourth-stage shift register unit as an example, as shown in FIG. 10, the display panel may include four clock signal lines CKS1-CKS4 and one frame start signal line STVS_1. The four clock signal lines CKS1-CKS4 and one frame start signal line STVS_1 are respectively coupled with the gate drive circuit 110. Moreover, CKS1 serves as a first clock signal line, CKS2 serves as a second clock signal line, CKS3 serves as a third clock signal line, and CKS4 serves as a fourth clock signal line. A first clock signal end CK1 of a $(4k\_3)^{th}$-stage shift register unit, a $1^{st}$ second clock signal end CK2_1 of a $(4k\_2)^{th}$-stage shift register unit, a $2^{nd}$ second clock signal end CK2_2 of a $(4k\_1)^{th}$-stage shift register unit and a $3^{rd}$ second clock signal end CK2_3 of a $(4k)^{th}$-stage shift register unit are all coupled with the first clock signal line; a $1^{st}$ second clock signal end CK2_1 of the $(4k\_3)^{th}$-stage shift register unit, a $2^{nd}$ second clock signal end CK2_2 of the $(4k\_2)^{th}$-stage shift register unit, a $3^{rd}$ second clock signal end CK2_3 of the $(4k\_1)^{th}$-stage shift register unit and a first clock signal end CK1 of the $(4k)^{th}$-stage shift register unit are all coupled with the second clock signal line; a $2^{nd}$ second clock signal end CK2_2 of the $(4k\_3)^{th}$-stage shift register unit, a $3^{rd}$ second clock signal end CK2_3 of the $(4k\_2)^{th}$-stage shift register unit, a first clock signal end CK1 of the $(4k\_1)^{th}$-stage shift register unit and a $1^{st}$ second clock signal end CK2_1 of the $(4k)^{th}$-stage shift register unit are all coupled with the third clock signal line; a $3^{rd}$ second clock signal end CK2_3 of the $(4k\_3)^{th}$-stage shift register unit, a first clock signal end CK1 of the $(4k\_2)^{th}$-stage shift register unit, a $1^{st}$ second clock signal end CK2_1 of the $(4k\_1)^{th}$-stage shift register unit and a $2^{nd}$ second clock signal end CK2_2 of the $(4k)^{th}$-stage shift register unit are all coupled with the fourth clock signal line; and k is an integer greater than 0.

It should be noted that FIG. 10 only takes the four clock signal lines and one frame start signal line as an example for illustration. In practical applications, the specific quantity of the clock signal lines and the frame start signal line may be determined according to the needs of the practical applications, and is not limited here. For example, other quantities of clock signal lines and frame start signal lines may also be integral multiples of 2, such as 2, 4, 6, 10, 12 and other quantities of clock signal lines and frame start signal lines.

In some embodiments of the present disclosure, the display panel may further include a plurality of cascade selection signal lines and a plurality of drive selection signal lines, a cascade selection signal end of the shift register unit in the gate drive circuit is coupled with the cascade selection signal lines, and a drive selection signal end of the shift register unit in the gate drive circuit is coupled with the drive selection signal lines. Exemplarily, taking the structure of the shift register unit shown in FIG. 3 and the first-stage shift register unit to the fourth-stage shift register unit as an example, as shown in FIG. 10, the display panel may include three cascade selection signal lines JXS1-JXS3 and three drive selection signal lines GXS1-GXS3. The three cascade selection signal lines JXS1-JXS3 are respectively coupled with the cascade selection signal end of the shift register unit in the gate drive circuit 110. The three drive selection signal lines GXS1-GXS3 are respectively coupled with the drive selection signal end of the shift register unit in the gate drive circuit 110. Moreover, JXS1 serves as a first cascade selection signal line, JXS2 serves as a second cascade selection signal line, and JXS3 serves as a third cascade selection signal line. GXS1 serves as a first drive selection signal line, GXS2 serves as a second drive selection signal line, and GXS3 serves as a third drive selection signal line. A $1^{st}$ cascade selection signal end JX_1 of each-stage shift register unit is coupled with the first cascade selection signal line, a $2^{nd}$ cascade selection signal end JX_2 of each-stage shift register unit is coupled with the second cascade selection signal line, and a $3^{rd}$ cascade selection signal end JX_3 of each-stage shift register unit is coupled with the third cascade selection signal line. A $1^{st}$ drive selection signal end GX_1 of each-stage shift register unit is coupled with the first drive selection signal line, a $2^{nd}$ drive selection signal end GX_2 of each-stage shift register unit is coupled with the second drive selection signal line, and a $3^{rd}$ drive selection signal end GX_3 of each-stage shift register unit is coupled with the third drive selection signal line.

It should be noted that FIG. 10 only takes the three cascade selection signal lines JXS1-JXS3 and three drive selection signal lines GXS1-GXS3 as an example for illustration. In practical applications, the specific quantity of the cascade selection signal lines and the drive selection signal lines may be determined according to the needs of the practical applications, and is not limited here.

In some embodiments of the present disclosure, it is possible to make one row of pixel units correspond to one shift register unit in the gate drive circuit. An $m^{th}$ drive output end of each shift register unit is coupled with a gate line corresponding to the sub-pixels of the same color. Exemplarily, taking the structure of the shift register unit shown in FIG. 3 and the first-stage shift register unit to the fourth-stage shift register unit as an example, as shown in FIG. 10 and FIG. 12, $1^{st}$ drive output ends GO_1 of the first-stage shift register unit to the fourth-stage shift register unit are coupled with the gate lines GA1, GA4, GA7 and GA10 corresponding to the red sub-pixels. $2^{nd}$ drive output ends GO_2 of the first-stage shift register unit to the fourth-stage shift register unit are coupled with the gate lines GA2, GA5, GA8 and GA11 corresponding to the green sub-pixels. $3^{rd}$ drive output ends GO_3 of the first-stage shift register unit to the fourth-stage shift register unit are coupled with the gate lines GA3, GA6, GA9 and GA12 corresponding to the red sub-pixels.

In some embodiments of the present disclosure, the gate drive circuit may be arranged only at a first end of the gate line, or the gate drive circuit may also be arranged only at a second end of the gate line. The gate drive circuit may also be arranged at both the first end and the second end of the gate line, so that the shift register unit coupled to the same gate line simultaneously inputs the active level of the gate scanning signal to the gate line. Exemplarily, as shown in FIG. 11, one gate drive circuit is arranged on left sides of the plurality of gate lines. Alternatively, as shown in FIG. 13, one gate drive circuit is respectively arranged on the left sides and right sides of the plurality of gate lines.

An embodiment of the present disclosure further provides a control method of a display apparatus. As shown in FIG. 14, the control method may include the following steps.

S10, at a first drive mode, in one display frame, different first clock signals are loaded for all clock signal lines, a gate turn-on signal is loaded for each drive selection signal line, a gate turn-on signal is loaded for a cascade selection signal line coupled with an $M^{th}$ drive output circuit, a gate turn-off signal is loaded for remaining cascade selection signal lines, all shift register units are controlled to work sequentially, a signal of an M$^{th}$ drive node of at least two drive nodes is provided to a cascade output end, a signal of each of the at least two drive nodes is provided to a drive output end corresponding to each drive node, and a plurality of gate lines are scanned row by row.

In some examples, a gate drive circuit outputs a gate scanning signal to the coupled gate line through the drive output end, an active level of the gate scanning signal may control a transistor coupled with the corresponding gate line to be turned on, and an inactive level may control the transistor coupled with the corresponding gate line to be turned off. Exemplarily, the active level of the gate scanning signal may be a high level, and the inactive level of the gate scanning signal may be a low level. Alternatively, the active level of the gate scanning signal may also be the low level, and the inactive level of the gate scanning signal may be the high level, which is not limited here.

Optionally, the active level of each first clock signal is used to output the active level of the gate scanning signal that scans the gate line. Optionally, durations of the active levels of the first clock signals are the same. Optionally, clock cycles of the first clock signals are the same.

Figure 15:
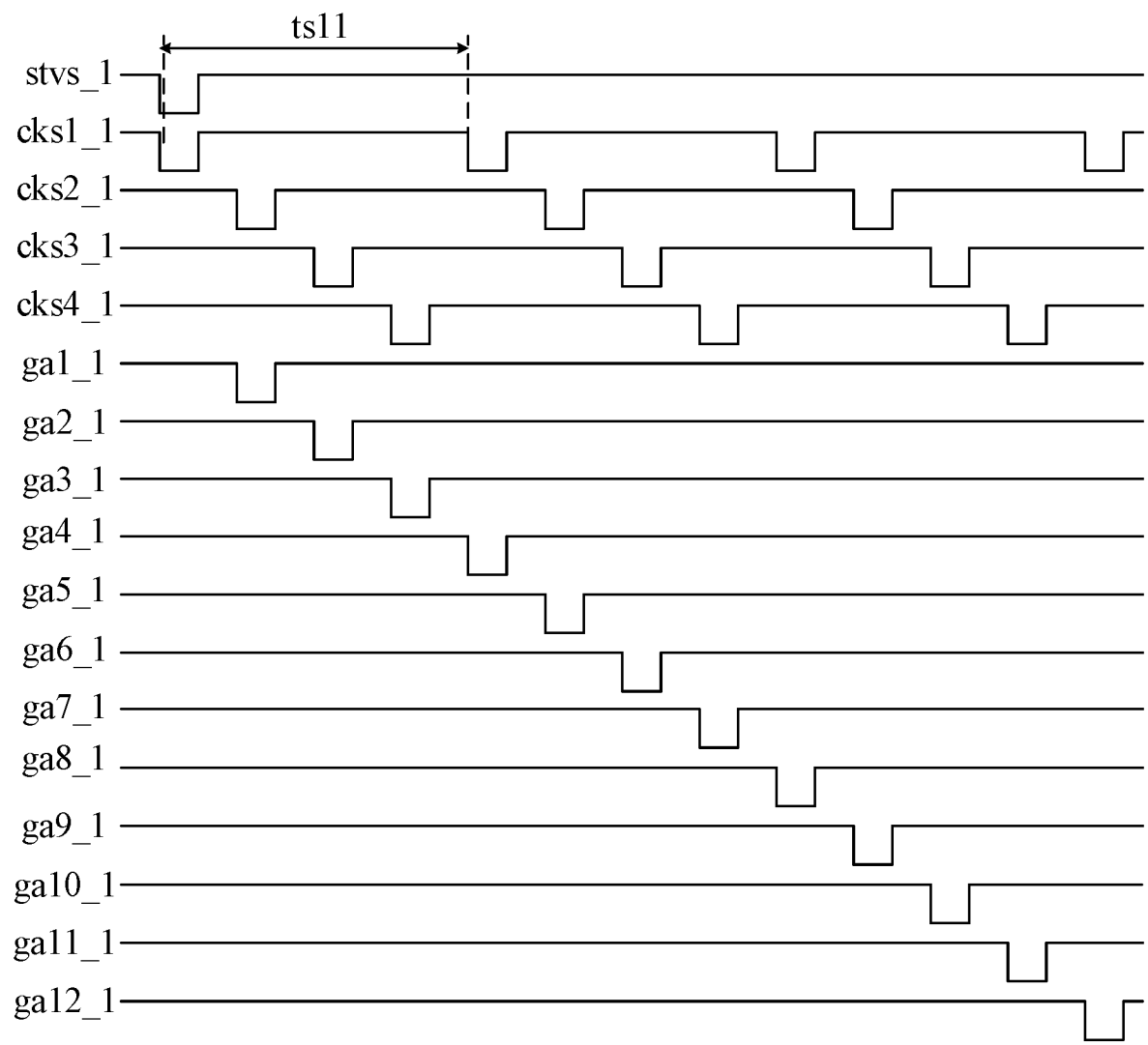
FIG. 15 is a diagram of some signal timings of a display apparatus at a first drive mode provided by an embodiment of the present disclosure.

Exemplarily, taking a structure of the shift register unit shown in FIG. 3 and a first-stage shift register unit to a fourth-stage shift register unit as an example, at the first drive mode, a signal timing diagram corresponding to the gate drive circuit shown in FIG. 10 is shown in FIG. 15. cks1_1 represents a first clock signal input to a first clock signal line CKS1, cks2_1 represents a first clock signal input to a second clock signal line CKS2, cks3_1 represents a first clock signal input to a third clock signal line CKS3, cks4_1 represents a first clock signal input to a fourth clock signal line CKS4, stvs_1 represents a frame start signal input to a frame start signal line STVS_1. Moreover, a signal ga1_1 represents a gate scanning signal output by the gate drive circuit 110 to a gate line GA1, a signal ga2_1 represents a gate scanning signal output by the gate drive circuit 110 to a gate line GA2, . . . a signal ga10_1 represents a gate scanning signal output by the gate drive circuit 110 to a gate line GA10, a signal ga11_1 represents a gate scanning signal output by the gate drive circuit 110 to a gate line GA11, and a signal ga12_1 represents a gate scanning signal output by the gate drive circuit 110 to a gate line GA12. A low-level gate turn-on signal is loaded for a first drive selection signal line to control a 1$^{st}$ second transistor M2_1 in each-stage shift register unit to be turned on. A low-level gate turn-on signal is loaded for a second drive selection signal line to control a 2$^{nd}$ second transistor M2_2 in each-stage shift register unit to be turned on. A low-level gate turn-on signal is loaded for a third drive selection signal line to control a 3$^{rd}$ second transistor M2_3 in each-stage shift register unit to be turned on. A high-level gate turn-off signal is loaded for a first cascade selection signal line to control a 1$^{st}$ first transistor M1_1 in each-stage shift register unit to be turned off. A high-level gate turn-off signal is loaded for the second drive selection signal line to control a 2$^{nd}$ first transistor M1_2 in each-stage shift register unit to be turned off. A low-level gate turn-on signal is loaded for the third drive selection signal line to control a 3$^{rd}$ first transistor M1_3 in each-stage shift register unit to be turned on. Certainly, the gate turn-on signal may also be a high-level signal, and the gate turn-off signal may also be a low-level signal, which is not limited here.

Taking a low level as an active level of the gate scanning signal as an example, the signal stvs_1 is input into an input signal end INP of a shift register unit SR1, and the shift register unit SR1 outputs a 1$^{st}$ low level of the first clock signal cks2_1 to the gate line GA1 through the 1$^{st}$ drive output end GO_1 so as to generate a low level in the gate scanning signal ga1_1. The shift register unit SR1 outputs a 1$^{st}$ low level of the first clock signal cks3_1 to the gate line GA2 through the 2$^{nd}$ drive output end GO_2 so as to generate a low level in the gate scanning signal ga2_1. The shift register unit SR1 outputs a 1$^{st}$ low level of the first clock signal cks4_1 to the gate line GA3 through the 3$^{rd}$ drive output end GO_3 so as to generate a low level in the gate scanning signal ga3_1. The gate scanning signal ga3_1 is input into an input signal end INP of a shift register unit SR2, and the shift register unit SR2 outputs a 2$^{nd}$ low level of the first clock signal cks1_1 to the gate line GA4 through the 1$^{st}$ drive output end GO_1 so as to generate a low level in the gate scanning signal ga4_1. The shift register unit SR2 outputs a 2$^{nd}$ low level of the first clock signal cks2_1 to the gate line GA5 through the 2$^{nd}$ drive output end GO_2 so as to generate a low level in the gate scanning signal ga5_1. The shift register unit SR2 outputs a 2$^{nd}$ low level of the first clock signal cks3_1 to the gate line GA6 through the 3$^{rd}$ drive output end GO_3 so as to generate a low level in the gate scanning signal ga6_1. The gate scanning signal ga6_1 is input into an input signal end INP of a shift register unit SR3, and the shift register unit SR3 outputs a 2$^{nd}$ low level of the first clock signal cks4_1 to the gate line GA7 through the 1$^{st}$ drive output end GO_1 so as to generate a low level in the gate scanning signal ga7_1. The shift register unit SR3 outputs a 3$^{rd}$ low level of the first clock signal cks1_1 to the gate line GA8 through the 2$^{nd}$ drive output end GO_2 so as to generate a low level in the gate scanning signal ga8_1. The shift register unit SR3 outputs a 3$^{rd}$ low level of the first clock signal cks2_1 to the gate line GA9 through the 3$^{rd}$ drive output end GO_3 so as to generate a low level in the gate scanning signal ga9_1. The gate scanning signal ga9_1 is input into an input signal end INP of a shift register unit SR4, and the shift register unit SR4 outputs a 3$^{rd}$ low level of the first clock signal cks3_1 to the gate line GA10 through the 1$^{st}$ drive output end GO_1 so as to generate a low level in the gate scanning signal ga10_1. The shift register unit SR4 outputs a 3$^{rd}$ low level of the first clock signal cks4_1 to the gate line GA11 through the 2$^{nd}$ drive output end GO_2 so as to generate a low level in the gate scanning signal ga11_1. The shift register unit SR4 outputs a 4th low level of the first clock signal cks1_1 to the gate line GA12 through the 3$^{rd}$ drive output end GO_3 so as to generate a low level in the gate scanning signal ga12_1.

Moreover, as shown in FIG. 15, durations of the low levels of all the first clock signals cks1_1-cks4_1 are the same, and clock cycles ts11 of all the first clock signals cks1_1-cks4_1 are the same. The low levels of the first clock signals cks1_1-cks4_1 may be their active levels, and the high levels may be their inactive levels. Certainly, when the shift register unit outputs the high level of the first clock signal to generate a high-level signal, that controls the transistor to be turned on, in the gate scanning signal, the high level of the first clock signal may serve as its active level, and the low level of the first clock signal may serve as its inactive level.

Optionally, as shown in FIG. 15, the clock cycles ts11 of all the first clock signals cks1_1-cks4_1 may be 8H. Or, the clock cycle of each first clock signal may also be 4H. In practical applications, the specific value of the clock cycle of each first clock signal may be determined according to the needs of the practical applications, which is not limited here.

S20, at a second drive mode, in one display frame, a second clock signal is loaded for each clock signal line, a gate turn-on signal is loaded for a drive selection signal line coupled with an $m^{th}$ cascade output circuit, a gate turn-off signal is loaded for remaining drive selection signal lines, a gate turn-on signal is loaded for a cascade selection signal line coupled with an $m^{th}$ drive output circuit, the gate turn-off signal is loaded for the remaining cascade selection signal lines, all the shift register units are controlled to work sequentially, a signal of an $m^{th}$ drive node of the at least two drive nodes is provided to the cascade output end, the signal of the $m^{th}$ drive node is provided to the corresponding drive output end, and the plurality of gate lines are scanned in an interlaced mode. Optionally, a clock cycle of the second clock signal is different from that of the first clock signal.

In some embodiments of the present disclosure, M=3, step S20 may include: at the second drive mode, the same second clock signal is loaded for the first clock signal line and the third clock signal line, the same second clock signal is loaded for the second clock signal line and the fourth clock signal line, a gate turn-on signal is loaded for the first cascade selection signal line, a gate turn-off signal is loaded for both a second cascade selection signal line and a third cascade selection signal line, a gate turn-on signal is loaded for the first drive selection signal line, a gate turn-off signal is loaded for both the second drive selection signal line and the third drive selection signal line, all the shift register units are controlled to work sequentially, a signal of a $1^{st}$ drive node is provided to the cascade output end, the signal of the $1^{st}$ drive node is provided to a $1^{st}$ drive output end, and a gate line coupled with each first-color sub-pixel row is scanned, wherein the second clock signals loaded for the first clock signal line and the second clock signal end are different.

Exemplarily, the first-color sub-pixel row may be a red sub-pixel row. In this way, at the second drive mode, the same second clock signal is loaded for the first clock signal line and the third clock signal line, the same second clock signal is loaded for the second clock signal line and the fourth clock signal line, the gate turn-on signal is loaded for the first cascade selection signal line, the gate turn-off signal is loaded for both the second cascade selection signal line and the third cascade selection signal line, the gate turn-on signal is loaded for the first drive selection signal line, the gate turn-off signal is loaded for both the second drive selection signal line and the third drive selection signal line, all the shift register units are controlled to work sequentially, the signal of the $1^{st}$ drive node is provided to the cascade output end, the signal of the $1^{st}$ drive node is provided to the $1^{st}$ drive output end, and a gate line coupled with each red sub-pixel row is scanned. That is to say, at the second drive mode, in one display frame, the gate scanning signal may be output only to the gate coupled with the red sub-pixel row, so that a data voltage is only input to the red sub-pixels.

Figure 16A:
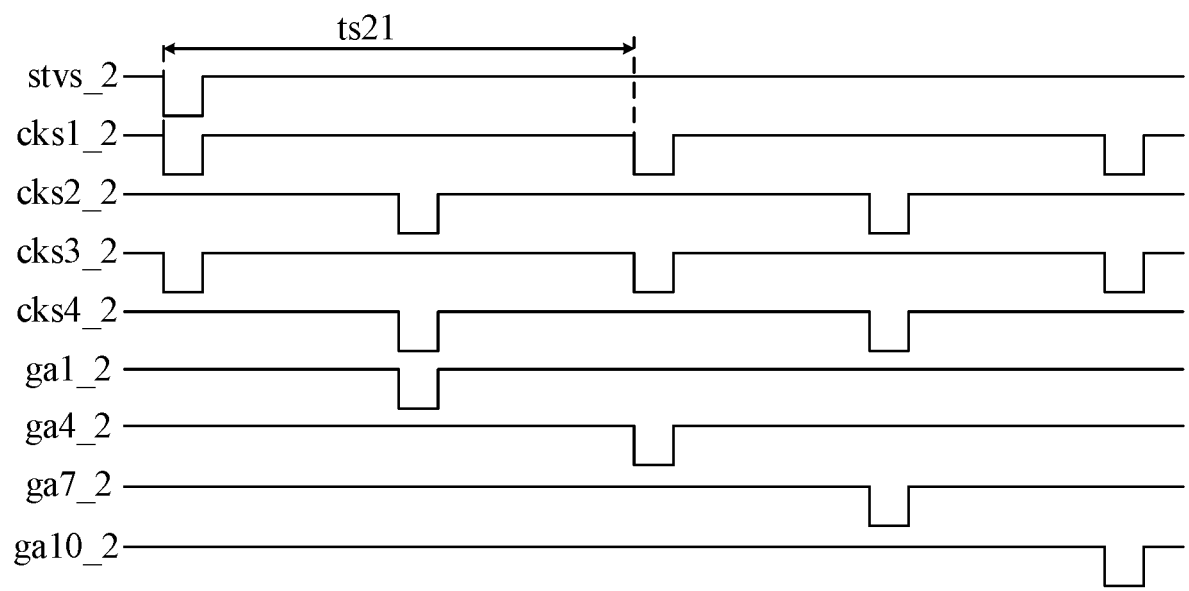
FIG. 16A is a diagram of some signal timings of a display apparatus at a second drive mode provided by an embodiment of the present disclosure.

Optionally, the clock cycle of the second clock signal may be not greater than 3/2 of the clock cycle of the first clock signal. Exemplarily, the clock cycle of the second clock signal may be equal to 3/2 of the clock cycle of the first clock signal. For example, as shown in FIG. 15 and FIG. 16A, the clock cycle ts11 of the first clock signals cks1_1-cks4_1 is 8H, and the clock cycle ts21 of the second clock signals cks1_2-cks4_2 may be 12H. Alternatively, the clock cycle of the second clock signal may also be equal to 1/2 of the clock cycle of the first clock signal. For example, as shown in FIG. 15 and FIG. 16A, the clock cycle ts11 of the first clock signals cks1_1-cks4_1 is 8H, and the clock cycle ts22 of the second clock signals cks1_2-cks4_2 may be 4H. The clock cycle of the first clock signal is 4H, and the clock cycle of the second clock signal may be 2H. Alternatively, the clock cycle of the second clock signal may also be equal to 1/4 of the clock cycle of the first clock signal. For example, as shown in FIG. 15 and FIG. 16C, the clock cycle ts11 of the first clock signals cks1_1-cks4_1 is 8H, and the clock cycle ts23 of the second clock signals cks1_2-cks4_2 may be 2H.

Certainly, in practical applications, when scanning only the gate line coupled with the first-color sub-pixel row in one display frame, a relationship between the clock cycle of the second clock signal loaded and the clock cycle of the first clock signal may be determined according to the needs of the practical applications, which is not limited here.

Figure 16B:
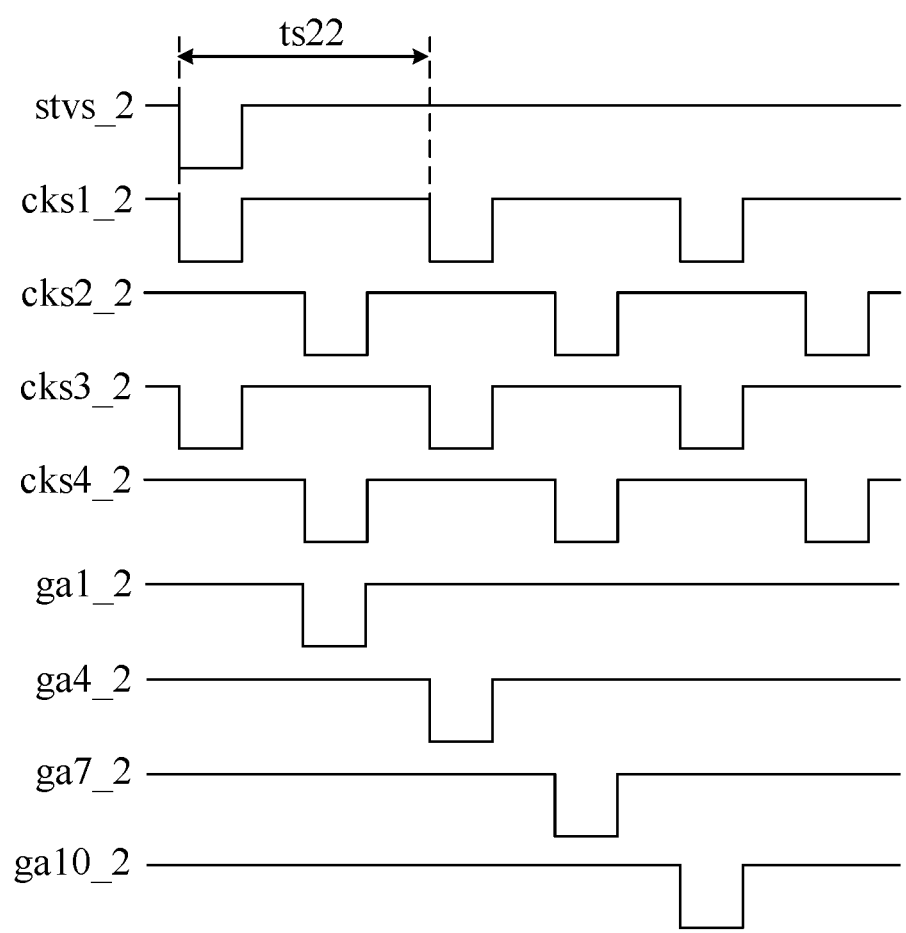
FIG. 16B is a diagram of some other signal timings of a display apparatus at a second drive mode provided by an embodiment of the present disclosure.
Figure 16C:
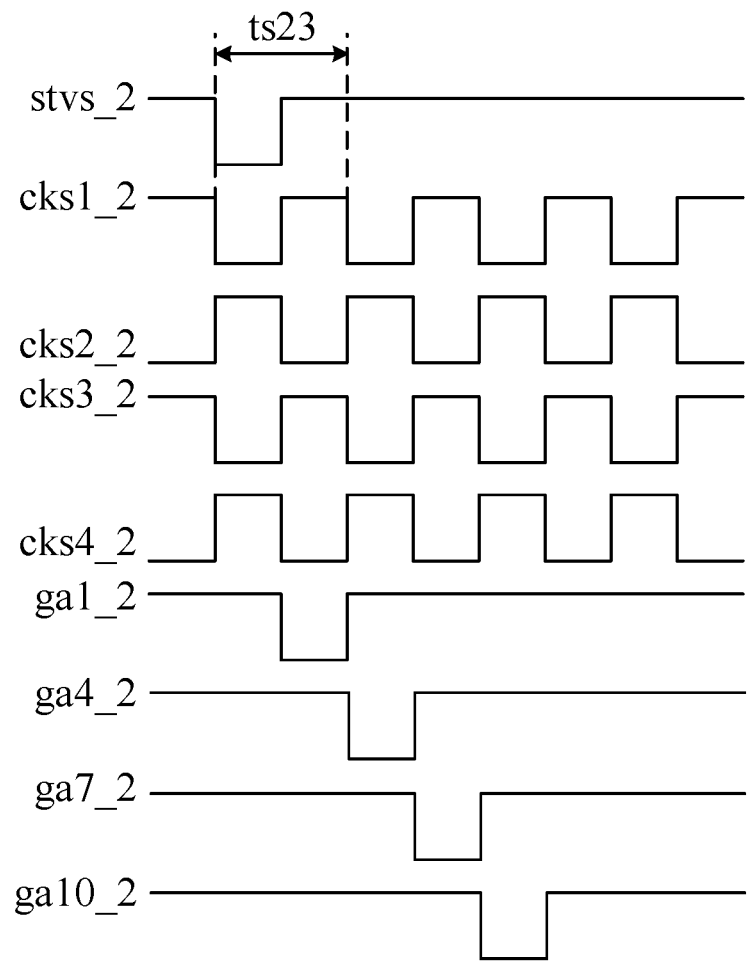
FIG. 16C is a diagram of yet some signal timings of a display apparatus at a second drive mode provided by an embodiment of the present disclosure.

Exemplarily, taking the structure of the shift register unit shown in FIG. 3 and the first-stage shift register unit to the fourth-stage shift register unit as an example, at the second drive mode and when scanning the gate line coupled with each red sub-pixel row, the corresponding signal timing diagram is shown in FIG. 16A-FIG. 16C. cks1_2 represents the second clock signal input to the first clock signal line CKS1, cks2_2 represents the second clock signal input to the second clock signal line CKS2, cks3_2 represents the second clock signal input to the third clock signal line CKS3, cks4_2 represents the second clock signal input to the fourth clock signal line CKS4, and stvs_2 represents a frame start signal input to a frame start signal line STVS_2. Moreover, a signal ga1_2 represents a gate scanning signal output by the gate drive circuit 110 to the gate line GA1, a signal ga4_2 represents a gate scanning signal output by the gate drive circuit 110 to the gate line GA4, . . . a signal ga7_2 represents a gate scanning signal output by the gate drive circuit 110 to the gate line GA7, and a signal ga10_2 represents a gate scanning signal output by the gate drive circuit 110 to the gate line GA10.

The low-level gate turn-on signal is loaded for the first drive selection signal line to control the $1^{st}$ second transistor M2_1 in each-stage shift register unit to be turned on. A high-level gate turn-off signal is loaded for the second drive selection signal line to control a $2^{nd}$ second transistor M2_2 in each-stage shift register unit to be turned off. A high-level gate turn-off signal is loaded for the third drive selection signal line to control a $3^{rd}$ second transistor M2_3 in each-stage shift register unit to be turned off. A low-level gate turn-on signal is loaded for the first cascade selection signal line to control the $1^{st}$ first transistor M1_1 in each-stage shift register unit to be turned on. The high-level gate turn-off signal is loaded for the second drive selection signal line to control the $2^{nd}$ first transistor M1_2 in each-stage shift register unit to be turned off. The high-level gate turn-off signal is loaded for the third drive selection signal line to control a $3^{rd}$ first transistor M1_3 in each-stage shift register unit to be turned off. Certainly, the gate turn-on signal may also be the high-level signal, and the gate turn-off signal may also be the low-level signal, which is not limited here.

Taking the low level as the active level of the gate scanning signal as an example, the signal stvs_2 is input into the input signal end INP of the shift register unit SR1, and the shift register unit SR1 outputs a $1^{st}$ low level of the second clock signal cks2_2 to the gate line GA1 through the $1^{st}$ drive output end GO_1 so as to generate a low level in the gate scanning signal ga1_2. The gate scanning signal ga1_2 is input into the input signal end INP of the shift register unit SR2, and the shift register unit SR2 outputs a $2^{nd}$ low level of the second clock signal cks1_2 to the gate line GA4 through the $1^{st}$ drive output end GO_1 so as to generate a low level in the gate scanning signal ga4_2. The gate scanning signal ga4_2 is input into the input signal end INP of the shift register unit SR3, and the shift register unit SR3 outputs a $2^{nd}$ low level of the second clock signal cks4_2 to the gate line GA7 through the $1^{st}$ drive output end GO_1 so as to generate a low level in the gate scanning signal ga7_2. The gate scanning signal ga7_2 is input into the input signal end INP of the shift register unit SR4, and the shift register unit SR4 outputs a $3^{rd}$ low level of the second clock signal cks3_2 to the gate line GA10 through the $1^{st}$ drive output end GO_1 so as to generate a low level in the gate scanning signal ga10_2.

Optionally, durations of the low levels of all the second clock signals cks1_2-cks4_2 are the same, and clock cycles of all the second clock signals cks1_2-cks4_2 are the same. The low levels of the second clock signals cks1_2-cks4_2 may be their active levels, and the high levels may be their inactive levels. Certainly, when the shift register unit outputs the high level of the second clock signal to generate the high-level signal, that controls the transistor turn-on, in the gate scanning signal, the high level of the second clock signal may serve as its active level, and the low level of the second clock signal may serve as its inactive level.

Optionally, as shown in FIG. 16A, the clock cycle ts21 of all the second clock signals cks1_2-cks4_2 may be 12H. As shown in FIG. 16B, the clock cycle ts22 of all the second clock signals cks1_2-cks4_2 may be 4H. As shown in FIG. 16C, the clock cycle ts23 of all the second clock signals cks1_2-cks4_2 may be 2H. In the embodiment of the present disclosure, the scan time of the gate line coupled with the red sub-pixel can be reduced by reducing the clock cycle of the second clock signal, thereby reducing the scan time of one display frame and improving refresh frequency.

In some other embodiments of the present disclosure, M=3, step S20 may include: at the second drive mode, the different second clock signals are loaded for the first clock signal line to the fourth clock signal line respectively, the gate turn-on signal is loaded for the second cascade selection signal line, the gate turn-off signal is loaded for both the first cascade selection signal line and the third cascade selection signal line, the gate turn-on signal is loaded for the second drive selection signal line, the gate turn-off signal is loaded for both the first drive selection signal line and the third drive selection signal line, all the shift register units are controlled to work sequentially, the signal of the $2^{nd}$ drive node is provided to the cascade output end, the signal of the $2^{nd}$ drive node is provided to the $2^{nd}$ drive output end, and the gate line coupled with each second-color sub-pixel row is scanned, wherein the second clock signal has two different clock cycles.

Exemplarily, the second-color sub-pixel row may be a green sub-pixel row. In this way, at the second drive mode, the different second clock signals are loaded for the first clock signal line to the fourth clock signal lines respectively, the gate turn-on signal is loaded for the second cascade selection signal line, the gate turn-off signal is loaded for both the first cascade selection signal line and the third cascade selection signal line, the gate turn-on signal is loaded for the second drive selection signal line, the gate turn-off signal is loaded for both the first drive selection signal line and the third drive selection signal line, all the shift register units are controlled to work sequentially, the signal of the $2^{nd}$ drive node is provided to the cascade output end, the signal of the $2^{nd}$ drive node is provided to the $2^{nd}$ drive output end, and a gate line coupled with each green sub-pixel row is scanned. That is to say, at the second drive mode, in one display frame, the gate scanning signal may be output only to the gate coupled with the green sub-pixel row, so that a data voltage is only input to the green sub-pixels.

Optionally, the two different clock cycles may include a first clock cycle and a second clock cycle. The first clock cycle is not greater than 3/4 of the clock cycle of the first clock signal, and the second clock cycle is not greater than 9/4 of the clock cycle of the first clock signal.

Figure 17A:
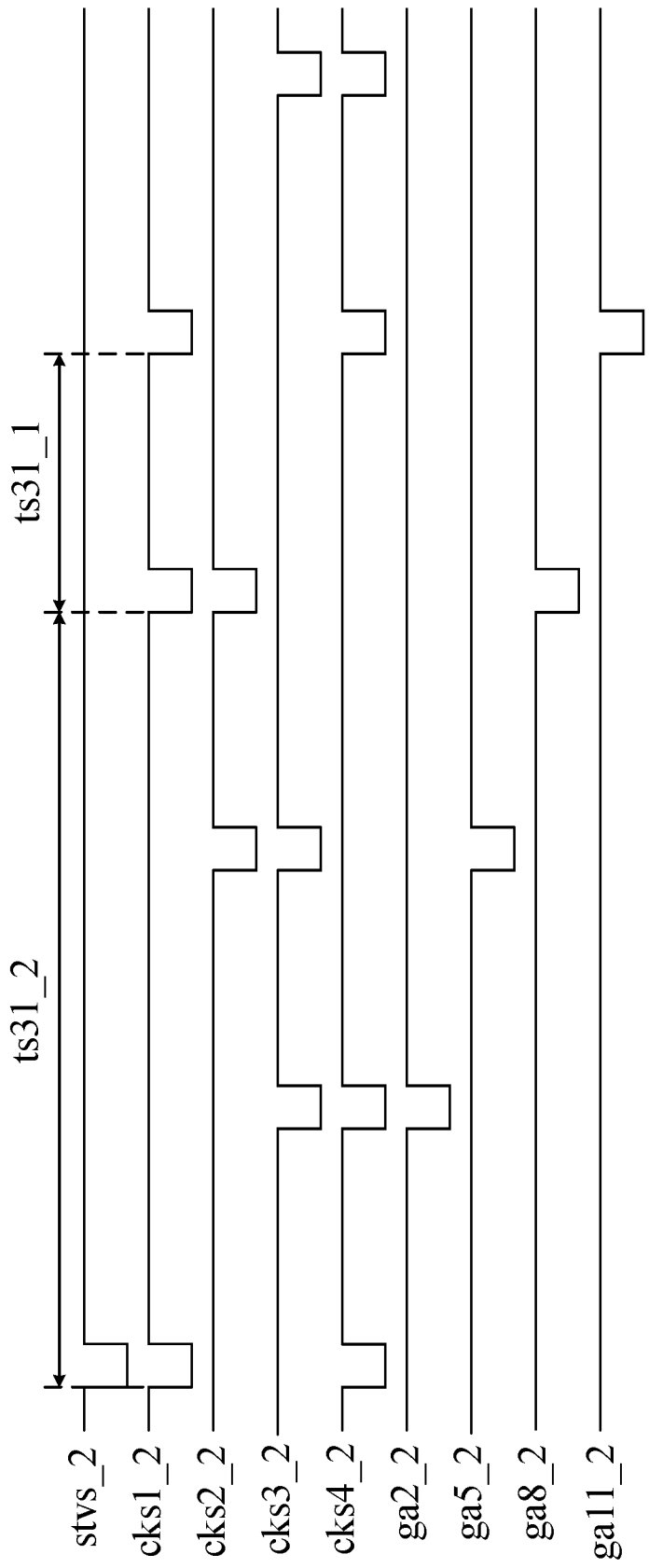
FIG. 17A is a diagram of yet some signal timings of a display apparatus at a second drive mode provided by an embodiment of the present disclosure.

Exemplarily, the first clock cycle may be equal to 3/4 of the clock cycle of the first clock signal, and the second clock cycle is equal to 9/4 of the clock cycle of the first clock signal. For example, as shown in FIG. 15 and FIG. 17A, the clock cycle ts11 of the first clock signals cks1_1-cks4_1 is 8H, the second clock cycle ts31_2 of the second clock signals cks1_2-cks4_2 may be 18H, and the first clock cycle ts31_1 is 6H. Or, the first clock cycle is equal to 2/3 of the clock cycle of the first clock signal, and the second clock cycle is equal to 3/2 of the clock cycle of the first clock signal. For example, as shown in FIG. 15 and FIG. 17B, the clock cycle ts11 of the first clock signals cks1_1-cks4_1 is 8H, the second clock cycle ts32_2 of the second clock signals cks1_2-cks4_2 may be 12H, and the first clock cycle ts32_1 is 4H.

Certainly, in practical applications, when scanning only the gate line coupled with the second-color sub-pixel row in one display frame, a relationship between the first clock cycle as well as the second clock cycle of the second clock signal loaded and the clock cycle of the first clock signal may be determined according to the needs of the practical applications, which is not limited here.

Figure 17B:
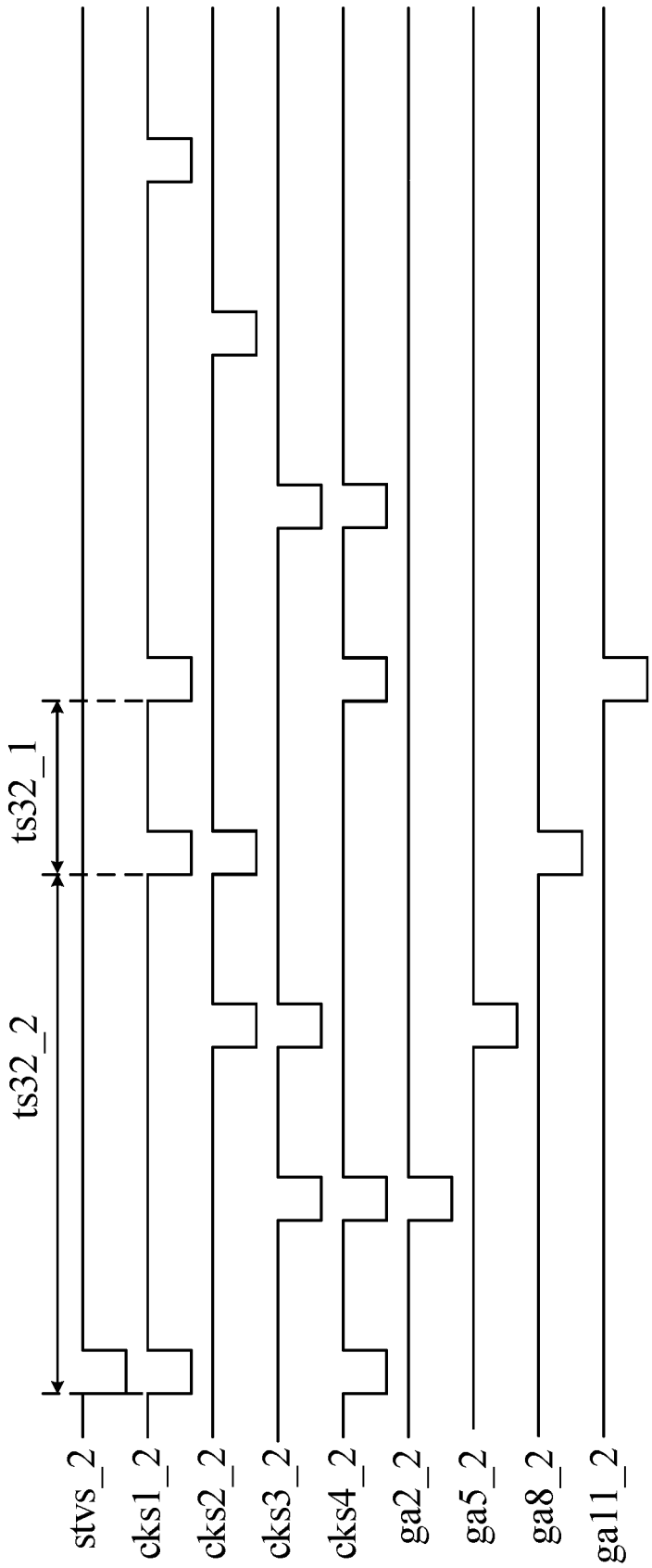
FIG. 17B is a diagram of yet some signal timings of a display apparatus at a second drive mode provided by an embodiment of the present disclosure.

Exemplarily, taking the structure of the shift register unit shown in FIG. 3 and the first-stage shift register unit to the fourth-stage shift register unit as an example, when at the second drive mode and when scanning the gate line coupled with each green sub-pixel row, the corresponding signal timing diagram is shown in FIG. 17A-FIG. 17B. cks1_2 represents the second clock signal input to the first clock signal line CKS1, cks2_2 represents the second clock signal input to the second clock signal line CKS2, cks3_2 represents the second clock signal input to the third clock signal line CKS3, cks4_2 represents the second clock signal input to the fourth clock signal line CKS4, and stvs_2 represents the frame start signal input to the frame start signal line STVS_2. Moreover, a signal ga2_2 represents a gate scanning signal output by the gate drive circuit 110 to the gate line GA2, a signal ga5_2 represents a gate scanning signal output by the gate drive circuit 110 to the gate line GA5, . . . a signal ga8_2 represents a gate scanning signal output by the gate drive circuit 110 to the gate line GA8, and a signal ga11_2 represents a gate scanning signal output by the gate drive circuit 110 to the gate line GA11.

The low-level gate turn-on signal is loaded for the second drive selection signal line to control the $2^{nd}$ second transistor M2_2 in each-stage shift register unit to be turned on. The high-level gate turn-off signal is loaded for the first drive selection signal line to control the $1^{st}$ second transistor M2_1 in each-stage shift register unit to be turned off. The high-level gate turn-off signal is loaded for the third drive selection signal line to control the $3^{rd}$ second transistor M2_3 in each-stage shift register unit to be turned off. The low-level gate turn-on signal is loaded for the second cascade selection signal line to control the $2^{nd}$ first transistor M1_2 in each-stage shift register unit to be turned on. The high-level gate turn-off signal is loaded for the first drive selection signal line to control the $1^{st}$ first transistor M1_1 in each-stage shift register unit to be turned off. The high-level gate turn-off signal is loaded for the third drive selection signal line to control the $3^{rd}$ first transistor M1_3 in each-stage shift register unit to be turned off. Certainly, the gate turn-on signal may also be the high-level signal, and the gate turn-off signal may also be the low-level signal, which is not limited here.

Taking the low level as the active level of the gate scanning signal as an example, the signal stvs_2 is input into the input signal end INP of the shift register unit SR1, and the shift register unit SR1 outputs the $1^{st}$ low level of the second clock signal cks3_2 to the gate line GA2 through the $2^{nd}$ drive output end GO_2 so as to generate a low level in a gate scanning signal ga2_2. The gate scanning signal ga2_2 is input into the input signal end INP of the shift register unit SR2, and the shift register unit SR2 outputs the $2^{nd}$ low level of the second clock signal cks2_2 to the gate line GA5 through the $2^{nd}$ drive output end GO_2 so as to generate a low level in a gate scanning signal ga5_2. The gate scanning signal ga5_2 is input into the input signal end INP of the shift register unit SR3, and the shift register unit SR3 outputs the $2^{nd}$ low level of the second clock signal cks1_2 to the gate line GA8 through the $2^{nd}$ drive output end GO_2 so as to generate a low level in a gate scanning signal ga8_2. The gate scanning signal ga8_2 is input into the input signal end INP of the shift register unit SR4, and the shift register unit SR4 outputs the $3^{rd}$ low level of the second clock signal cks4_2 to the gate line GA11 through the $2^{nd}$ drive output end GO_2 so as to generate a low level in a gate scanning signal ga11_2.

Optionally, durations of the low levels of all the second clock signals cks1_2-cks4_2 are the same, the first clock cycles of all the second clock signals cks1_2-cks4_2 are the same, and the second clock cycles are the same. The low levels of the second clock signals cks1_2-cks4_2 may be their active levels, and the high levels may be their inactive levels. Certainly, when the shift register unit outputs the high level of the second clock signal to generate the high-level signal, that controls the transistor turn-on, in the gate scanning signal, the high level of the second clock signal may serve as its active level, and the low level of the second clock signal may serve as its inactive level.

Optionally, as shown in FIG. 17A, the second clock cycle ts31_2 of all the second clock signal cks1_2-cks4_2 may be 18H, and the first clock cycle ts31_1 may be 6H. As shown in FIG. 17B, the second clock cycle ts32_2 of all the second clock signals cks1_2-cks4_2 may be 12H, and the first clock cycle ts32_1 may be 4H. In the embodiment of the present disclosure, the scan time of the gate line coupled with the green sub-pixel can be reduced by reducing the first clock cycle and the second clock cycle, thereby reducing the scan time of one display frame and improving refresh frequency.

In yet some embodiments of the present disclosure, M=3, step S20 may include: at the second drive mode, the different second clock signals are loaded for the first clock signal line to the fourth clock signal line respectively, a gate turn-on signal is loaded for a third cascade selection signal line, the gate turn-off signal is loaded for both the first cascade selection signal line and the second cascade selection signal line, the gate turn-on signal is loaded for the third drive selection signal line, the gate turn-off signal is loaded for both the first drive selection signal line and the second drive selection signal line, all the shift register units are controlled to work sequentially, a signal of a $3^{rd}$ drive node is provided to the cascade output end, the signal of the $3^{rd}$ drive node is provided to the $3^{rd}$ drive output end, and a gate line coupled with each third-color sub-pixel row is scanned.

Exemplarily, the third-color sub-pixel row may be a blue sub-pixel row. In this way, at the second drive mode, the different second clock signals are loaded for the first clock signal line to the fourth clock signal lines respectively, the gate turn-on signal is loaded for the third cascade selection signal line, the gate turn-off signal is loaded for both the first cascade selection signal line and the second cascade selection signal line, the gate turn-on signal is loaded for the third drive selection signal line, the gate turn-off signal is loaded for both the first drive selection signal line and the second drive selection signal line, all the shift register units are controlled to work sequentially, the signal of the $3^{rd}$ drive node is provided to the cascade output end, the signal of the $3^{rd}$ drive node is provided to the $3^{rd}$ drive output end, and a gate line coupled with each third-color sub-pixel row is scanned. That is to say, at the second drive mode, in one display frame, the gate scanning signal may be output only to the gate coupled with the blue sub-pixel row, so that a data voltage is only input to the blue sub-pixels.

Figure 18A:
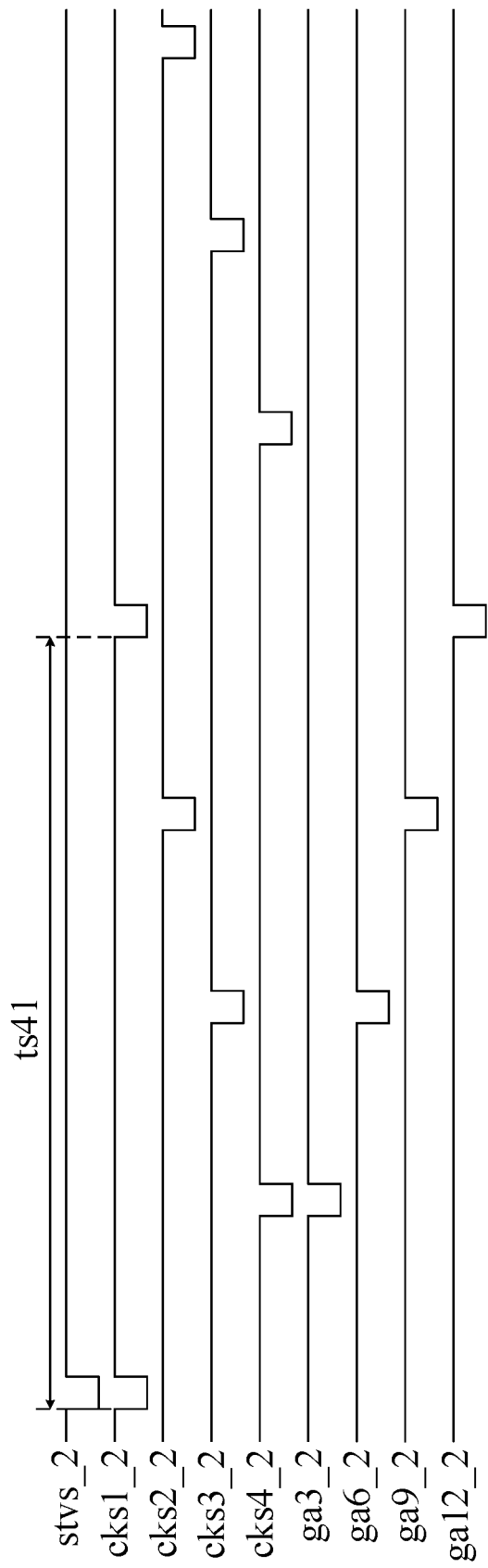
FIG. 18A is a diagram of yet some signal timings of a display apparatus at a second drive mode provided by an embodiment of the present disclosure.

Optionally, the second clock cycle may be not greater than three times the clock cycle of the first clock signal. Exemplarily, the second clock cycle may be equal to three times the clock cycle of the first clock signal. For example, as shown in FIG. 15 and FIG. 18A, the clock cycle ts11 of the first clock signals cks1_1-cks4_1 is 8H, and the clock cycle ts41 of the second clock signals cks1_2-cks4_2 may be 24H. Alternatively, the second clock cycle may also be equal to two times of the clock cycle of the first clock signal. For example, the clock cycle of the first clock signals cks1_1-cks4_1 is 8H, and the clock cycle of the second clock signals cks1_2-cks4_2 may be 16H. Alternatively, the second clock cycle may also be equal to 1/2 of the clock cycle of the first clock signal. For example, as shown in FIG. 15 and FIG. 18B, the clock cycle ts11 of the first clock signals cks1_1-cks4_1 is 8H, and the clock cycle ts42 of the second clock signals cks1_2-cks4_2 may be 4H.

Certainly, in practical applications, when scanning only the gate line coupled with the third-color sub-pixel row in one display frame, a relationship between the clock cycle of the second clock signal loaded and the clock cycle of the first clock signal may be determined according to the needs of the practical applications, which is not limited here.

Figure 18B:
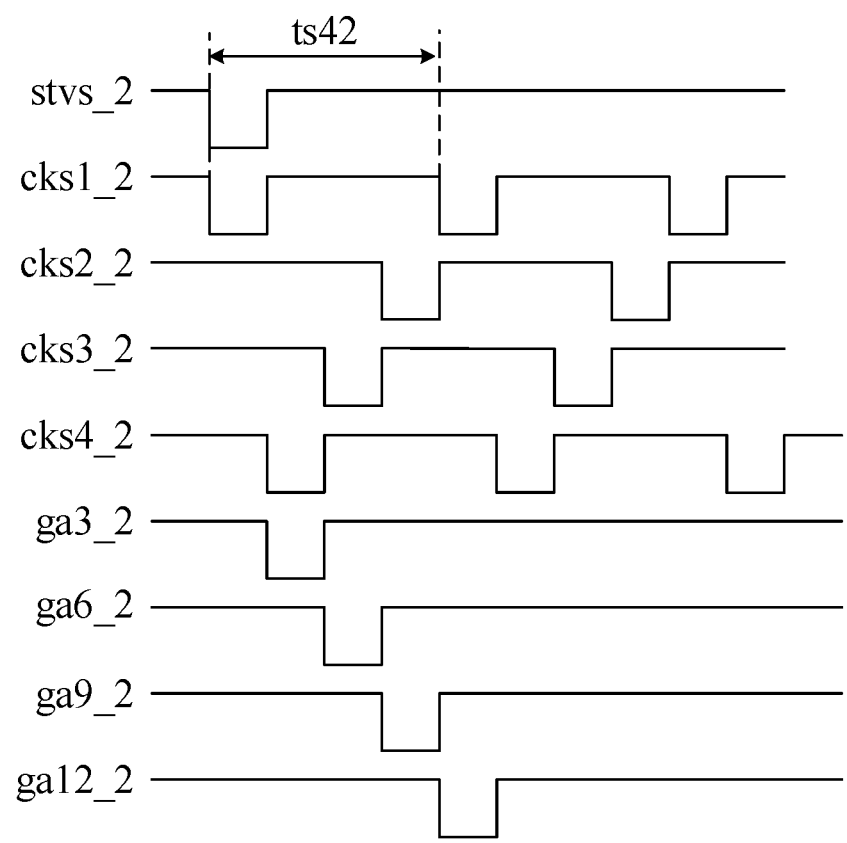
FIG. 18B is a diagram of yet some signal timings of a display apparatus at a second drive mode provided by an embodiment of the present disclosure.

Exemplarily, taking the structure of the shift register unit shown in FIG. 3 and the first-stage shift register unit to the fourth-stage shift register unit as an example, when at the second drive mode and when scanning the gate line coupled with each red sub-pixel row, the corresponding signal timing diagram is shown in FIG. 18A-FIG. 18B. cks1_2 represents the second clock signal input to the first clock signal line CKS1, cks2_2 represents the second clock signal input to the second clock signal line CKS2, cks3_2 represents the second clock signal input to the third clock signal line CKS3, cks4_2 represents the second clock signal input to the fourth clock signal line CKS4, and stvs_2 represents the frame start signal input to the frame start signal line STVS_2. Moreover, a signal ga3_2 represents a gate scanning signal output by the gate drive circuit 110 to the gate line GA3, a signal ga6_2 represents a gate scanning signal output by the gate drive circuit 110 to the gate line GA6, . . . a signal ga9_2 represents a gate scanning signal output by the gate drive circuit 110 to the gate line GA9, and a signal ga12_2 represents a gate scanning signal output by the gate drive circuit 110 to the gate line GA12.

The low-level gate turn-on signal is loaded for the third drive selection signal line to control the $3^{rd}$ second transistor M2_3 in each-stage shift register unit to be turned on. The high-level gate turn-off signal is loaded for the second drive selection signal line to control the $2^{nd}$ second transistor M2_2 in each-stage shift register unit to be turned off. The high-level gate turn-off signal is loaded for the first drive selection signal line to control the $1^{st}$ second transistor M2_1 in each-stage shift register unit to be turned off. The low-level gate turn-on signal is loaded for the third cascade selection signal line to control the $3^{rd}$ first transistor M1_3 in each-stage shift register unit to be turned on. The high-level gate turn-off signal is loaded for the second drive selection signal line to control the $2^{nd}$ first transistor M1_2 in each-stage shift register unit to be turned off. The high-level gate turn-off signal is loaded for the first drive selection signal line to control the $1^{st}$ first transistor M1_1 in each-stage shift register unit to be turned off. Certainly, the gate turn-on signal may also be the high-level signal, and the gate turn-off signal may also be the low-level signal, which is not limited here.

Taking the low level as the active level of the gate scanning signal as an example, the signal stvs_2 is input into the input signal end INP of the shift register unit SR1, and the shift register unit SR1 outputs the $1^{st}$ low level of the second clock signal cks4_2 to the gate line GA3 through the $3^{rd}$ drive output end GO_3 so as to generate a low level in a gate scanning signal ga3_2. The gate scanning signal ga3_2 is input into the input signal end INP of the shift register unit SR2, and the shift register unit SR2 outputs the $1^{st}$ low level of the second clock signal cks3_2 to the gate line GA6 through the $3^{rd}$ drive output end GO_3 so as to generate a low level in a gate scanning signal ga6_2. The gate scanning signal ga6_2 is input into the input signal end INP of the shift register unit SR3, and the shift register unit SR3 outputs the $1^{st}$ low level of the second clock signal cks2_2 to the gate line GA9 through the $3^{rd}$ drive output end GO_3 so as to generate a low level in a gate scanning signal ga9_2. The gate scanning signal ga9_2 is input into the input signal end INP of the shift register unit SR4, and the shift register unit SR4 outputs the $2^{nd}$ low level of the second clock signal cks1_2 to the gate line GA12 through the $3^{rd}$ drive output end GO_3 so as to generate a low level in a gate scanning signal ga12_2.

Optionally, the durations of the low levels of all the second clock signals cks1_2-cks4_2 are the same, and the clock cycles of all the second clock signals cks1_2-cks4_2 are the same. The low levels of the second clock signals cks1_2-cks4_2 may be their active levels, and the high levels may be their inactive levels. Certainly, when the shift register unit outputs the high level of the second clock signal to generate the high-level signal, that controls the transistor turn-on, in the gate scanning signal, the high level of the second clock signal may serve as its active level, and the low level of the second clock signal may serve as its inactive level.

Optionally, as shown in FIG. 18A, the clock cycle ts41 of all the second clock signals cks1_2-cks4_2 may be 24H. As shown in FIG. 18B, the clock cycle ts42 of all the second clock signals cks1_2-cks4_2 may be 4H. In the embodiment of the present disclosure, the scan time of the gate line coupled with the blue sub-pixel can be reduced by reducing the clock cycle of the second clock signal, thereby reducing the scan time of one display frame and improving refresh frequency.

In some embodiments of the present disclosure, the duration of the active level of the second clock signal in one clock cycle is not less than the duration of the active level of the first clock signal in one clock cycle. Exemplarily, the duration of the active level of the second clock signal in one clock cycle may be equal to the duration of the active level of the first clock signal in one clock cycle. For example, corresponding to a situation when the gate line coupled with the first-color sub-pixel row is scanned, the duration of the active level of the second clock signal in one clock cycle is equal to the duration of the active level of the first clock signal in one clock cycle; corresponding to a situation when the gate line coupled with the second-color sub-pixel row is scanned, the duration of the active level of the second clock signal in one clock cycle is equal to the duration of the active level of the first clock signal in one clock cycle; and corresponding to a situation when the gate line coupled with the third-color sub-pixel row is scanned, the duration of the active level of the second clock signal in one clock cycle is equal to the duration of the active level of the first clock signal in one clock cycle. Alternatively, corresponding to the situation when the gate line coupled with the first-color sub-pixel row is scanned, the duration of the active level of the second clock signal in one clock cycle is greater than the duration of the active level of the first clock signal in one clock cycle; corresponding to the situation when the gate line coupled with the second-color sub-pixel row is scanned, the duration of the active level of the second clock signal in one clock cycle is equal to the duration of the active level of the first clock signal in one clock cycle; and corresponding to the situation when the gate line coupled with the third-color sub-pixel row is scanned, the duration of the active level of the second clock signal in one clock cycle is equal to the duration of the active level of the first clock signal in one clock cycle. In this way, a charging rate of the red sub-pixels may be increased.

In some embodiments of the present disclosure, a working process of the second drive mode may be executed for the same-color sub-pixel in each of the plurality of display frames. Exemplarily, in each of the plurality of display frames, a working process of scanning the gate line coupled with each red sub-pixel row may be executed to charge the red sub-pixels to realize display of a red picture. Or, in each of the plurality of display frames, a working process of scanning the gate line coupled with each green sub-pixel row may be executed to charge the green sub-pixels to realize display of a green picture. Or, in each of the plurality of display frames, a working process of scanning the gate line coupled with each blue sub-pixel row may be executed to charge the blue sub-pixels to realize display of a blue picture.

In some embodiments of the present disclosure, the working process of the second drive mode may be executed for the sub-pixels of different colors in the plurality of adjacent display frames of the plurality of display frames. Exemplarily, the working process of the second drive mode may be executed in an order of the red sub-pixels, the green sub-pixels and the blue sub-pixels in the plurality of display frames. For example, the plurality of display frames may include: a $(q-1)^{th}$ display frame Fq-1, a $q^{th}$ display frame Fq, and a $(q+1)^{th}$ display frame Fq+1. In the $(q-1)^{th}$ display frame Fq-1, the working process of scanning the gate line coupled with each red sub-pixel row is executed to charge the red sub-pixels. In the $q^{th}$ display frame Fq, the working process of scanning the gate line coupled with each green sub-pixel row is executed to charge the green sub-pixels. In the $(q+1)^{th}$ display frame Fq+1, the working process of scanning the gate line coupled with each blue sub-pixel row is executed to charge the blue sub-pixels.

The skilled in the art should understand that the embodiment of the present disclosure may be provided as a method, a system or a computer program product. Therefore, the present disclosure may adopt forms of full hardware embodiments, full software embodiments, or embodiments combining software and hardware aspects. Moreover, the present disclosure may adopt a form of the computer program products implemented on one or more computer available storage mediums (may include but not limited to a disk memory, a CD-ROM, an optical memory and the like) containing computer available program codes.

The present disclosure is described with reference to flow diagrams and/or block diagrams of the methods, the devices (systems), and computer program products according to the embodiments of the present disclosure. It should be understood that each flow and/or block in the flow diagrams and/or the block diagrams and combinations of the flows and/or the blocks in the flow diagrams and/or the block diagrams can be implemented by computer program instructions. These computer program instructions may be provided to a processor of a general-purpose computer, a special-purpose computer, an embedded processing machine or other programmable data processing devices to generate a machine, such that the instructions, when executed by the processor of the computer or other programmable data processing devices, generate an apparatus for implementing functions specified in one or more flows in the flow diagrams and/or one or more blocks in the block diagrams.

These computer program instructions may also be stored in a computer readable memory which can guide the computer or other programmable data processing devices to work in a specific mode, thus the instructions stored in the computer readable memory generate an article of manufacture that may include a commander apparatus that implements the functions specified in one or more flows in the flow diagrams and/or one or more blocks in the block diagrams.

These computer program instructions may also be loaded to the computer or other programmable data processing devices, so that a series of operating steps are executed on the computer or other programmable devices to generate computer-implemented processing, such that the instructions executed on the computer or other programmable devices provide steps for implementing the functions specified in one or more flows in the flow diagrams and/or one or more blocks in the block diagrams.

Although the preferred embodiments of the present disclosure have been described, those skilled in the art can make additional alterations and modifications on these embodiments once they know the basic creative concept. Therefore, the appended claims intend to be explained as including the preferred embodiments and all alterations and modifications falling within the scope of the present disclosure.

Apparently, those skilled in the art can make various modifications and variations to the embodiment of the present disclosure without departing from the spirit and scope of the embodiment of the present disclosure. In this way, if these modifications and variations of the embodiments of the present disclosure fall within the scope of the claims of the present disclosure and their equivalent art, the present disclosure also intends to include these modifications and variations.

What is claimed is:

1. A shift register unit, comprising:
a first control circuit, configured to control a signal of a first node and a signal of a second node according to a signal of an input signal end and a signal of a first clock signal end;
second control circuits, configured to control signals of at least two drive nodes according to the signal of the first node, the signal of the second node and signals of second clock signal ends;
cascade output circuits, configured to provide the signal of one of the at least two drive nodes to a cascade output end according to cascade selection signal ends; and
drive output circuits, configured to provide the signal of at least one of the at least two drive nodes to drive output ends corresponding to the drive nodes according to drive selection signal ends;
wherein the drive nodes comprise M drive nodes, the second clock signal ends comprise M second clock signal ends, the drive output ends comprise M drive output ends, and M is an integer greater than 1;
the second control circuits comprise M second control circuits, wherein, an $m^{th}$ second control circuit among the M second control circuits corresponds to an $m^{th}$ drive node among the M drive nodes, and the $m^{th}$ second control circuit corresponds to an $m^{th}$ second clock signal end among the M second clock signal ends; the $m^{th}$ second control circuit is configured to provide a signal of the $m^{th}$ second clock signal end to the $m^{th}$ drive node in response to the signal of the first node, and provide a signal of a first reference signal end to the $m^{th}$ drive node in response to the signal of the second node; and $1 \leq m \leq M$, and m is an integer;
the cascade output circuits comprise M cascade output circuits, and the cascade selection signal ends comprise M cascade selection signal ends; an $m^{th}$ cascade output circuit among the M cascade output circuits corresponds to the $m^{th}$ drive node, and the $m^{th}$ cascade output circuit corresponds to an $m^{th}$ cascade selection signal end among the M cascade selection signal ends; and the $m^{th}$ cascade output circuit is configured to provide a signal of the $m^{th}$ drive node to the cascade output end in response to a signal of the $m^{th}$ cascade selection signal end; and
the drive output circuits comprise M drive output circuits, and the drive selection signal ends comprise M drive selection signal ends; an $m^{th}$ drive output circuit among the M drive output circuits corresponds to the $m^{th}$ drive node, and the $m^{th}$ drive output circuit corresponds to an $m^{th}$ drive selection signal end among the M drive selection signal ends; and the $m^{th}$ drive output circuit is configured to provide the signal of the $m^{th}$ drive node to an $m^{th}$ drive output end in response to a signal of the $m^{th}$ drive selection signal end.

2. The shift register unit according to claim 1, wherein the $m^{th}$ cascade output circuit comprises: an $m^{th}$ first transistor; and
a control electrode of the $m^{th}$ first transistor is coupled with the $m^{th}$ cascade selection signal end, a first electrode of the $m^{th}$ first transistor is coupled with the $m^{th}$ drive node, and a second electrode of the $m^{th}$ first transistor is coupled with the cascade output end.

3. The shift register unit according to claim 1, wherein the $m^{th}$ drive output circuit comprises: an $m^{th}$ second transistor; and
a control electrode of the $m^{th}$ second transistor is coupled with the $m^{th}$ drive selection signal end, a first electrode of the $m^{th}$ second transistor is coupled with the $m^{th}$ drive node, and a second electrode of the $m^{th}$ second transistor is coupled with the drive output end.

4. The shift register unit according to claim 1, wherein the $m^{th}$ second control circuit comprises: an $m^{th}$ third transistor, an $m^{th}$ fourth transistor and an $m^{th}$ first capacitor;
a control electrode of the $m^{th}$ third transistor is coupled with the first node, a first electrode of the $m^{th}$ third transistor is coupled with the $m^{th}$ second clock signal end, and a second electrode of the $m^{th}$ third transistor is coupled with the $m^{th}$ drive node;
a control electrode of the $m^{th}$ fourth transistor is coupled with the second node, a first electrode of the $m^{th}$ fourth transistor is coupled with the first reference signal end, and a second electrode of the m$^{th}$ fourth transistor is coupled with the m$^{th}$ drive node; and a first electrode plate of the m$^{th}$ first capacitor is coupled with the first node, and a second electrode plate of the m$^{th}$ first capacitor is coupled with the m$^{th}$ drive node.

5. The shift register unit according to claim 4, wherein the m$^{th}$ second control circuit further comprises: an m$^{th}$ fifth transistor; the control electrode of the m$^{th}$ third transistor is coupled with the first node through the m$^{th}$ fifth transistor; a first electrode of the m$^{th}$ fifth transistor is coupled with the first node, and a second electrode of the m$^{th}$ fifth transistor is coupled with the control electrode of the m$^{th}$ third transistor;

when m=1, a control electrode of the m$^{th}$ fifth transistor is coupled with a second reference signal end; and when 1<m≤M, the control electrode of the m$^{th}$ fifth transistor is coupled with the first clock signal end.

6. The shift register unit according to claim 1, wherein the first control circuit comprises: an input circuit and a node control circuit;

the input circuit is configured to provide the signal of the input signal end to the first node in response to the signal of the first clock signal end; and the node control circuit is configured to provide a signal of the second reference signal end to the second node in response to the signal of the first clock signal end, provide the signal of the first clock signal end to the second node in response to the signal of the first node, and provide the signal of the first reference signal end to the first node in response to the signal of the second node and a signal of a 1$^{st}$ second clock signal end.

7. The shift register unit according to claim 6, wherein the input circuit comprises: a sixth transistor; a control electrode of the sixth transistor is coupled with the first clock signal end, a first electrode of the sixth transistor is coupled with the input signal end, and a second electrode of the sixth transistor is coupled with the first node; and the node control circuit includes: a seventh transistor, an eighth transistor, a ninth transistor, a tenth transistor and a second capacitor, wherein a control electrode of the seventh transistor is coupled with the first clock signal end, a first electrode of the seventh transistor is coupled with the second reference signal end, and a second electrode of the seventh transistor is coupled with the second node; a control electrode of the eighth transistor is coupled with the first node, a first electrode of the eighth transistor is coupled with the first clock signal end, and a second electrode of the eighth transistor is coupled with the second node; a control electrode of the ninth transistor is coupled with the second node, a first electrode of the ninth transistor is coupled with the first reference signal end, and a second electrode of the ninth transistor is coupled with a first electrode of the tenth transistor; a control electrode of the tenth transistor is coupled with the 1$^{st}$ second clock signal end, and a second electrode of the tenth transistor is coupled with the first node; and a first electrode plate of the second capacitor is coupled with the second node, and a second electrode plate of the second capacitor is coupled with the first reference signal end.

8. A gate drive circuit, comprising multiple cascaded shift register units according to claim 1, wherein:

an input signal end of a first-stage shift register unit is coupled with a frame start signal line; and in every two adjacent stages of shift register units, an input signal end of a next-stage shift register unit is coupled with a cascade output end of a previous-stage shift register unit.

9. A display apparatus, comprising a display panel, wherein the display panel comprises: a plurality of gate lines, a plurality of clock signal lines, a plurality of cascade selection signal lines, a plurality of drive selection signal lines and the gate drive circuit according to claim 8;

drive output ends of shift register units in the gate drive circuit are coupled with the plurality of gate lines in a one-to-one correspondence mode, and one shift register unit in the gate drive circuit is coupled with the plurality of clock signal lines;

cascade selection signal ends of the shift register units in the gate drive circuit are coupled with the cascade selection signal lines; and drive selection signal ends of the shift register units in the gate drive circuit are coupled with the drive selection signal lines.

10. The display apparatus according to claim 9, wherein the display panel further comprises a plurality of pixel units arranged in an array, and one row of pixel units corresponds to one shift register unit in the gate drive circuit;

each of pixel units comprises a plurality of sub-pixels of different colors arranged in a column direction, and one row of sub-pixels is coupled with one gate line; and an m$^{th}$ drive output end of each of the shift register units is coupled with a gate line corresponding to sub-pixels of the same color.

11. The display apparatus according to claim 10, wherein M=3, and each pixel unit comprises a first-color sub-pixel, a second-color sub-pixel and a third-color sub-pixel arranged in sequence in the column direction;

the plurality of clock signal lines comprise a first clock signal line, a second clock signal line, a third clock signal line and a fourth clock signal line; a first clock signal end of a (4k_3)$^{th}$-stage shift register unit, a 1$^{st}$ second clock signal end of a (4k_2)$^{th}$-stage shift register unit, a 2$^{nd}$ second clock signal end of a (4k_1)$^{th}$-stage shift register unit and a 3rd second clock signal end of a (4k)$^{th}$-stage shift register unit are all coupled with the first clock signal line; a 1$^{st}$ second clock signal end of the (4k_3)$^{th}$-stage shift register unit, a 2$^{nd}$ second clock signal end of the (4k_2)$^{th}$-stage shift register unit, a 3$^{rd}$ second clock signal end of the (4k_1)$^{th}$-stage shift register unit and a first clock signal end of the (4k)$^{th}$-stage shift register unit are all coupled with the second clock signal line; a 2$^{nd}$ second clock signal end of the (4k_3)$^{th}$-stage shift register unit, a 3$^{rd}$ second clock signal end of the (4k_2)$^{th}$-stage shift register unit, a first clock signal end of the (4k_1)$^{th}$-stage shift register unit and a 1$^{st}$ second clock signal end of the (4k)$^{th}$-stage shift register unit are all coupled with the third clock signal line; a 3$^{rd}$ second clock signal end of the (4k_3)$^{th}$-stage shift register unit, a first clock signal end of the (4k_2)$^{th}$-stage shift register unit, a 1$^{st}$ second clock signal end of the (4k_1)$^{th}$-stage shift register unit and a 2$^{nd}$ second clock signal end of the (4k)$^{th}$-stage shift register unit are all coupled with the fourth clock signal line; and k is an integer greater than 0;

the plurality of cascade selection signal lines include a first cascade selection signal line, a second cascade selection signal line and a third cascade selection signal line; and a 1$^{st}$ cascade selection signal end of each-stage shift register unit is coupled with the first cascade selection signal line, a 2$^{nd}$ cascade selection signal end of each-stage shift register unit is coupled with the second cascade selection signal line, and a $3^{rd}$ cascade selection signal end of each-stage shift register unit is coupled with the third cascade selection signal line; and the plurality of drive selection signal lines include a first drive selection signal line, a second drive selection signal line and a third drive selection signal line; and a $1^{st}$ drive selection signal end of each-stage shift register unit is coupled with the first drive selection signal line, a $2^{nd}$ drive selection signal end of each-stage shift register unit is coupled with the second drive selection signal line, and a $3^{rd}$ drive selection signal end of each-stage shift register unit is coupled with the third drive selection signal line.

12. A driving method for the display apparatus according to claim 9, comprising:

at a first drive mode, in one display frame, loading different first clock signals for the clock signal lines, loading a gate turn-on signal for each of the drive selection signal lines, loading a gate turn-on signal for a cascade selection signal line coupled with an $M^{th}$ drive output circuit, loading a gate turn-off signal for remaining cascade selection signal lines, controlling the shift register units to work sequentially, providing a signal of an $M^{th}$ drive node of at least two drive nodes to the cascade output end, providing a signal of each of the at least two drive nodes to a drive output end corresponding to each drive node, and scanning the plurality of gate lines row by row; and at a second drive mode, in one display frame, loading a second clock signal for each of the clock signal lines, loading a gate turn-on signal for a drive selection signal line coupled with an $m^{th}$ cascade output circuit, loading a gate turn-off signal for remaining drive selection signal lines, loading a gate turn-on signal for a cascade selection signal line coupled with an $m^{th}$ drive output circuit, loading a gate turn-off signal for remaining cascade selection signal lines, controlling the shift register units to work sequentially, providing a signal of an $m^{th}$ drive node of the at least two drive nodes to the cascade output end, providing the signal of the $m^{th}$ drive node to the corresponding drive output end, and scanning the plurality of gate lines in an interlaced mode, wherein a clock cycle of the second clock signal is different from a clock cycle of the first clock signal.

13. The driving method for the display apparatus according to claim 12, wherein, M=3, and the driving method further comprises:

at the second drive mode, loading the same second clock signal for a first clock signal line and a third clock signal line, loading the same second clock signal for a second clock signal line and a fourth clock signal line, loading a gate turn-on signal for a first cascade selection signal line, loading a gate turn-off signal for both a second cascade selection signal line and a third cascade selection signal line, loading a gate turn-on signal for a first drive selection signal line, loading a gate turn-off signal for both a second drive selection signal line and a third drive selection signal line, controlling the shift register units to work sequentially, providing a signal of a $1^{st}$ drive node to the cascade output end, providing the signal of the $1^{st}$ drive node to a $1^{st}$ drive output end, and scanning a gate line coupled with each first-color sub-pixel row, wherein the second clock signal loaded for the first clock signal line is different from the second clock signal loaded for the second clock signal end.

14. The driving method for the display apparatus according to claim 13, wherein the clock cycle of the second clock signal is not greater than 3/2 of the clock cycle of the first clock signal.

15. The driving method for the display apparatus according to claim 12, further comprising:

at the second drive mode, loading different second clock signals for a first clock signal line to a fourth clock signal line respectively, loading a gate turn-on signal for a second cascade selection signal line, loading a gate turn-off signal for both a first cascade selection signal line and a third cascade selection signal line, loading a gate turn-on signal for a second drive selection signal line, loading a gate turn-off signal for both a first drive selection signal line and a third drive selection signal line, controlling the shift register units to work sequentially, providing a signal of a $2^{nd}$ drive node to the cascade output end, providing the signal of the $2^{nd}$ drive node to a $2^{nd}$ drive output end, and scanning a gate line coupled with each second-color sub-pixel row, wherein the second clock signal has two different clock cycles.

16. The driving method for the display apparatus according to claim 15, wherein the two different clock cycles comprise a first clock cycle and a second clock cycle, the first clock cycle is not greater than 3/4 of the clock cycle of the first clock signal, and the second clock cycle is not greater than 9/4 of the clock cycle of the first clock signal.

17. The driving method for the display apparatus according to claim 12, wherein, M=3, and the method further comprising:

at the second drive mode, loading different second clock signals for a first clock signal line to a fourth clock signal line respectively, loading a gate turn-on signal for a third cascade selection signal line, loading a gate turn-off signal for both a first cascade selection signal line and a second cascade selection signal line, loading a gate turn-on signal is loaded for a third drive selection signal line, loading a gate turn-off signal for both a first drive selection signal line and a second drive selection signal line, controlling the shift register units to work sequentially, providing a signal of a $3^{rd}$ drive node to the cascade output end, providing the signal of the $3^{rd}$ drive node to a $3^{rd}$ drive output end, and scanning a gate line coupled with each third-color sub-pixel row.

18. The driving method for the display apparatus according to claim 17, wherein a second clock cycle is not greater than three times a clock cycle of the first clock signal.

19. A driving method for the shift register unit according to claim 1, comprising:

at a first drive mode, one display frame comprising a first input phase, a first output phase and a first reset phase;

at the first input phase, controlling, by the first control circuit, the signal of the first node and the signal of the second node according to the signal of the input signal end and the signal of the first clock signal end; controlling, by second control circuits, signals of at least two drive nodes according to the signal of the first node, the signal of the second node and the signals of second clock signal ends; providing, by cascade output circuits, a signal of an $M^{th}$ drive node of the at least two drive nodes to a cascade output end according to cascade selection signal ends; and providing, by drive output circuits, the signal of each of the at least two drive nodes to a drive output end corresponding to each drive node according to drive selection signal ends;

at the first output phase, controlling, by the second control circuits, the signals of the at least two drive nodes according to the signal of the first node and the signals of the second clock signal ends; providing, by the cascade output circuits, the signal of the $M^{th}$ drive node of the at least two drive nodes to the cascade output end according to the cascade selection signal ends; and providing, by the drive output circuits, the signal of each of the at least two drive nodes to the drive output end corresponding to each drive node according to the drive selection signal ends; and at the first reset phase, controlling, by the first control circuit, the signal of the first node and the signal of the second node according to the signal of the first clock signal end; controlling, by the second control circuits, the signals of the at least two drive nodes according to the signal of the second node; providing, by the cascade output circuits, the signal of the $M^{th}$ drive node of the at least two drive nodes to the cascade output end according to the cascade selection signal ends; and providing, by the drive output circuits, the signal of each of the at least two drive nodes to the drive output end corresponding to each drive node according to the drive selection signal ends;

at a second drive mode, one display frame comprising a second input phase, a second output phase and a second reset phase;

at the second input phase, controlling, by the first control circuit, the signal of the first node and the signal of the second node according to the signal of the input signal end and the signal of the first clock signal end; controlling, by the second control circuits, the signals of the at least two drive nodes according to the signal of the first node, the signal of the second node and the signals of the second clock signal ends; providing, by the cascade output circuits, a signal of an $m^{th}$ drive node of the at least two drive nodes to the cascade output end according to the cascade selection signal ends; and providing, by the drive output circuits, the signal of the $m^{th}$ drive node of the at least two drive nodes to the corresponding drive output end according to the drive selection signal ends;

at the second output phase, controlling, by the second control circuits, the signals of the at least two drive nodes according to the signal of the first node and the signal of the second clock signal end; providing, by the cascade output circuits, the signal of the $m^{th}$ drive node of the at least two drive nodes to the cascade output end according to the cascade selection signal ends; and providing, by the drive output circuits, the signal of the $m^{th}$ drive node of the at least two drive nodes to the corresponding drive output end according to the drive selection signal ends; and at the second reset phase, controlling, by the first control circuit, the signal of the first node and the signal of the second node according to the signal of the first clock signal end; controlling, by the second control circuits, the signals of the at least two drive nodes according to the signal of the second node; providing, by the cascade output circuits, the signal of the $m^{th}$ drive node of the at least two drive nodes to the cascade output end according to the cascade selection signal ends; and providing, by the drive output circuits, the signal of the $m^{th}$ drive node of the at least two drive nodes to the corresponding drive output end according to the drive selection signal ends.

* * * * *